United States Patent
Wohlfeld et al.

(10) Patent No.: US 11,727,582 B2
(45) Date of Patent: Aug. 15, 2023

(54) CORRECTION OF CURRENT SCAN DATA USING PRE-EXISTING DATA

(71) Applicant: FARO Technologies, Inc., Lake Mary, FL (US)

(72) Inventors: Denis Wohlfeld, Ludwigsburg (DE); Evelyn Schmitz, Korntal-Münchingen (DE)

(*) Notice: Subject to any disclaimer, the term of this patent is extended or adjusted under 35 U.S.C. 154(b) by 399 days.

(21) Appl. No.: 17/117,234

(22) Filed: Dec. 10, 2020

(65) Prior Publication Data

US 2021/0183081 A1 Jun. 17, 2021

Related U.S. Application Data

(60) Provisional application No. 62/948,416, filed on Dec. 16, 2019.

(51) Int. Cl.
| | |
|---|---|
| G06T 3/00 | (2006.01) |
| G06T 7/33 | (2017.01) |
| G06T 7/521 | (2017.01) |
| G06T 7/00 | (2017.01) |
| G06F 30/13 | (2020.01) |
| G01S 7/481 | (2006.01) |
| G01S 17/89 | (2020.01) |

(52) U.S. Cl.
CPC ............ *G06T 7/337* (2017.01); *G01S 7/4817* (2013.01); *G01S 17/89* (2013.01); *G06F 30/13* (2020.01); *G06T 7/001* (2013.01); *G06T 7/521* (2017.01); *G06T 2207/10024* (2013.01); *G06T 2207/10028* (2013.01); *G06T 2207/30168* (2013.01); *G06T 2207/30252* (2013.01)

(58) Field of Classification Search
CPC ........ G01S 7/484; G01S 13/865; G01S 13/46; G01S 17/89; G01S 17/08; G05D 1/0231; G06T 7/74; G06K 9/0063; G06K 9/6259
See application file for complete search history.

(56) References Cited

U.S. PATENT DOCUMENTS

| | | | | |
|---|---|---|---|---|
| 7,469,834 B2* | 12/2008 | Schelinski | ............. | G01B 11/24 235/462.35 |
| 8,705,012 B2 | 4/2014 | Greiner et al. | | |
| 2019/0353787 A1* | 11/2019 | Petit | ........................ | G01S 7/484 |

* cited by examiner

*Primary Examiner* — Phuoc H Doan
(74) *Attorney, Agent, or Firm* — McCarter & English, LLP; Dave S. Christensen; David K. Kincaid

(57) ABSTRACT

A system and method for measuring coordinate values of an environment is provided. The system includes a coordinate measurement scanner that includes a light source that steers a beam of light to illuminate object points in the environment, and an image sensor arranged to receive light reflected from the object points to determine coordinates of the object points in the environment. The system also includes one or more processors for performing a method that includes receiving a previously generated map of the environment and causing the scanner to measure a plurality of coordinate values as the scanner is moved through the environment, the coordinate values forming a point cloud. The plurality of coordinate values are registered with the previously generated map into a single frame of reference. A current map of the environment is generated based at least in part on the previously generated map and the point cloud.

32 Claims, 37 Drawing Sheets

CORRECTION OF CURRENT SCAN DATA USING PRE-EXISTING DATA

CROSS-REFERENCE TO RELATED APPLICATION

This application claims the benefit of U.S. Provisional Application No. 62/948,416, filed Dec. 16, 2019, and entitled "Correction of Current Scan Data Using Preexisting Data", the content of which is incorporated herein by reference in its entirety.

BACKGROUND

The present application is directed to optically scanning an environment, such as a building, and in particular to using pre-existing data to correct current scan data generated by a mobile scanning platform.

The automated three-dimensional (3D) scanning of an environment is desirable as a number of scans may be performed in order to obtain a complete scan of the area. 3D coordinate scanners include time-of-flight (TOF) coordinate measurement devices. A TOF laser scanner is a scanner in which the distance to a target point is determined based on the speed of light in air between the scanner and a target point. A laser scanner optically scans and measures objects in a volume around the scanner through the acquisition of data points representing object surfaces within the volume. Such data points are obtained by transmitting a beam of light onto the objects and collecting the reflected or scattered light to determine the distance, two-angles (i.e., an azimuth and a zenith angle), and optionally a gray-scale value. This raw scan data is collected, stored and sent to a processor or processors to generate a 3D image representing the scanned area or object.

It should be appreciated that where an object (e.g. a wall, a column, or a desk) blocks the beam of light, that object will be measured but any objects or surfaces on the opposite side will not be scanned since they are in the shadow of the object relative to the scanner. Therefore, to obtain a more complete scan of the environment, the TOF scanner is moved to different locations and separate scans are performed. Subsequent to the performing of the scans, the 3D coordinate data (i.e. the point cloud) from each of the individual scans are registered to each other and combined to form a 3D image or model of the environment.

Some existing measurement systems have been mounted to a movable structure, such as a cart, and are moved on a continuous basis through a building, or other environment, to generate a digital representation of the building. However, these types of systems generally provide lower data quality than stationary scans. For example, mobile scanning devices, including those mounted on a movable structure and hand-held devices, can become inaccurate over distances due to error accumulation referred to as drift. When drift occurs, the model of the environment may not reflect the actual environment. Walls in hallways may appear as having a bend, extend on an angle, and/or edges of two walls forming a corner may not match up exactly.

Accordingly, while existing scanners are suitable for their intended purposes, what is needed is a system for having certain features of embodiments of the present invention.

BRIEF DESCRIPTION

According to one aspect of the invention, a system for measuring coordinate values of an environment is provided. The system includes a coordinate measurement scanner that includes a light source, an image sensor, and a controller. The light source steers a beam of light to illuminate object points in the environment and the image sensor is arranged to receive light reflected from the object points to determine coordinates of the object points in the environment. The system also includes one or more processors operably coupled to the scanner, the one or more processors being responsive to executable instructions for performing a method. The method includes receiving a previously generated map of the environment, the previously generated map including a plurality of features. The method also includes causing the scanner to measure a plurality of coordinate values as the scanner is moved through the environment, the coordinate values forming a point cloud. The method also includes registering the plurality of coordinate values and at least a subset of the features of the previously generated map into a single frame of reference. The method further includes generating a current map of the environment based at least in part on the previously generated map and the point cloud.

In addition to one or more of the features described herein, or as an alternative, further embodiments of the system may include the generating including updating the previously generated map based on detecting differences between the previously generated map and the point cloud and outputting the updated previously generated map as the current map.

In addition to one or more of the features described herein, or as an alternative, further embodiments of the system may include the updating including overlaying portions of the previously generated map with corresponding portions of the point cloud.

In addition to one or more of the features described herein, or as an alternative, further embodiments of the system may include that the scanner is a two-dimensional (2D) scanner.

In addition to one or more of the features described herein, or as an alternative, further embodiments of the system may include that the scanner is a three-dimensional (3D) scanner.

In addition to one or more of the features described herein, or as an alternative, further embodiments of the system may include that the previously generated map includes an existing point cloud.

In addition to one or more of the features described herein, or as an alternative, further embodiments of the system may include that the previously generated map includes a computer aided design (CAD) model.

In addition to one or more of the features described herein, or as an alternative, further embodiments of the system may include that the previously generated map includes a floor plan.

In addition to one or more of the features described herein, or as an alternative, further embodiments of the system may include that the system is configured to be carried by an operator without stopping the measurements of the plurality of coordinates.

According to another aspect of the invention, a method for measuring coordinate values of an environment is provided. The method includes moving a scanner through an environment, the scanner having a light source, an image sensor and a controller. The light source steers a beam of light to illuminate object points in the environment, the image sensor is arranged to receive light reflected from the object points, and the controller is operable to determine coordinates of the object points in the environment. The method also includes receiving, at the scanner, a previously generated map of the environment, the previously generated map including a plurality of features. The method also includes causing the scanner to measure a plurality of coordinate values as it moves through the environment, the coordinate values forming a point cloud. The method further includes registering the point cloud with at least a subset of the features of the previously generated map into a single frame of reference. The method further includes generating a current map of the environment based at least in part on the previously generated map and the point cloud.

In addition to one or more of the features described herein, or as an alternative, further embodiments of the method may include the generating including updating the previously generated map based on detecting differences between the previously generated map and the point cloud and outputting the updated previously generated map as the current map.

In addition to one or more of the features described herein, or as an alternative, further embodiments of the method may include the updating including overlaying portions of the previously generated map with corresponding portions of the point cloud.

In addition to one or more of the features described herein, or as an alternative, further embodiments of the method may include that the scanner is a 2D scanner.

In addition to one or more of the features described herein, or as an alternative, further embodiments of the method may include that the scanner is a 3D scanner.

In addition to one or more of the features described herein, or as an alternative, further embodiments of the method may include that the previously generated map includes an existing point cloud.

In addition to one or more of the features described herein, or as an alternative, further embodiments of the method may include that the previously generated map includes a CAD model.

In addition to one or more of the features described herein, or as an alternative, further embodiments of the method may include that the previously generated map includes a floor plan.

In addition to one or more of the features described herein, or as an alternative, further embodiments of the method may include moving the scanner continuously through the environment.

According to another aspect of the invention, a method for measuring coordinate values of an environment is provided. The method includes moving a base unit through an environment. The base unit includes a 2D scanner and a 3D scanner. The 2D scanner has a light source, an image sensor and a controller. The light source steers a beam of light within a first plane to illuminate object points in the environment, the image sensor is arranged to receive light reflected from the object points, and the controller is operable to determine a distance value to at least one of the object points. The 2D scanner measures an angle and a distance value. The 3D scanner is configured to operate in a compound mode, and the 3D scanner has a color camera. The method also includes, as the base unit is moving, causing the 2D scanner to generate a 2D map of the environment, the 2D map being based at least in part on the angle, the distance value, and a previously generated map of the environment. The method further includes, as the base unit is moving, causing the 3D scanner to operate in compound mode to measure a plurality of 3D coordinate values. The method further includes registering the plurality of 3D coordinate values into a single frame of reference based at least in part on the 2D map.

In addition to one or more of the features described herein, or as an alternative, further embodiments of the method may include moving the base unit continuously through the environment.

According to another aspect of the invention, a system for measuring coordinate values of an environment is provided. The method includes a movable base unit, a 2D scanner coupled to the base unit, a 3D scanner coupled to the base unit, and one or more processors operably coupled to the base unit, the 2D scanner, and the 3D scanner. The 2D scanner includes a light source, an image sensor and a controller, the light source steering a beam of light within a first plane to illuminate object points in the environment. The image sensor is arranged to receive light reflected from the object points, and the controller is operable to determine a distance value to at least one of the object points. The 2D scanner measures an angle and a distance value. The 3D scanner is operable to selectively measure 3D coordinates and grey values of surfaces in the environment. The 3D scanner is configured to operate in one of a compound mode or a helical mode, and the 3D scanner has a color camera. The one or more processors are responsive to executable instructions for performing a method. The method includes causing the 3D scanner to measure a first plurality of 3D coordinate values while operating in one of the compound mode or the helical mode as the base unit is moved from a first position to a second position. The method also includes causing the 3D scanner to measure a second plurality of 3D coordinate values while operating in compound mode when the base unit is stationary between the first position and second position. The method further includes registering the first plurality of 3D coordinate values and second plurality of 3D coordinate values into a single frame of reference. The method further includes generating a 2D map of the environment using the 2D scanner as the base unit is moved from a first position to a second position, the 2D map being based at least in part on the angle, the distance value, and a previously generated map of the environment.

In addition to one or more of the features described herein, or as an alternative, further embodiments of the system may include that the registration is based at least in part on the 2D scanner data.

In addition to one or more of the features described herein, or as an alternative, further embodiments of the system may include that the registration is based at least in part on the previously generated map of the environment.

In addition to one or more of the features described herein, or as an alternative, further embodiments of the system may include that the 3D scanner is a time-of-flight (TOF) coordinate measurement device configured to measure the 3D coordinate values in a volume about the 3D scanner.

In addition to one or more of the features described herein, or as an alternative, further embodiments of the system may include that the 3D scanner is a structured light area scanner.

In addition to one or more of the features described herein, or as an alternative, further embodiments of the system may include that the 2D scanner and the 3D scanner are removably coupled to the base unit, and the 2D scanner and 3D scanner may be operated as an independent device separate from the base unit or each other.

In addition to one or more of the features described herein, or as an alternative, further embodiments of the system may include that the system is configured to be carried by an operator without stopping the measurement of the first plurality of 3D coordinates.

In addition to one or more of the features described herein, or as an alternative, further embodiments of the system may include that the method further includes performing a compound compensation and optimizing by automatically fusing sensor data acquired while operating the system, wherein the compound compensation includes positions and orientations of the sensors.

In addition to one or more of the features described herein, or as an alternative, further embodiments of the system may include that the method further includes causing the color camera to acquire color data and colorizing the 3D scan data.

In addition to one or more of the features described herein, or as an alternative, further embodiments of the system may include that the method further includes analyzing a tracking quality attribute of the first plurality of 3D coordinates and providing feedback to the operator.

In addition to one or more of the features described herein, or as an alternative, further embodiments of the system may include that the feedback includes instructing the operator to perform the stationary scan.

In addition to one or more of the features described herein, or as an alternative, further embodiments of the system may include a display operably coupled to the 2D scanner and 3D scanner, the display being configured to display the registered plurality of 3D coordinates or the 2D map in the single frame of reference.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

Figure 1:
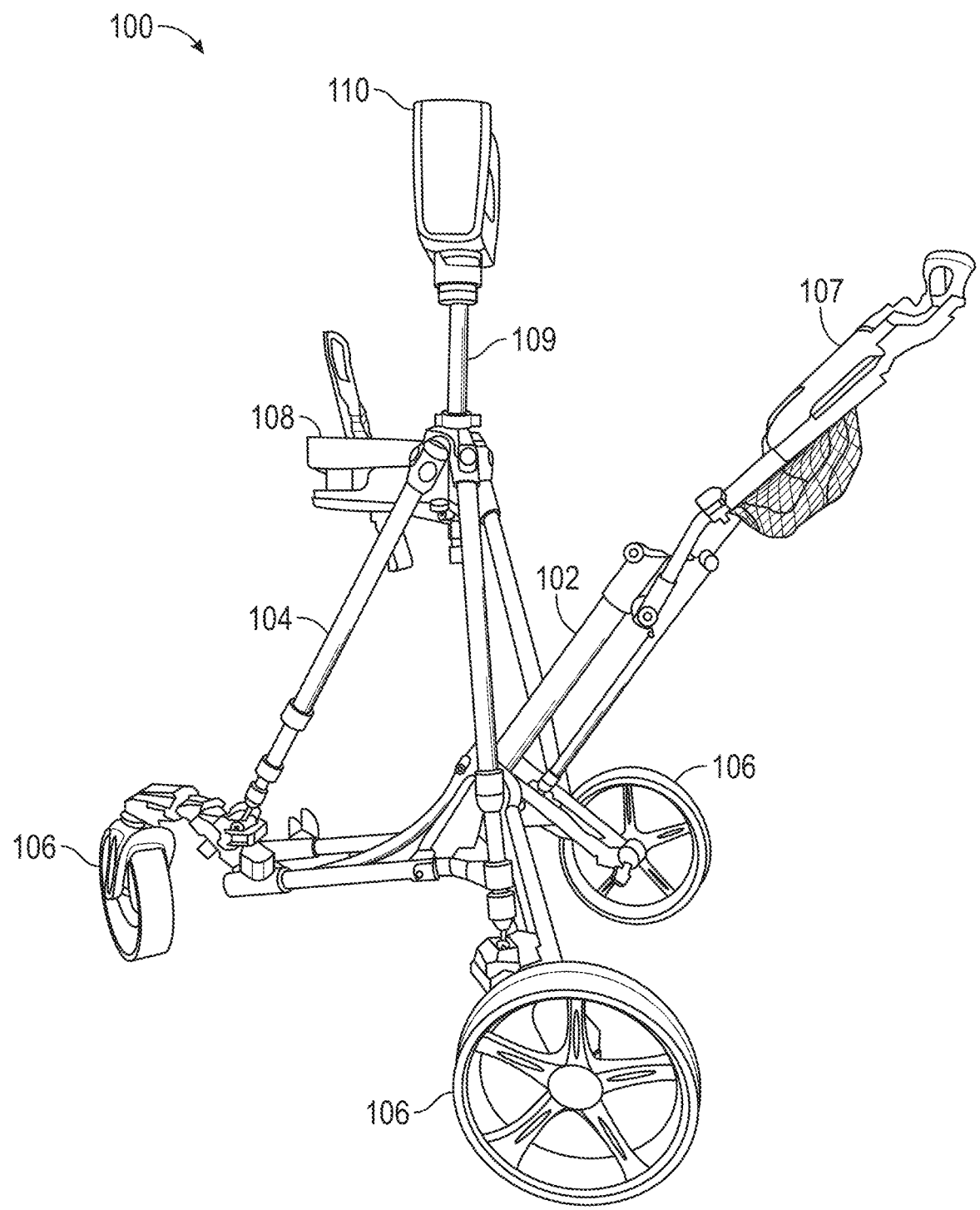
FIG. 1 is a perspective view of a mobile scanning platform according to an embodiment.
Figure 2:
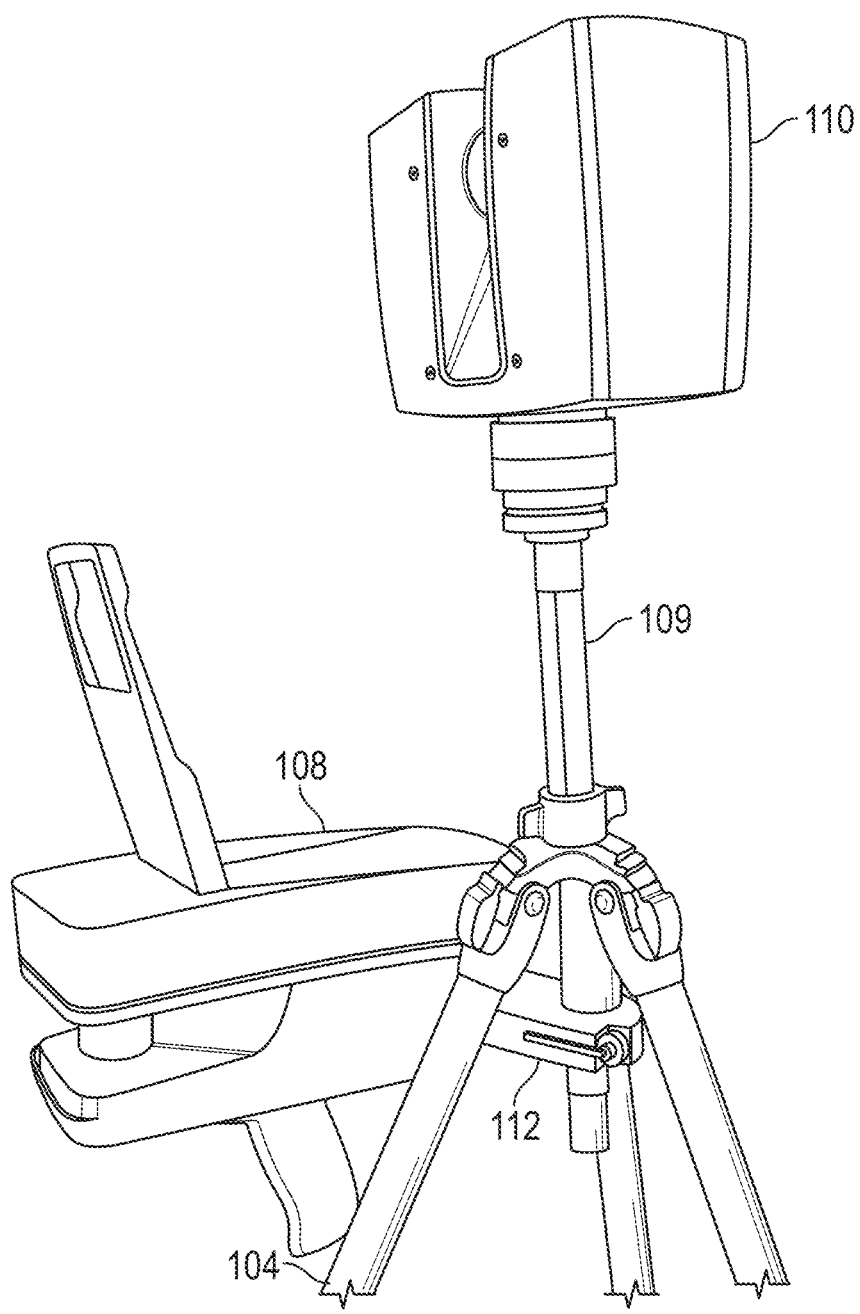
FIGS. 2-4 are various perspective views of the mobile scanning platform of FIG. 1.
Figure 3:
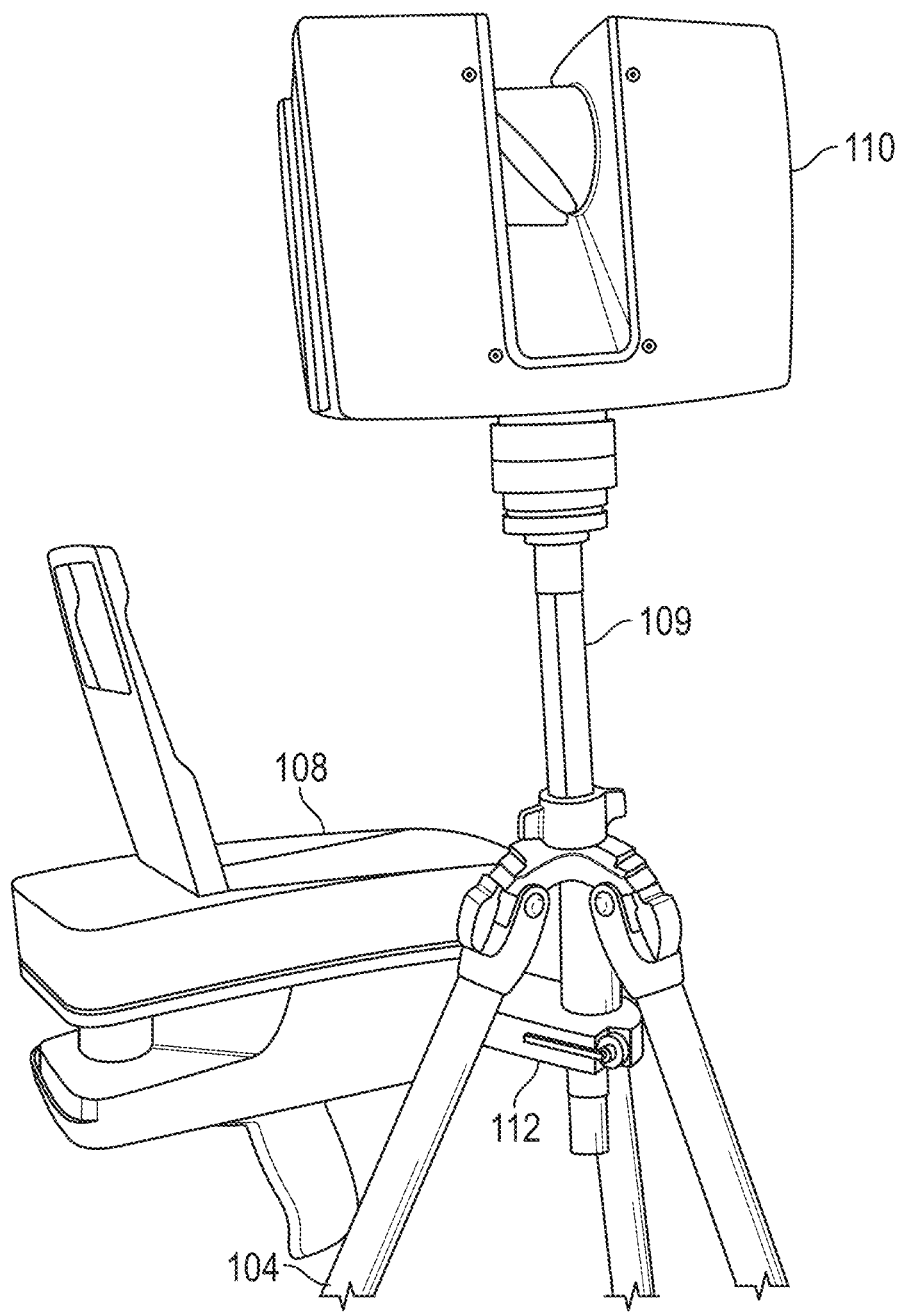
Figure 4:
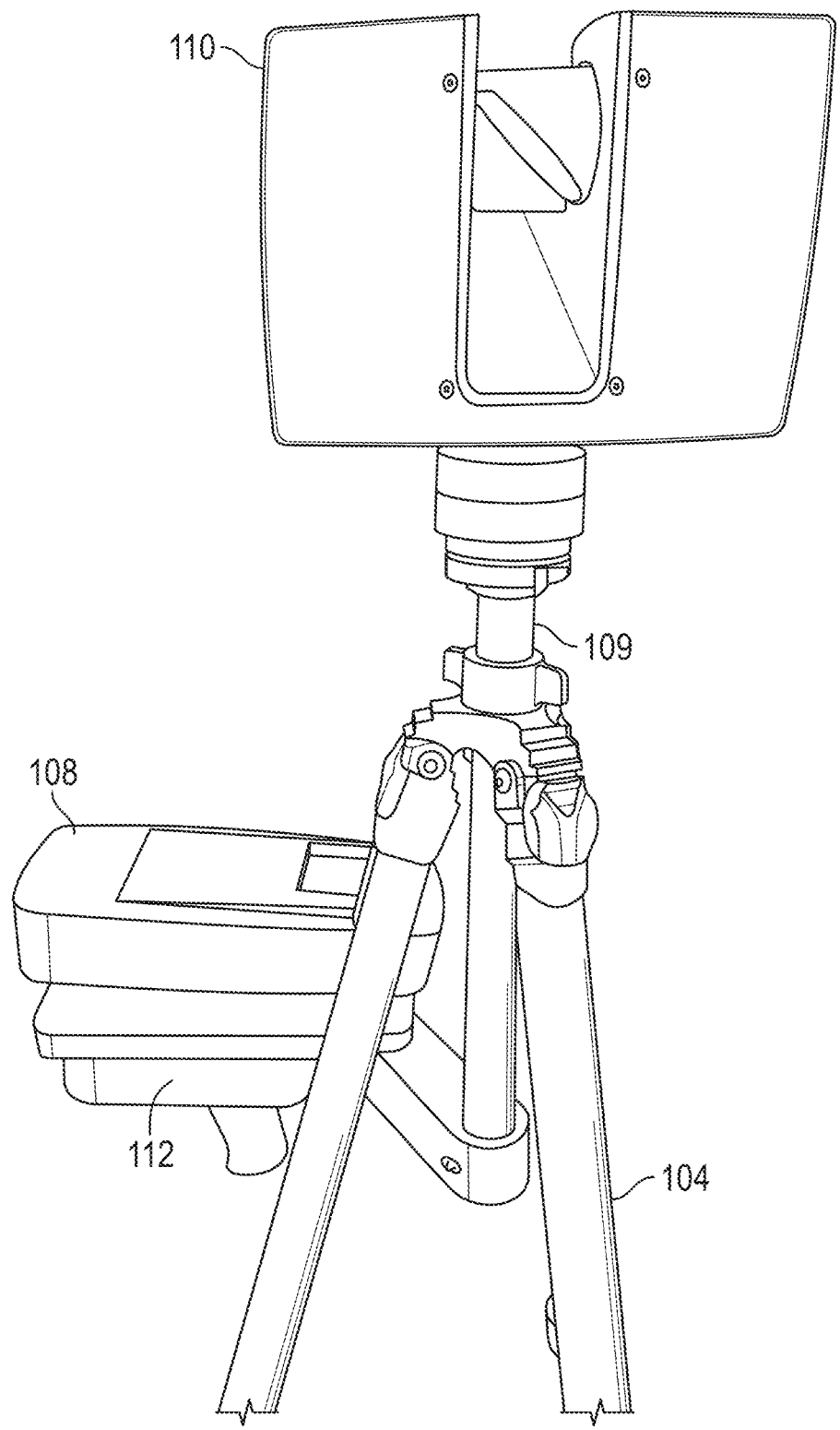

The detailed description explains embodiments of the invention, together with advantages and features, by way of example with reference to the drawings.

DETAILED DESCRIPTION

Embodiments of the present invention relate to using pre-existing data to correct current scan data generated by a mobile scanning platform. In accordance with one or more embodiments of the present invention, registration of a continuously scanning mobile system is supported by recognition of known patterns during the data acquisition. This can allow for both improved positioning during the continuous recording of three-dimensional (3D) and/or two-dimensional (2D) data using a mobile scanning platform and for the simplified overlay of temporal data recordings.

The known patterns, or features, can include information from pre-existing data sources such as, but not limited to: computer aided design (CAD) drawings, or models, of floor plans; golden point clouds captured with a high quality system; natural features, or landmarks, captured by local stationary laser scans (e.g., corners or rooms in buildings); and known measurements (e.g., distances between walls, length of a hallway, ninety degree building structure, etc.). As used herein, the term "golden point cloud" refers to a highly accurate point cloud that is registered based on an accurate reference system and/or generated by a high-resolution stationary scanner. In an embodiment, the golden point cloud is created by a laser scanner and includes several scan positions (low occlusion), a high point density, and high registration quality. The values of each of these factors can be different based on characteristics of the object(s) of interest in the point cloud.

Overlaying the data captured by the mobile scanning platform onto a pre-existing data source, or previously generated map, such as a CAD model or a golden point cloud, can eliminate drift and result in a model that accurately reflects the current environment.

In addition, unlike contemporary techniques, embodiments of the present environment do not require the use of loop closure techniques and/or targets (e.g., spheres, checkers) inserted into the environment in order to register a current scan to specific locations in the environment. One or more embodiments of the present invention can register landmarks (e.g., walls) that are shown in a pre-existing data source such as a floor plan of the environment with corresponding coordinate values in the scan data. This allows the registration of the scan data to be performed accurately and with fewer data points than contemporary techniques.

Referring now to FIGS. 1-4, an embodiment is shown of a mobile scanning platform 100. The platform 100 includes a frame 102 having a tripod portion 104 thereon. The frame 102 further includes a plurality of wheels 106 that allow the platform 100 to be moved about an environment. The frame 102 further includes a handle portion 107 that provides a convenient place for the operator to push and maneuver the platform 100.

The tripod portion 104 includes a center post 109. In an embodiment, the center post 109 generally extends generally perpendicular to the surface that the platform 100 is on. Coupled to the top of the post 109 is a 3D measurement device 110. In the exemplary embodiment, the 3D measurement device 110 is a time-of-flight type scanner (either phase-based or pulse-based) that emits and receives a light to measure a volume about the scanner. In the exemplary embodiment, the 3D measurement device 110 is implemented by the scanner 610 that is described in reference to FIGS. 27-29 herein.

Also attached to the center post 109 is a 2D scanner 108. In an embodiment, the 2D scanner 108 is the same type of scanner as is described in reference to FIGS. 9-26 herein. In the exemplary embodiment, the 2D scanner emits light in a plane and measures a distance to an object, such as a wall for example. As described in more detail herein, these distance measurements may be used to generate a 2D map of an environment when the 2D scanner 108 is moved therethrough. The 2D scanner 108 is coupled to the center post by an arm 112 that includes an opening to engage at least the handle portion of the 2D scanner 108.

In an embodiment, one or both of the 3D measurement device 110 and the 2D scanner 108 are removably coupled from the platform 100. In an embodiment, the platform 100 is configured to operate (e.g. operate the scanners 108, 110) while the platform 100 is being carried by one or more operators.

In an embodiment, the mobile scanning platform 100 may include a controller (not shown) that is coupled to communicate with both the 2D scanner 108 and the 3D measurement device 110.

Figure 5:
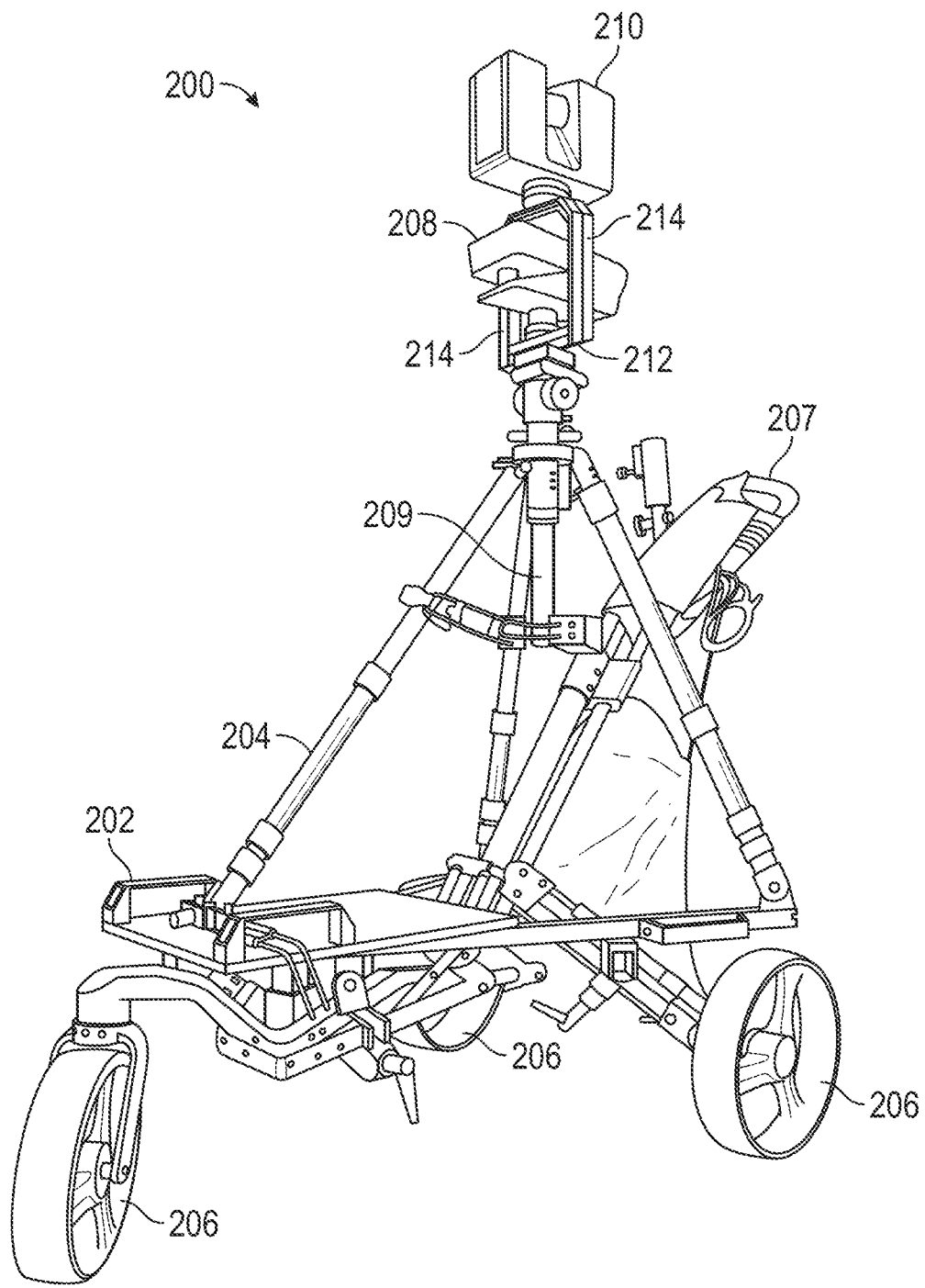
FIG. 5 is a perspective view of the mobile scanning platform according to another embodiment.

Referring now to FIG. 5, another embodiment is shown of a mobile scanning platform 200. The scanning platform 200 is similar to the platform 100 in that it has a frame 202 with a tripod 204 mounted thereon. The frame includes a plurality of wheels 206 and a handle portion 207.

In this embodiment, the center post 209 includes a holder 212 mounted between the post 209 and a 3D measurement device 210. The holder 212 includes a pair of arms 214 that define an opening therebetween. Mounted within the opening a 2D scanner 208. In an embodiment, the 2D scanner 208 is mounted coaxial with the post 209 and the axis of rotation of the 3D measurement device 210.

Is should be appreciated that the platforms 100, 200 are manually pushed by an operator through the environment. As will be discussed in more detail herein, as the platform 100, 200 is moved through the environment, both the 2D scanner 108, 208 and the 3D measurement device 110, 210 are operated simultaneously, with the data of the 2D measurement device being used, at least in part, to register the data of the 3D measurement system.

Figure 6:
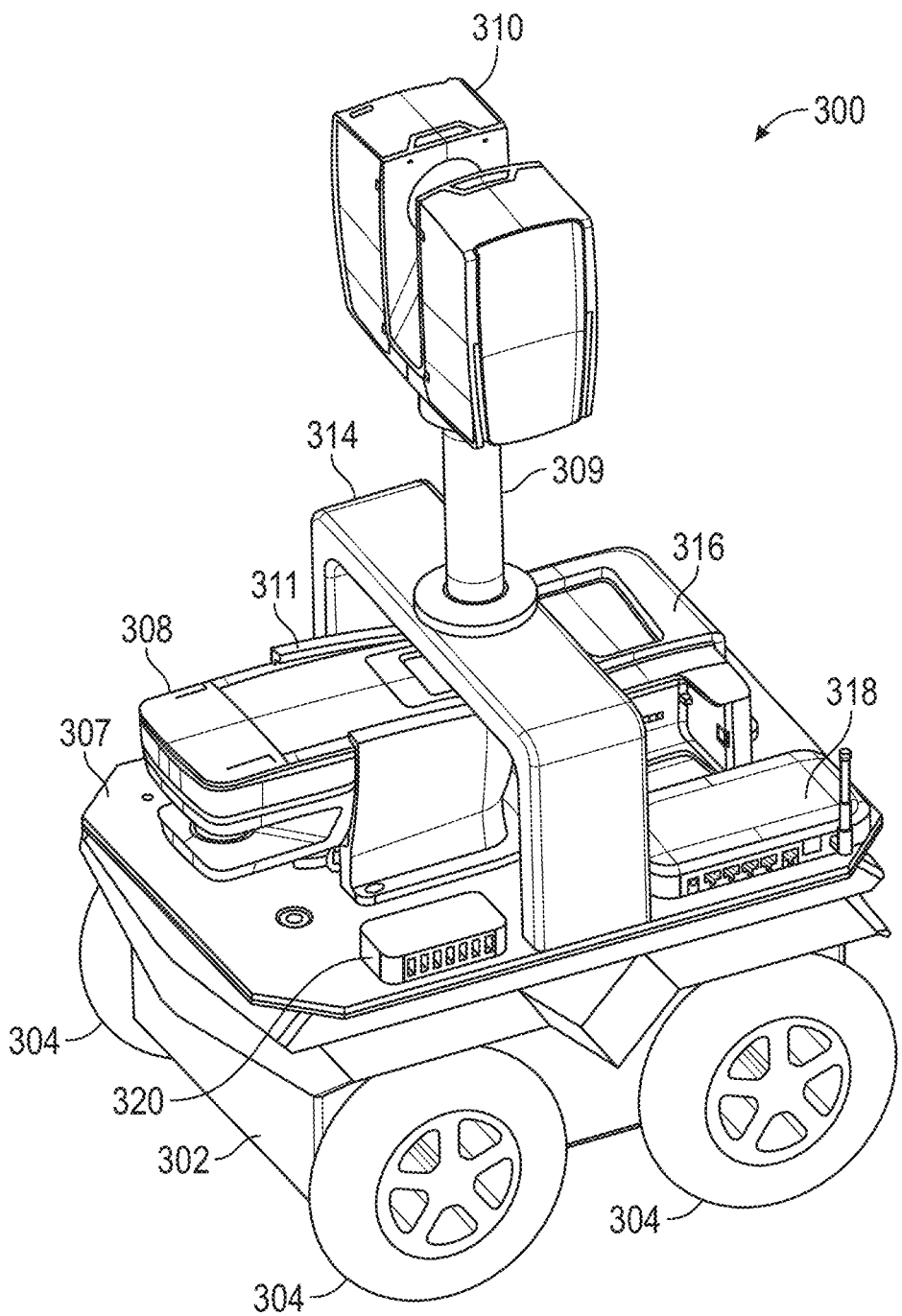
FIG. 6 is a perspective view of a mobile scanning platform in accordance with another embodiment.
Figure 7:
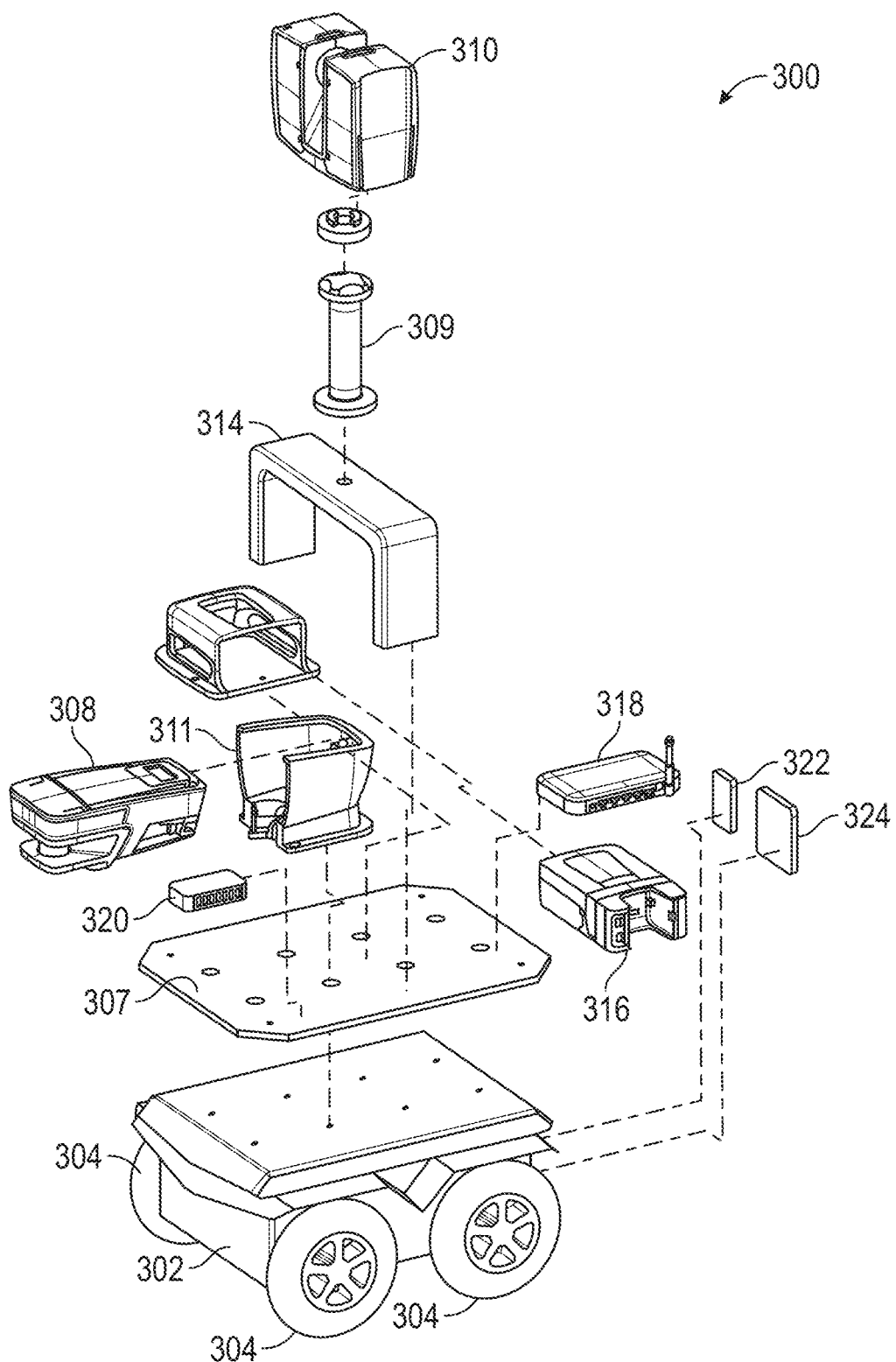
FIG. 7 is an unassembled view of the mobile scanning platform of FIG. 6.
Figure 8:
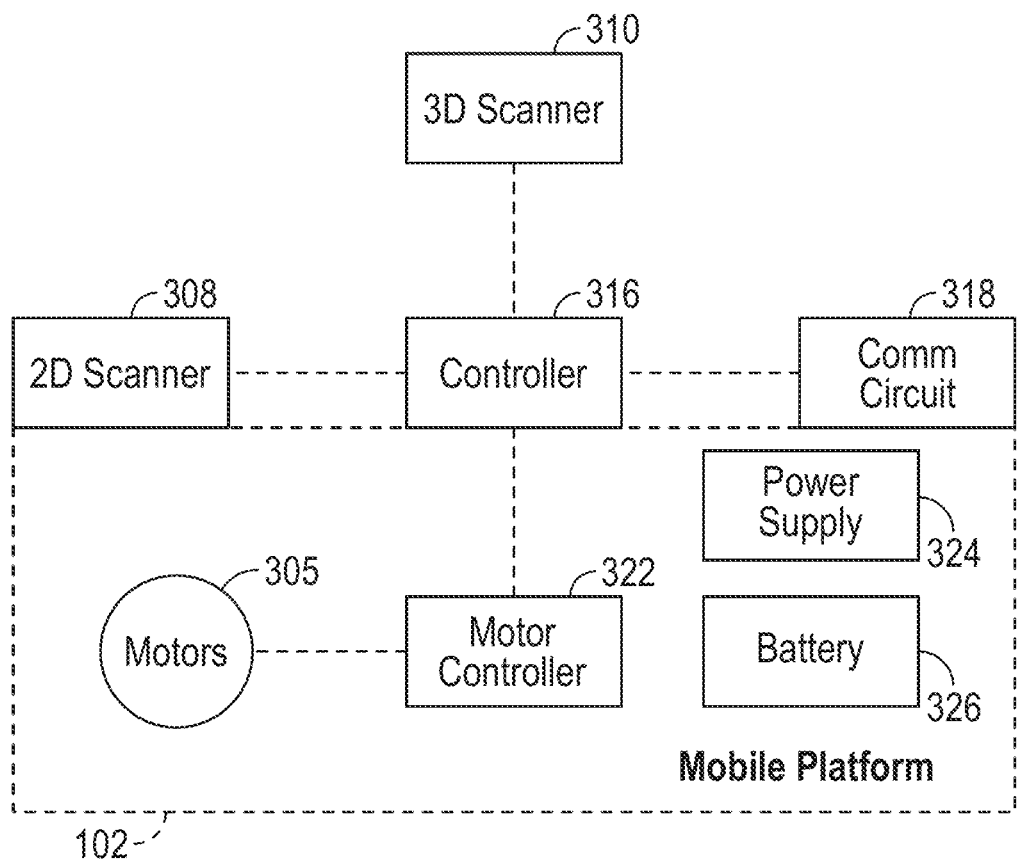
FIG. 8 is a block diagram of the system of FIG. 6.
Figure 9:
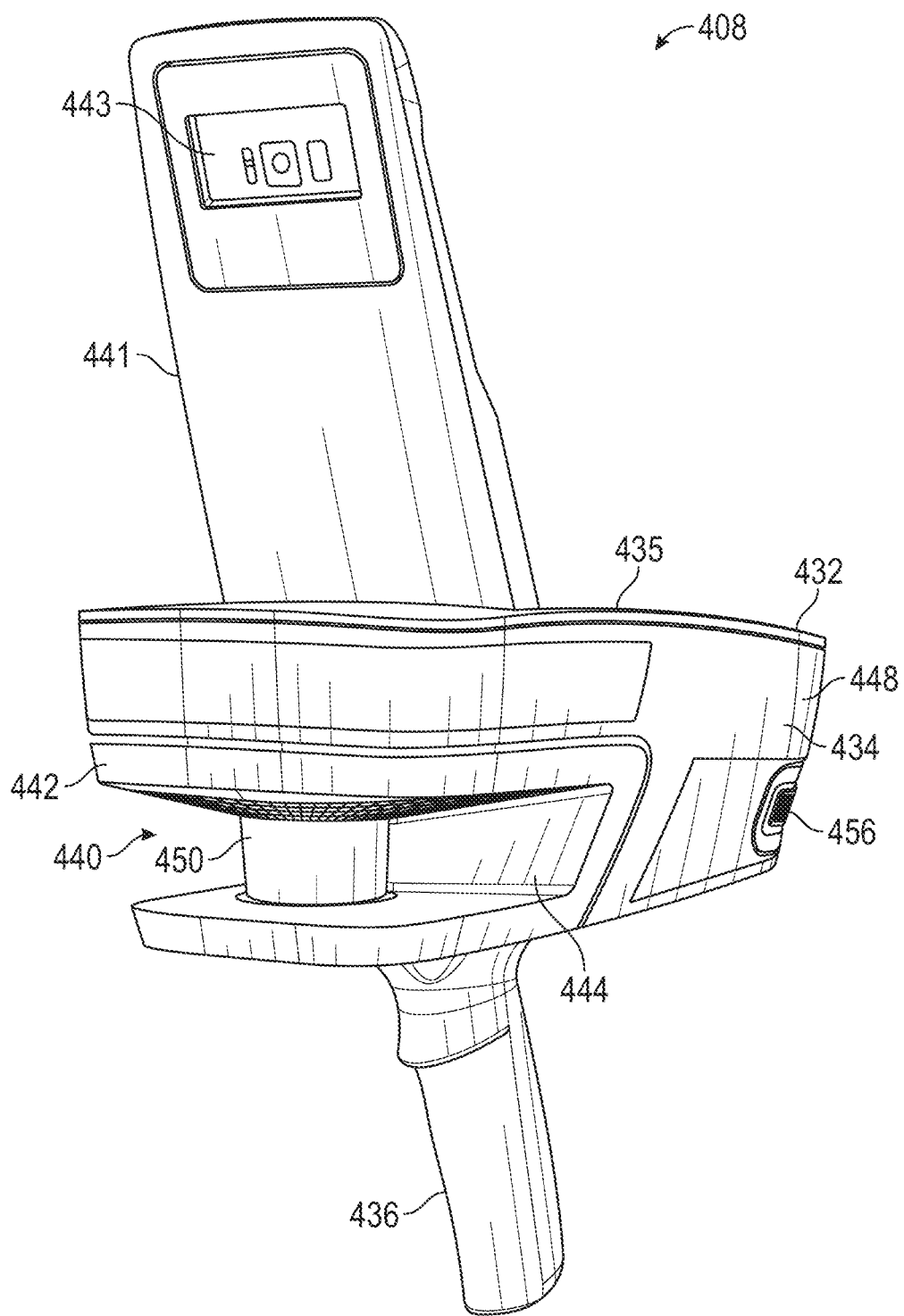
FIGS. 9-11 are perspective views of a two-dimensional (2D) scanning and mapping system for use with the mobile scanning platform of FIG. 1, FIG. 5 or FIG. 6, in accordance with an embodiment.
Figure 10:
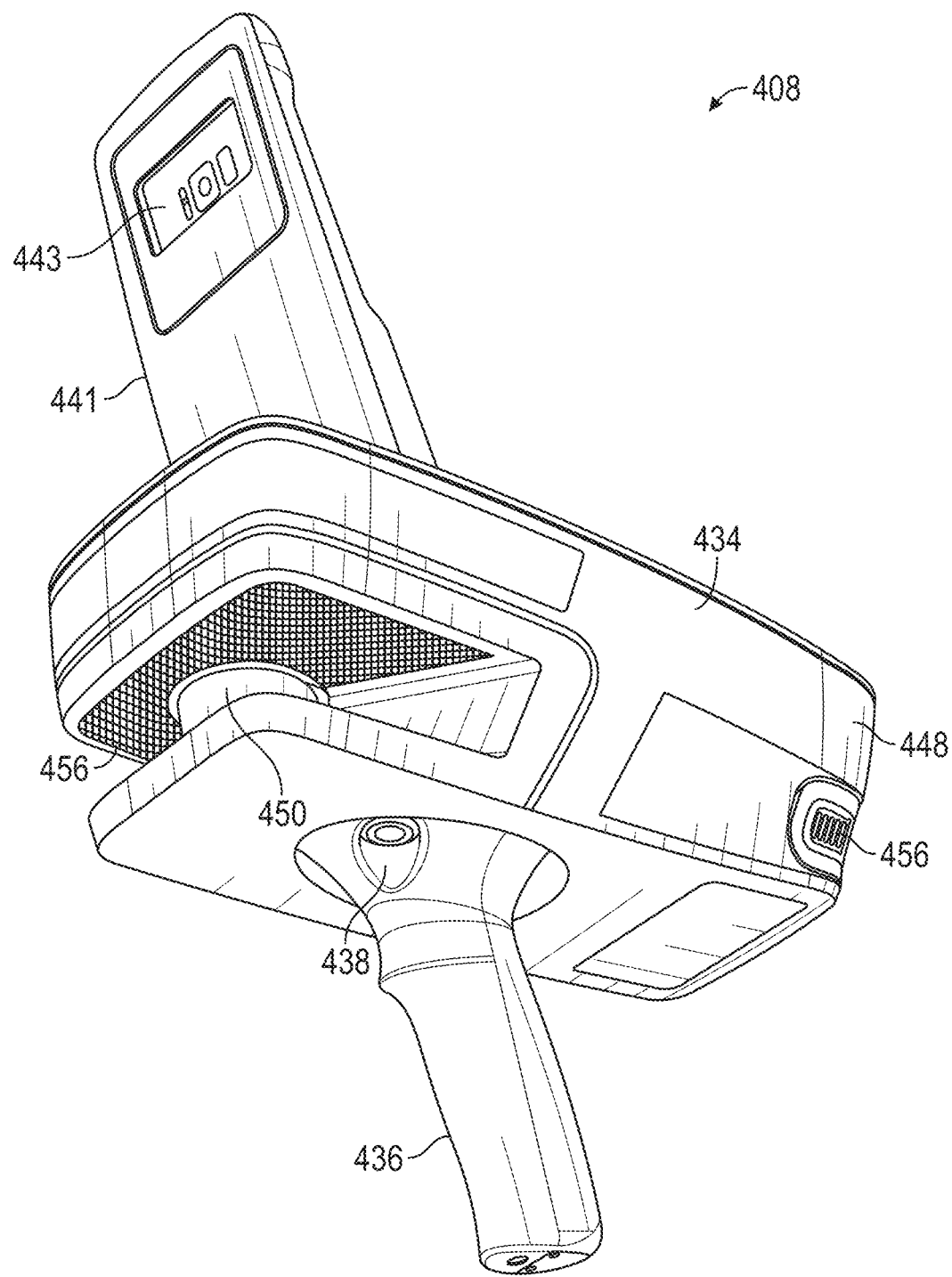
Figure 11:
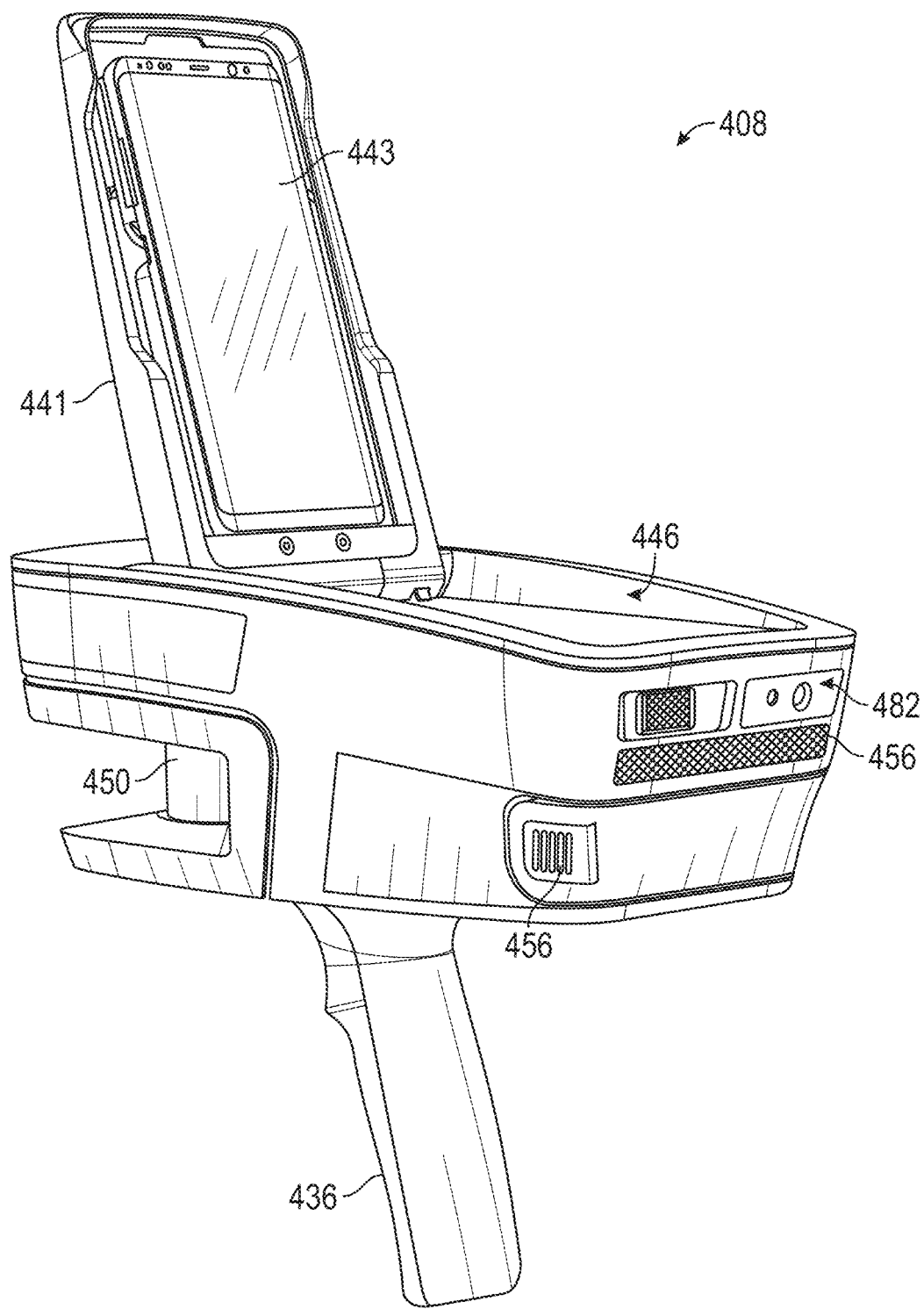
Figure 12:
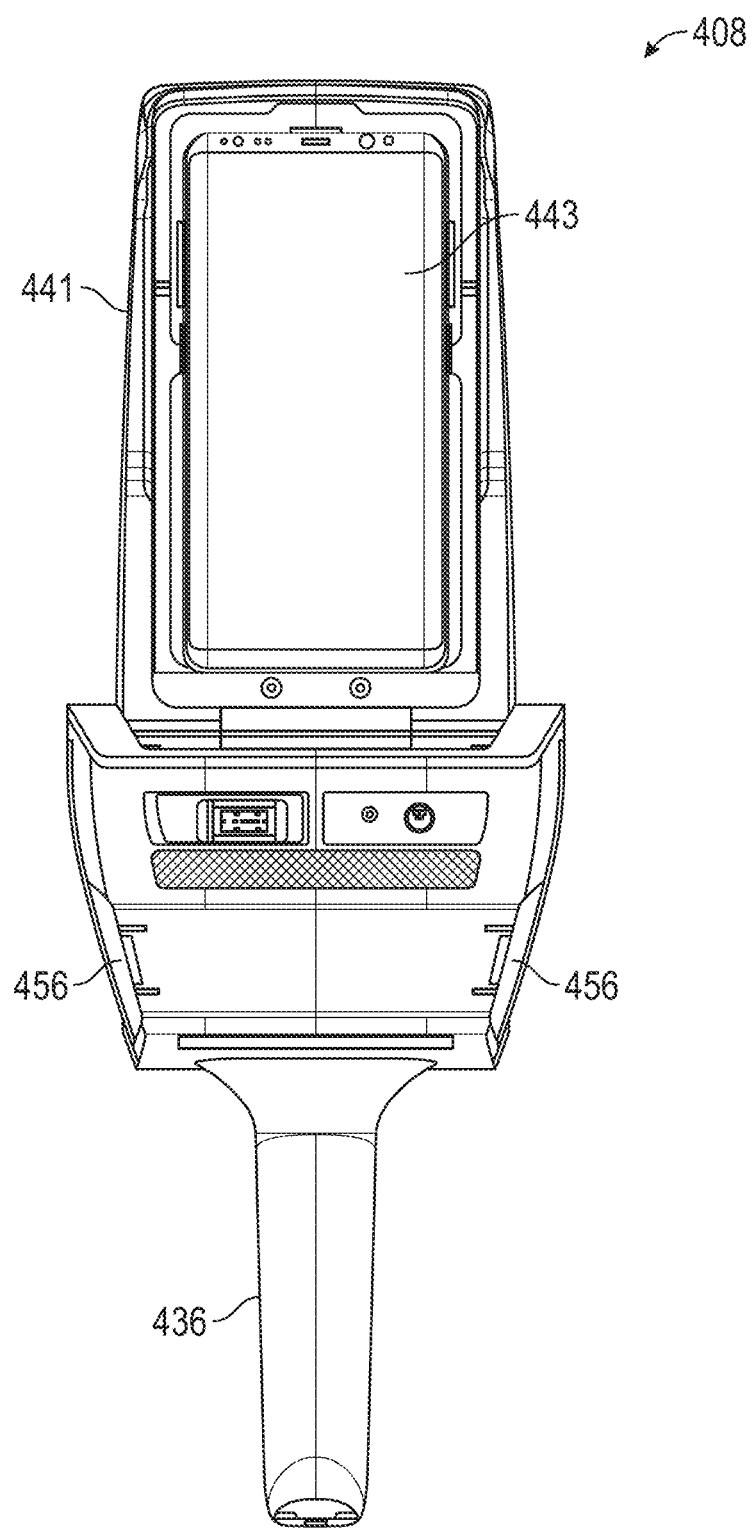
FIG. 12 is a first end view of the system of FIG. 9.

If should further be appreciated that in some embodiments, it may be desired to the measurement platform to be motorized in a semi-autonomous or fully-autonomous configuration. Referring now to FIGS. 6-8, an embodiment is shown of a mobile scanning platform 300. The mobile scanning platform 100 includes a base unit 302 having a plurality of wheels 304. The wheels 304 are rotated by motors 305 (FIG. 8). In an embodiment, an adapter plate 307 is coupled to the base unit 302 to allow components and modules to be coupled to the base unit 302. The mobile scanning platform 300 further includes a 2D scanner 308 and a 3D scanner 310. In the illustrated embodiment, each scanner 308, 310 is removably coupled to the adapter plate 306. The 2D scanner 308 may be the scanner illustrated and described in reference to FIGS. 9-26. As will be described in more detail herein, in some embodiments the 2D scanner 308 is removable from the adapter plate 306 and is used to generate a map of the environment, plan a path for the mobile scanning platform to follow, and define 3D scanning locations. In the illustrated embodiment, the 2D scanner 308 is slidably coupled to a bracket 311 that couples the 2D scanner 308 to the adapter plate 307.

Figure 27:
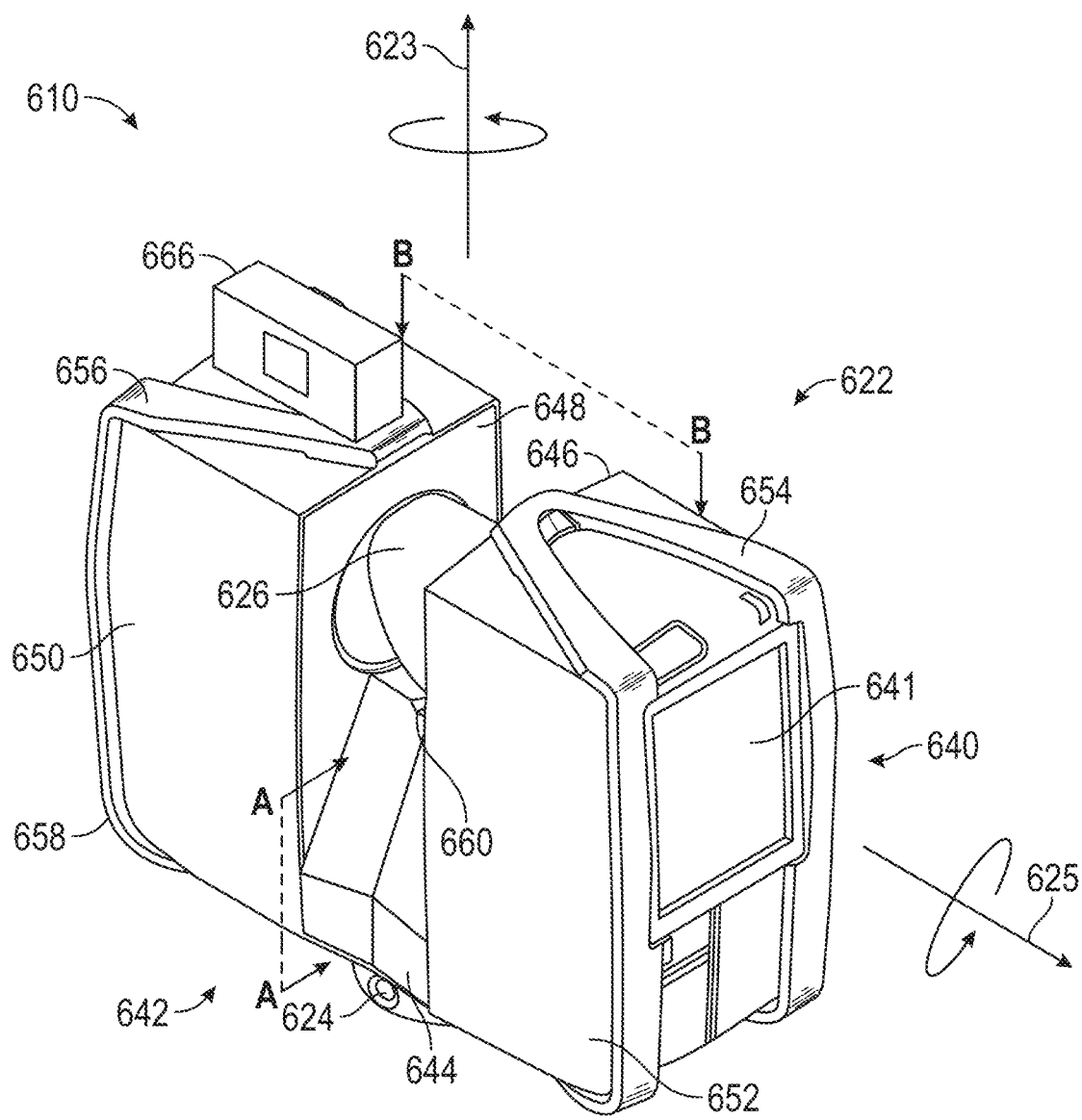
FIGS. 27-29 are views of a time-of-flight laser scanner for use with the mobile scanning platform of FIG. 1 in accordance with an embodiment.
Figure 28:
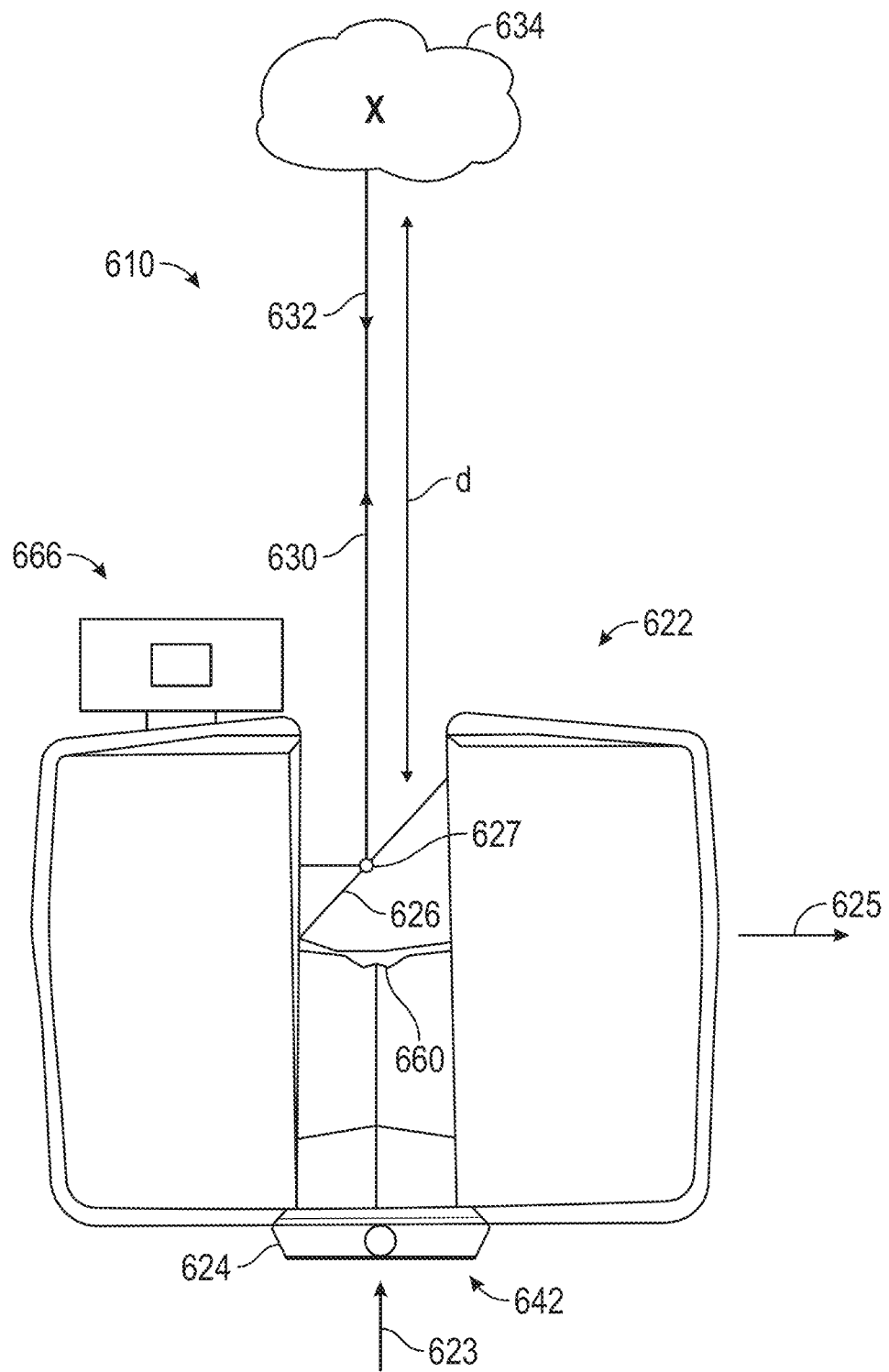
Figure 29:
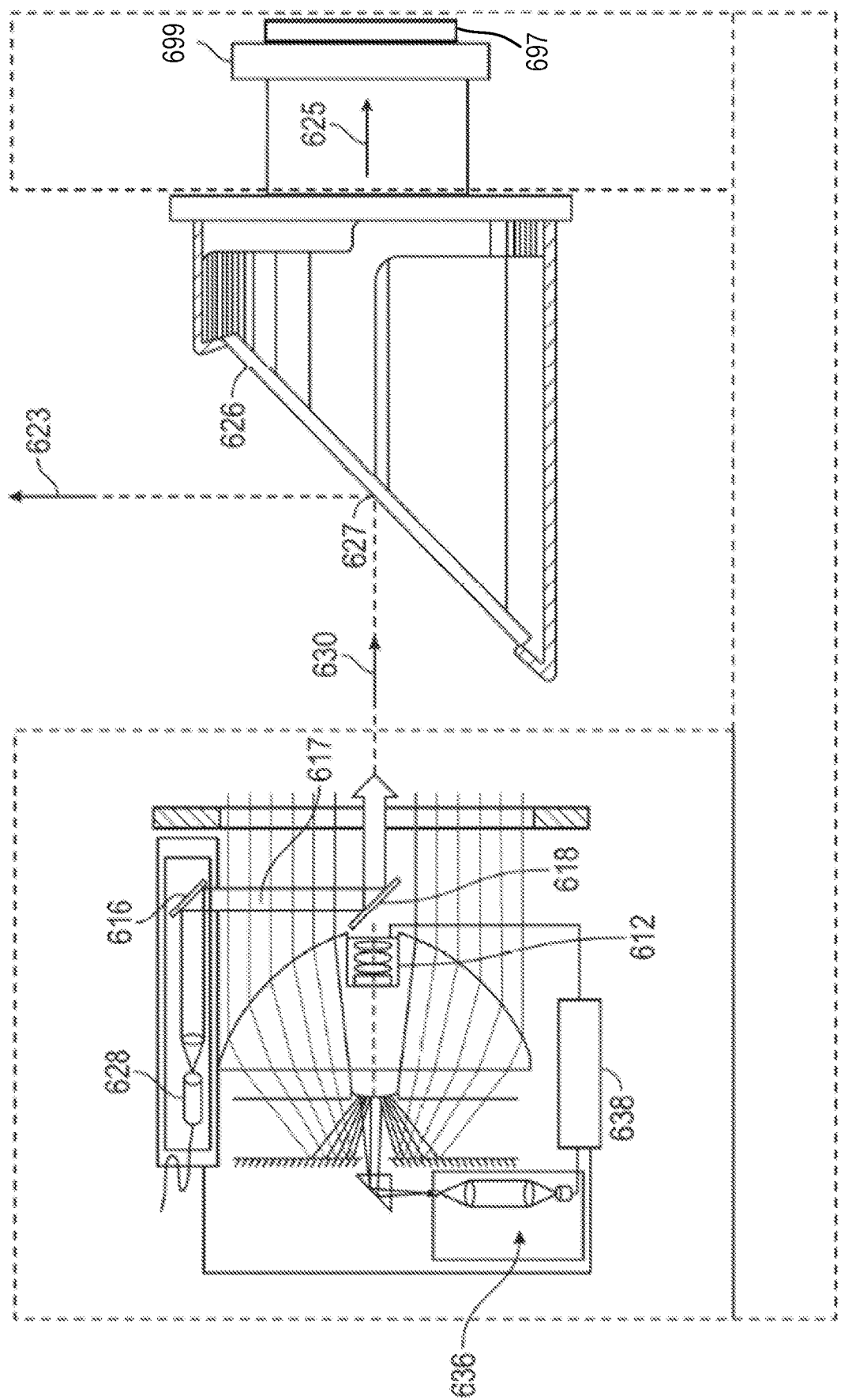

In an embodiment, the 3D scanner 310 is a time-of-flight (TOF) laser scanner such as that shown and described in reference to FIGS. 27-29. The scanner 310 may be that described in commonly owned U.S. Pat. No. 8,705,012, which is incorporated by reference herein. In an embodiment, the 3D scanner 310 mounted on a pedestal or post 309 that elevates the 3D scanner 310 above (e.g. further from the floor than) the other components in the mobile scanning platform 300 so that the emission and receipt of the light beam is not interfered with. In the illustrated embodiment, the pedestal or post 309 is coupled to the adapter plate 307 by a u-shaped frame 314.

In an embodiment, the mobile scanning platform 300 further includes a controller 316. The controller 316 is a computing device having one or more processors and memory. The one or more processors are responsive to non-transitory executable computer instructions for performing operational methods, such as that shown and described with respect to FIGS. 30 and 35 for example. The processors may be microprocessors, field programmable gate arrays (FPGAs), digital signal processors (DSPs), and generally any device capable of performing computing functions. The one or more processors have access to memory for storing information.

Coupled for communication to the controller 316 is a communications circuit 318 and an input/output hub 320. In the illustrated embodiment, the communications circuit 318 is configured to transmit and receive data via a wireless radio-frequency communications medium, such as WiFi or Bluetooth for example. In an embodiment, the 2D scanner 308 communicates with the controller 316 via the communications circuit 318

In an embodiment, the mobile scanning platform 300 further includes a motor controller 322 that is operably coupled to the control the motors 305 (FIG. 5). In an embodiment, the motor controller 322 is mounted to an external surface of the base unit 302. In another embodiment, the motor controller 322 is arranged internally within the base unit 302. The mobile scanning platform 300 further includes a power supply 324 that controls the flow of electrical power from a power source, such as batteries 326 for example. The batteries 326 may be disposed within the interior of the base unit 302. In an embodiment, the base unit 302 includes a port (not shown) for coupling the power supply to an external power source for recharging the batteries 326. In another embodiment, the batteries 326 are removable or replaceable.

Referring now to FIGS. 9-26, an embodiment of a 2D scanner 408 is shown having a housing 432 that includes a body portion 434 and a removable handle 436. It should be appreciated that while the embodiment of FIGS. 9-26 illustrate the 2D scanner 408 with the handle 436 attached, the handle 436 may be removed before the 2D scanner 408 is coupled to the base unit 302 when used in the embodiment of FIGS. 6-8. In an embodiment, the handle 436 may include an actuator 438 that allows the operator to interact with the scanner 408. In the exemplary embodiment, the body portion 434 includes a generally rectangular center portion 435 with a slot 440 formed in an end 442. The slot 440 is at least partially defined by a pair walls 444 that are angled towards a second end 448. As will be discussed in more detail herein, a portion of a 2D laser scanner 450 is arranged between the walls 444. The walls 444 are angled to allow the 2D laser scanner 450 to operate by emitting a light over a large angular area without interference from the walls 444. As will be discussed in more detail herein, the end 442 may further include a three-dimensional camera or RGBD camera.

Figure 13:
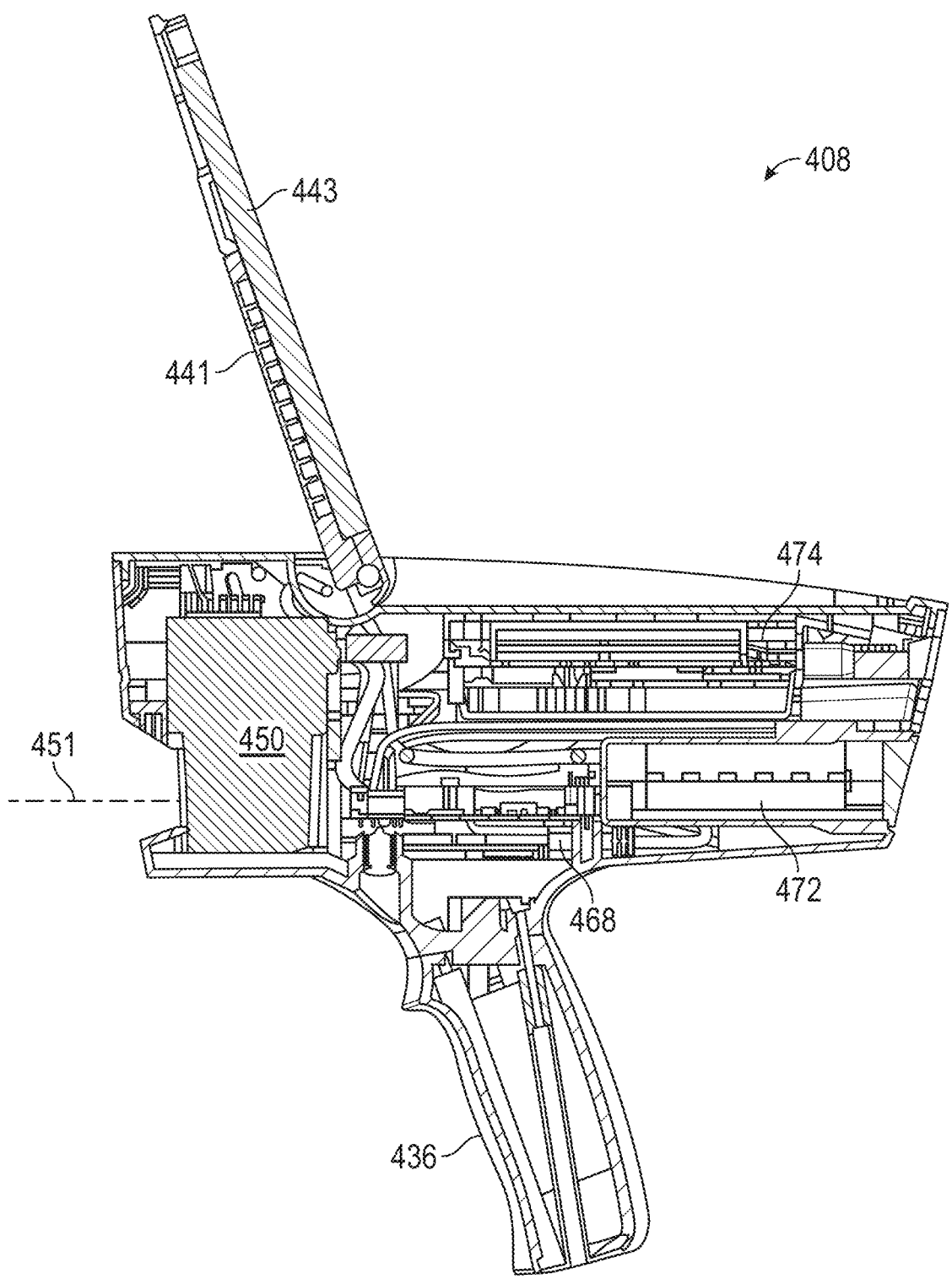
FIG. 13 is a side sectional view of the system of FIG. 9.
Figure 14:
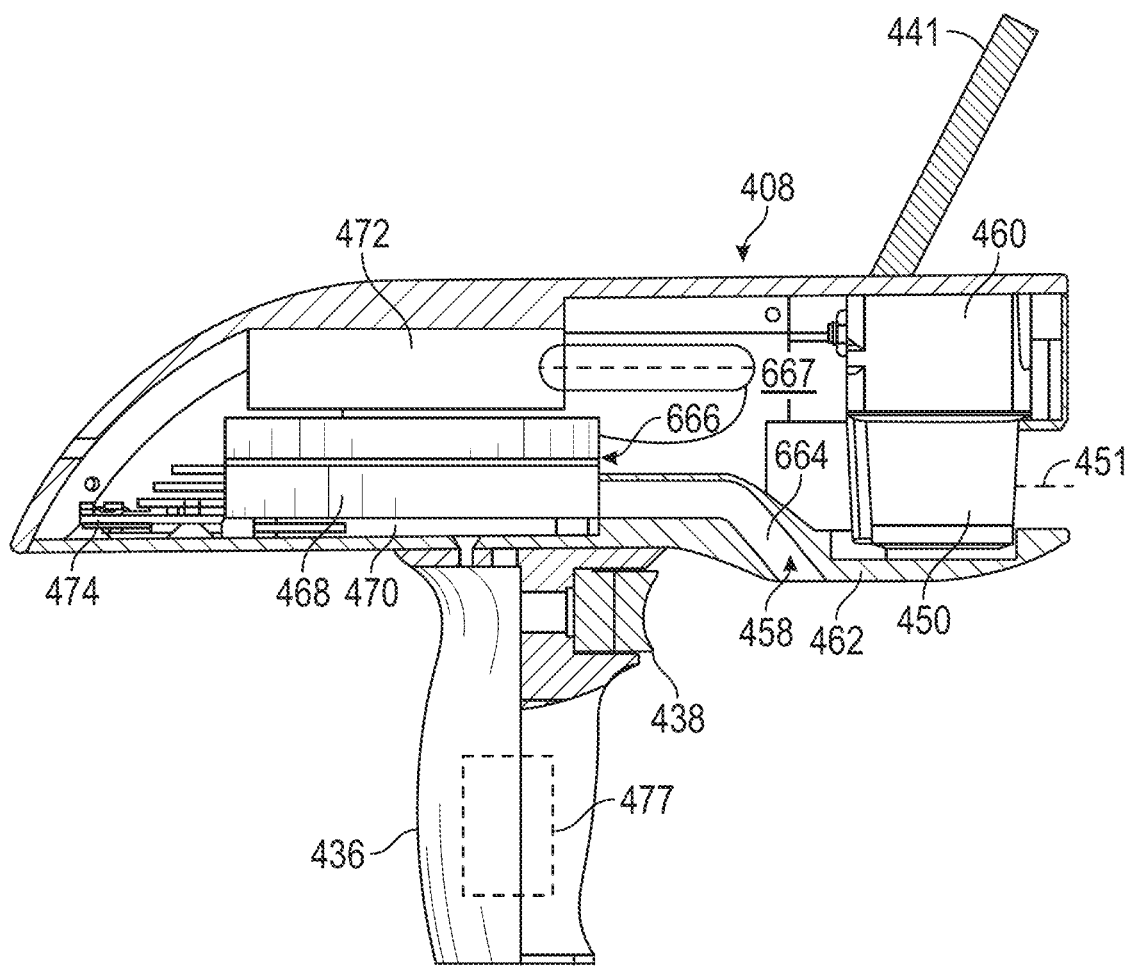
FIG. 14 is a side sectional view of the 2D system of a scanning and mapping system of FIG. 6 in accordance with another embodiment.
Figure 15:
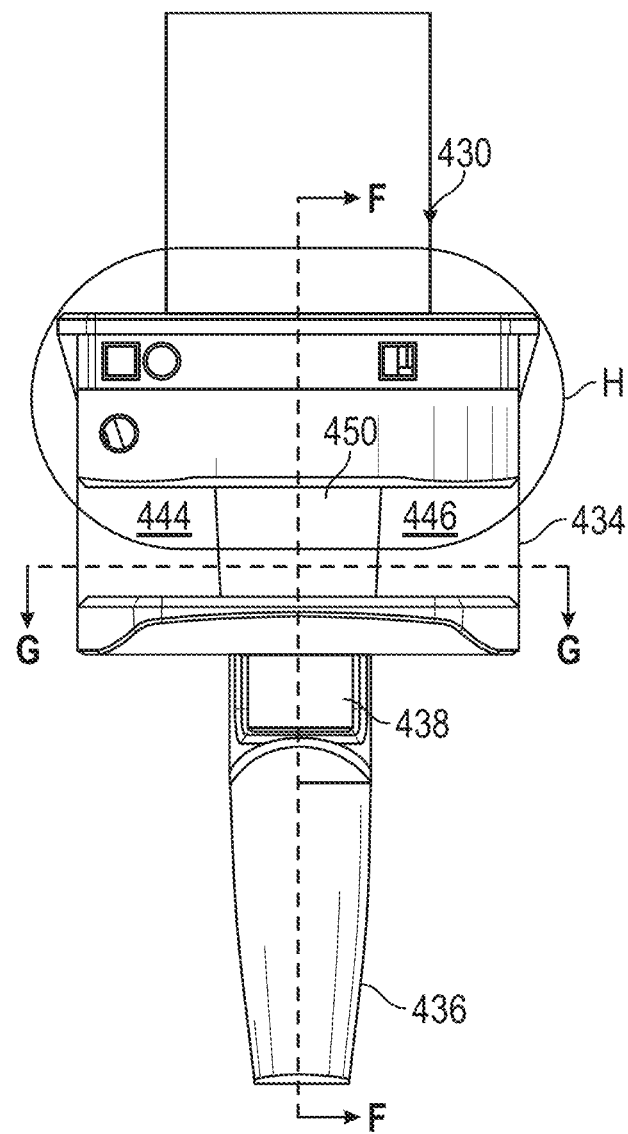
FIG. 15 is a first end view of the system of FIG. 14.
Figure 16:
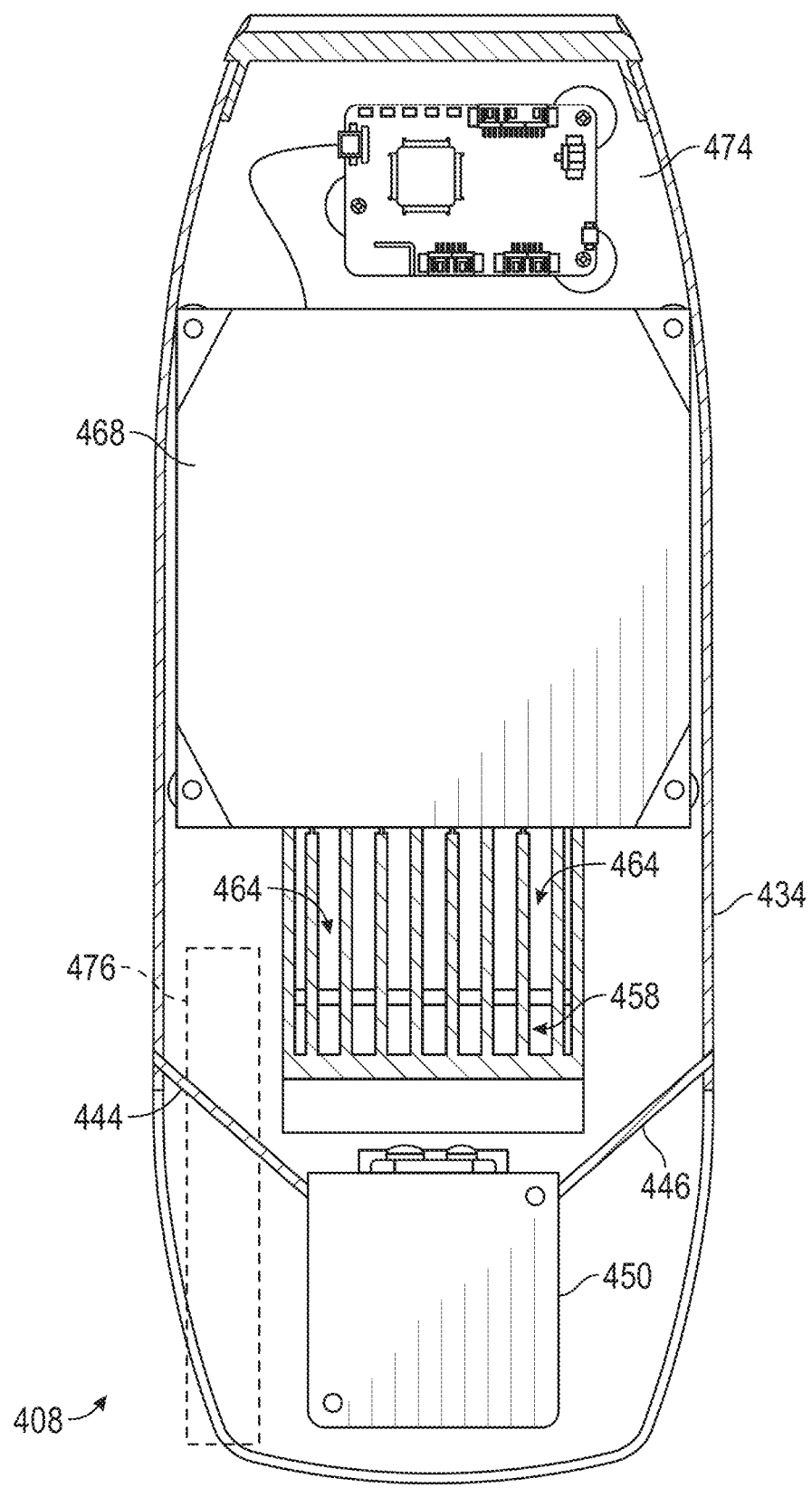
FIG. 16 is a top sectional view of the system of FIG. 14.
Figure 17:
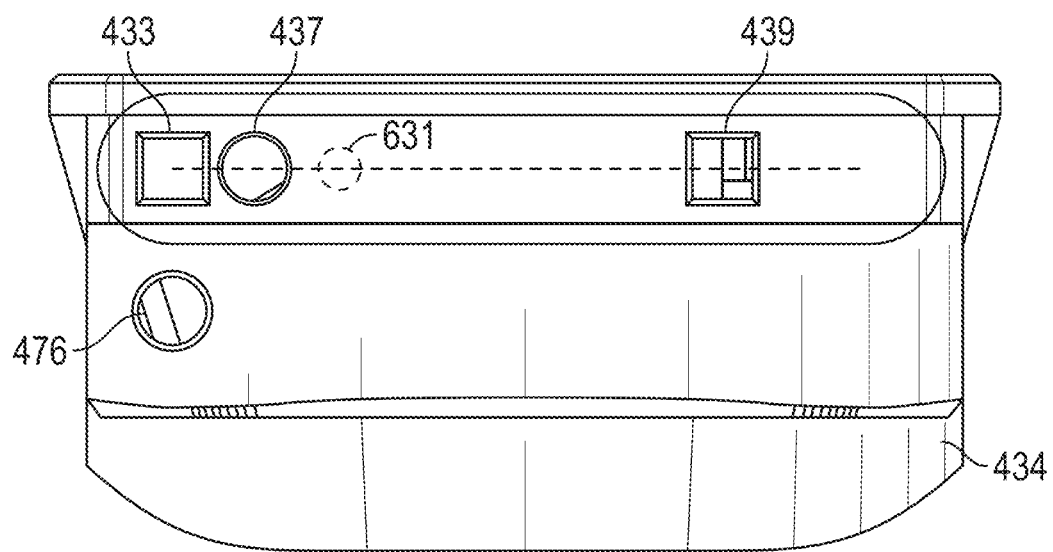
FIG. 17 is an enlarged view of a portion of the second end of FIG. 15.

Extending from the center portion 435 is a mobile device holder 441. The mobile device holder 441 is configured to securely couple a mobile device 443 to the housing 432. The holder 441 may include one or more fastening elements, such as a magnetic or mechanical latching element for example, that couples the mobile device 443 to the housing 432. In an embodiment, the mobile device 443 is coupled to communicate with a controller 468 (FIG. 13). The communication between the controller 468 and the mobile device 443 may be via any suitable communications medium, such as wired, wireless or optical communication mediums for example.

In the illustrated embodiment, the holder 441 is pivotally coupled to the housing 432, such that it may be selectively rotated into a closed position within a recess 446. In an embodiment, the recess 446 is sized and shaped to receive the holder 441 with the mobile device 443 disposed therein.

In the exemplary embodiment, the second end 448 includes a plurality of exhaust vent openings 456. In an embodiment, shown in FIGS. 14-17, the exhaust vent openings 456 are fluidly coupled to intake vent openings 458 arranged on a bottom surface 462 of center portion 435. The intake vent openings 458 allow external air to enter a conduit 464 having an opposite opening 466 in fluid communication with the hollow interior 467 of the body portion 434. In an embodiment, the opening 466 is arranged adjacent to a controller 468 which has one or more processors that is operable to perform the methods described herein. In an embodiment, the external air flows from the opening 466 over or around the controller 468 and out the exhaust vent openings 456.

In an embodiment, the controller 468 is coupled to a wall 470 of body portion 434. In an embodiment, the wall 470 is coupled to or integral with the handle 436. The controller 468 is electrically coupled to the 2D laser scanner 450, the 3D camera 460, a power source 472, an inertial measurement unit (IMU) 474, a laser line projector 476 (FIG. 13), and a haptic feedback device 477.

Figure 18:
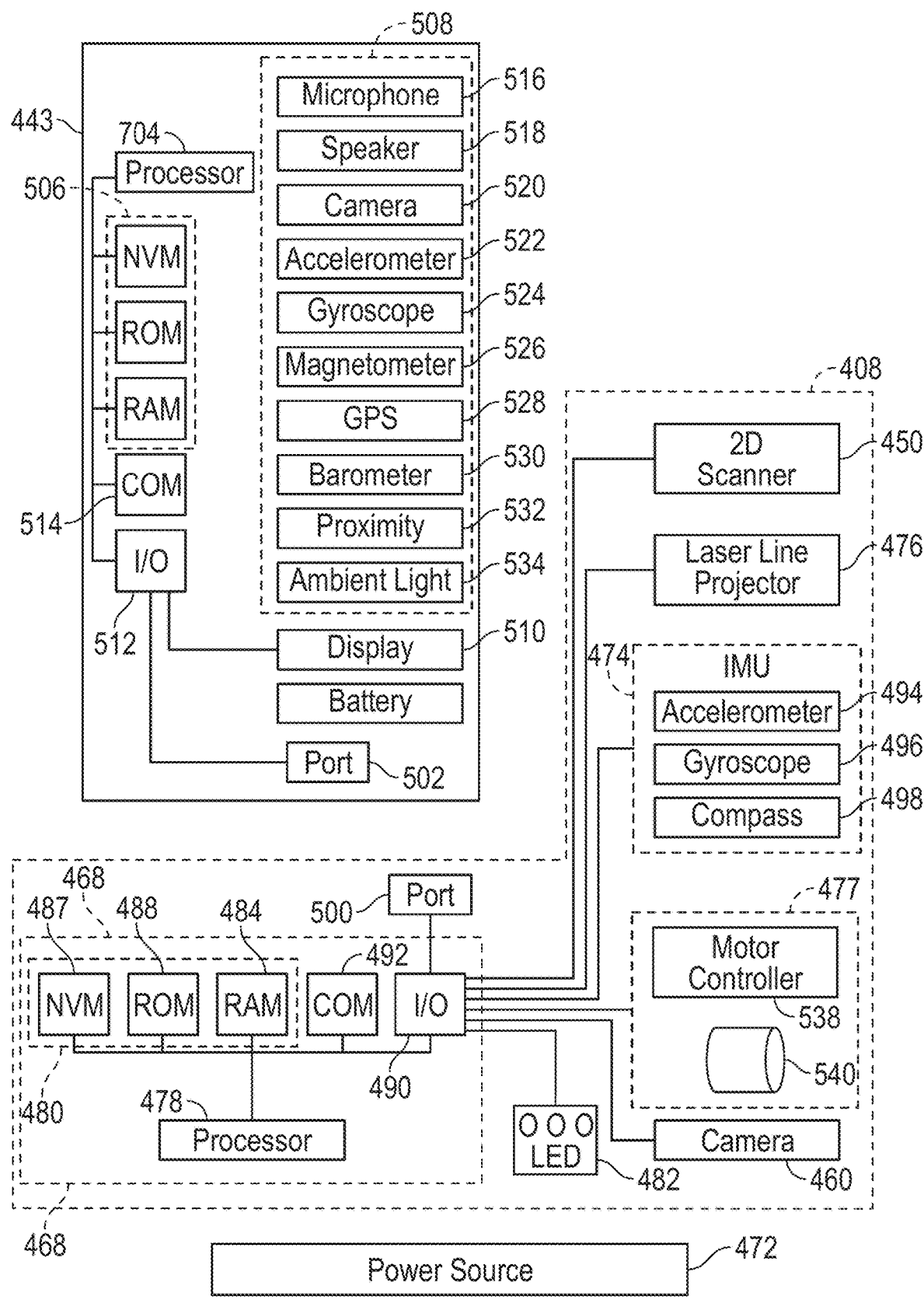
FIG. 18 is a block diagram of the system of FIG. 9 and FIG. 15.

Referring now to FIG. 18 with continuing reference to FIGS. 9-17, elements are shown of the scanner 408 with the mobile device 443 installed or coupled to the housing 432. Controller 468 is a suitable electronic device capable of accepting data and instructions, executing the instructions to process the data, and presenting the results. The controller 468 includes one or more processing elements, or processors 478. The processors may be microprocessors, field programmable gate arrays (FPGAs), digital signal processors (DSPs), and generally any device capable of performing computing functions. The one or more processors 478 have access to memory 480 for storing information.

Controller 468 is capable of converting the analog voltage or current level provided by 2D laser scanner 450, camera 460 and IMU 474 into a digital signal to determine a distance from the scanner 408 to an object in the environment. In an embodiment, the camera 460 is a 3D or RGBD type camera. Controller 468 uses the digital signals that act as input to various processes for controlling the scanner 408. The digital signals represent one or more scanner 408 data including but not limited to distance to an object, images of the environment, acceleration, pitch orientation, yaw orientation and roll orientation. As will be discussed in more detail, the digital signals may be from components internal to the housing 432 or from sensors and devices located in the mobile device 443.

In general, when the mobile device 443 is not installed, controller 468 accepts data from 2D laser scanner 450 and IMU 474 and is given certain instructions for the purpose of generating a two-dimensional map of a scanned environment. Controller 468 provides operating signals to the 2D laser scanner 450, the camera 460, laser line projector 476 and haptic feedback device 477. Controller 468 also accepts data from IMU 474, indicating, for example, whether the operator is operating in the system in the desired orientation. The controller 468 compares the operational parameters to predetermined variances (e.g. yaw, pitch or roll thresholds) and if the predetermined variance is exceeded, generates a signal that activates the haptic feedback device 477. The data received by the controller 468 may be displayed on a user interface coupled to controller 468. The user interface may be one or more LEDs (light-emitting diodes) 482, an LCD (liquid-crystal diode) display, a CRT (cathode ray tube) display, or the like. A keypad may also be coupled to the user interface for providing data input to controller 468. In one embodiment, the user interface is arranged or executed on the mobile device 443.

The controller 468 may also be coupled to external computer networks such as a local area network (LAN), the Internet, and/or a cloud computing environment such as that shown below in FIG. 38. A LAN interconnects one or more remote computers, which are configured to communicate with controllers 468 using a well-known computer communications protocol such as TCP/IP (Transmission Control Protocol/Internet Protocol), RS-232, ModBus, and the like. additional scanners 408 may also be connected to LAN with the controllers 468 in each of these scanners 408 being configured to send and receive data to and from remote computers and other scanners 408. The LAN may be connected to the Internet. This connection allows controller 468 to communicate with one or more remote computers connected to the Internet and/or to a cloud computing environment.

The processors 478 are coupled to memory 480. The memory 480 may include random access memory (RAM) device 484, a non-volatile memory (NVM) device 487, a read-only memory (ROM) device 488. In addition, the processors 478 may be connected to one or more input/output (I/O) controllers 490 and a communications circuit 492. In an embodiment, the communications circuit 492 provides an interface that allows wireless or wired communication with one or more external devices or networks, such as the LAN discussed above, the communications circuit 418, and/or the CLOUD.

Controller 468 includes operation control methods embodied in application code such as that shown or described with reference to FIGS. 19-22. These methods are embodied in computer instructions written to be executed by processors 478, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C#, Objective-C, Visual C++, Java, ALGOL (algorithmic language), BASIC (beginners all-purpose symbolic instruction code), visual BASIC, ActiveX, HTML (HyperText Markup Language), Python, Ruby and any combination or derivative of at least one of the foregoing.

Coupled to the controller 468 is the 2D laser scanner 450. The 2D laser scanner 450 measures 2D coordinates in a plane. In the exemplary embodiment, the scanning is performed by steering light within a plane to illuminate object points in the environment. The 2D laser scanner 450 collects the reflected (scattered) light from the object points to determine 2D coordinates of the object points in the 2D plane. In an embodiment, the 2D laser scanner 450 scans a spot of light over an angle while at the same time measuring an angle value and corresponding distance value to each of the illuminated object points.

Examples of 2D laser scanners 450 include, but are not limited to, Model LMS100 scanners manufactured by Sick, Inc of Minneapolis, Minn. and scanner Models URG-04LX-UG01 and UTM-30LX manufactured by Hokuyo Automatic Co., Ltd of Osaka, Japan. The scanners in the Sick LMS100 family measure angles over a 270 degree range and over distances up to 20 meters. The Hoyuko model URG-04LX-UG01 is a low-cost 2D scanner that measures angles over a 240 degree range and distances up to 4 meters. The Hoyuko model UTM-30LX is a 2D scanner that measures angles over a 270 degree range and to distances up to 30 meters. It should be appreciated that the above 2D scanners are exemplary and other types of 2D scanners are also available.

In an embodiment, the 2D laser scanner 450 is oriented so as to scan a beam of light over a range of angles in a generally horizontal plane (relative to the floor of the environment being scanned). At instants in time the 2D laser scanner 450 returns an angle reading and a corresponding distance reading to provide 2D coordinates of object points in the horizontal plane. In completing one scan over the full range of angles, the 2D laser scanner returns a collection of paired angle and distance readings. As the platform 100, 200, 300 is moved from place to place, the 2D laser scanner 450 continues to return 2D coordinate values. These 2D coordinate values are used to locate the position of the scanner 408 thereby enabling the generation of a two-dimensional map or floor plan of the environment.

Also coupled to the controller 486 is the IMU 474. The IMU 474 is a position/orientation sensor that may include accelerometers 494 (inclinometers), gyroscopes 496, a magnetometers or compass 498, and altimeters. In the exemplary embodiment, the IMU 474 includes multiple accelerometers 494 and gyroscopes 496. The compass 498 indicates a heading based on changes in magnetic field direction relative to the earth's magnetic north. The IMU 474 may further have an altimeter that indicates altitude (height). An example of a widely used altimeter is a pressure sensor. By combining readings from a combination of position/orientation sensors with a fusion algorithm that may include a Kalman filter, relatively accurate position and orientation measurements can be obtained using relatively low-cost sensor devices. In the exemplary embodiment, the IMU 474 determines the pose or orientation of the scanner 108 about three-axis to allow a determination of a yaw, roll and pitch parameter.

In the embodiment shown in FIGS. 14-17, the scanner 408 further includes a camera 460 that is a 3D or RGB-D camera. As used herein, the term 3D camera refers to a device that produces a two-dimensional image that includes distances to a point in the environment from the location of scanner 408. The 3D camera 460 may be a range camera or a stereo camera. In an embodiment, the 3D camera 460 includes an RGB-D sensor that combines color information with a per-pixel depth information. In an embodiment, the 3D camera 460 may include an infrared laser projector 431 (FIG. 17), a left infrared camera 433, a right infrared camera 439, and a color camera 437. In an embodiment, the 3D camera 460 is a RealSense™ camera model R200 manufactured by Intel Corporation.

In an embodiment, when the mobile device 443 is coupled to the housing 432, the mobile device 443 becomes an integral part of the scanner 408. In an embodiment, the mobile device 443 is a cellular phone, a tablet computer or a personal digital assistant (PDA). The mobile device 443 may be coupled for communication via a wired connection, such as ports 500, 502. The port 500 is coupled for communication to the processor 478, such as via I/O controller 690 for example. The ports 500, 502 may be any suitable port, such as but not limited to USB, USB-A, USB-B, USB-C, IEEE 1394 (Firewire), or Lightning™ connectors.

The mobile device 443 is a suitable electronic device capable of accepting data and instructions, executing the instructions to process the data, and presenting the results. The mobile device 443 includes one or more processing elements, or processors 504. The processors may be microprocessors, field programmable gate arrays (FPGAs), digital signal processors (DSPs), and generally any device capable of performing computing functions. The one or more processors 504 have access to memory 506 for storing information.

The mobile device 443 is capable of converting the analog voltage or current level provided by sensors 508 and processor 478. Mobile device 443 uses the digital signals that act as input to various processes for controlling the scanner 408. The digital signals represent one or more platform 100, 200, 300 data including but not limited to distance to an object, images of the environment, acceleration, pitch orientation, yaw orientation, roll orientation, global position, ambient light levels, and altitude for example.

In general, mobile device 443 accepts data from sensors 508 and is given certain instructions for the purpose of generating or assisting the processor 478 in the generation of a two-dimensional map or three-dimensional map of a scanned environment. Mobile device 443 provides operating signals to the processor 478, the sensors 508 and a display 510. Mobile device 443 also accepts data from sensors 508, indicating, for example, to track the position of the mobile device 443 in the environment or measure coordinates of points on surfaces in the environment. The mobile device 443 compares the operational parameters to predetermined variances (e.g. yaw, pitch or roll thresholds) and if the predetermined variance is exceeded, may generate a signal. The data received by the mobile device 443 may be displayed on display 510. In an embodiment, the display 510 is a touch screen device that allows the operator to input data or control the operation of the scanner 408.

The controller 468 may also be coupled to external networks such as a local area network (LAN), a cellular network, a cloud, and/or the Internet. A LAN interconnects one or more remote computers, which are configured to communicate with controller 68 using a well-known computer communications protocol such as TCP/IP (Transmission Control Protocol/Internee) Protocol), RS-232, ModBus, and the like. additional scanners 408 may also be connected to LAN with the controllers 468 in each of these scanners 408 being configured to send and receive data to and from remote computers and other scanners 408. The LAN may be connected to the Internet. This connection allows controller 468 to communicate with one or more remote computers connected to the Internet.

The processors 504 are coupled to memory 506. The memory 506 may include random access memory (RAM) device, a non-volatile memory (NVM) device, and a read-only memory (ROM) device. In addition, the processors 504 may be connected to one or more input/output (I/O) controllers 512 and a communications circuit 514. In an embodiment, the communications circuit 514 provides an interface that allows wireless or wired communication with one or more external devices or networks, such as the LAN or the cellular network discussed above.

Controller 468 includes operation control methods embodied in application code shown or described with reference to FIGS. 19-22. These methods are embodied in computer instructions written to be executed by processors 478, 504, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C#, Objective-C, Visual C++, Java, ALGOL (algorithmic language), BASIC (beginners all-purpose symbolic instruction code), visual BASIC, ActiveX, HTML (HyperText Markup Language), Python, Ruby and any combination or derivative of at least one of the foregoing.

Also coupled to the processor 504 are the sensors 508. The sensors 508 may include but are not limited to: a microphone 516; a speaker 518; a front or rear facing camera 520; accelerometers 522 (inclinometers), gyroscopes 524, a magnetometers or compass 526; a global positioning satellite (GPS) module 528; a barometer 530; a proximity sensor 532; and an ambient light sensor 534. By combining readings from a combination of sensors 508 with a fusion algorithm that may include a Kalman filter, relatively accurate position and orientation measurements can be obtained.

It should be appreciated that the sensors 460, 474 integrated into the scanner 408 may have different characteristics than the sensors 508 of mobile device 443. For example, the resolution of the cameras 460, 520 may be different, or the accelerometers 494, 522 may have different dynamic ranges, frequency response, sensitivity (mV/g) or temperature parameters (sensitivity or range). Similarly, the gyroscopes 496, 524 or compass/magnetometer may have different characteristics. It is anticipated that in some embodiments, one or more sensors 508 in the mobile device 443 may be of higher accuracy than the corresponding sensors 474 in the scanner 408. As described in more detail herein, in some embodiments the processor 478 determines the characteristics of each of the sensors 508 and compares them with the corresponding sensors in the scanner 408 when the mobile device. The processor 478 then selects which sensors 474, 508 are used during operation. In some embodiments, the mobile device 443 may have additional sensors (e.g. microphone 516, camera 520) that may be used to enhance operation compared to operation of the scanner 408 without the mobile device 443. In still further embodiments, the scanner 408 does not include the IMU 474 and the processor 478 uses the sensors 508 for tracking the position and orientation/pose of the scanner 408. In still further embodiments, the addition of the mobile device 443 allows the scanner 408 to utilize the camera 520 to perform three-dimensional (3D) measurements either directly (using an RGB-D camera) or using photogrammetry techniques to generate 3D maps. In an embodiment, the processor 478 uses the communications circuit (e.g. a cellular 4G internet connection) to transmit and receive data from remote computers or devices.

In an embodiment, the scanner 408 determines a quality attribute/parameter for the tracking of the scanner 408 and/or the platform 100. In an embodiment, the tracking quality attribute is a confidence level in the determined tracking positions and orientations to actual positions and orientations. When the confidence level crosses a threshold, the platform 100 may provide feedback to the operator to perform a stationary scan. It should be appreciated that a stationary scan will provide a highly accurate measurements that will allow the determination of the position and orientation of the scanner or platform with a high level of confidence. In an embodiment, the feedback is provided via a user interface. The user interface may be on the platform 100, the scanner 408, or the scanner 610 for example.

In the exemplary embodiment, the scanner 408 is a handheld portable device that is sized and weighted to be carried by a single person during operation. Therefore, the plane 536 (FIG. 22) in which the 2D laser scanner 450 projects a light beam may not be horizontal relative to the floor or may continuously change as the computer moves during the scanning process. Thus, the signals generated by the accelerometers 494, gyroscopes 496 and compass 498 (or the corresponding sensors 508) may be used to determine the pose (yaw, roll, tilt) of the scanner 108 and determine the orientation of the plane 451.

In an embodiment, it may be desired to maintain the pose of the scanner 408 (and thus the plane 536) within predetermined thresholds relative to the yaw, roll and pitch orientations of the scanner 408. In an embodiment, a haptic feedback device 477 is disposed within the housing 432, such as in the handle 436. The haptic feedback device 477 is a device that creates a force, vibration or motion that is felt or heard by the operator. The haptic feedback device 477 may be but is not limited to: an eccentric rotating mass vibration motor or a linear resonant actuator for example.

The haptic feedback device is used to alert the operator that the orientation of the light beam from 2D laser scanner 450 is equal to or beyond a predetermined threshold. In operation, when the IMU 474 measures an angle (yaw, roll, pitch or a combination thereof), the controller 468 transmits a signal to a motor controller 538 that activates a vibration motor 540. Since the vibration originates in the handle 436, the operator will be notified of the deviation in the orientation of the scanner 408. The vibration continues until the scanner 408 is oriented within the predetermined threshold or the operator releases the actuator 438. In an embodiment, it is desired for the plane 536 to be within 10-15 degrees of horizontal (relative to the ground) about the yaw, roll and pitch axes.

Figure 19:
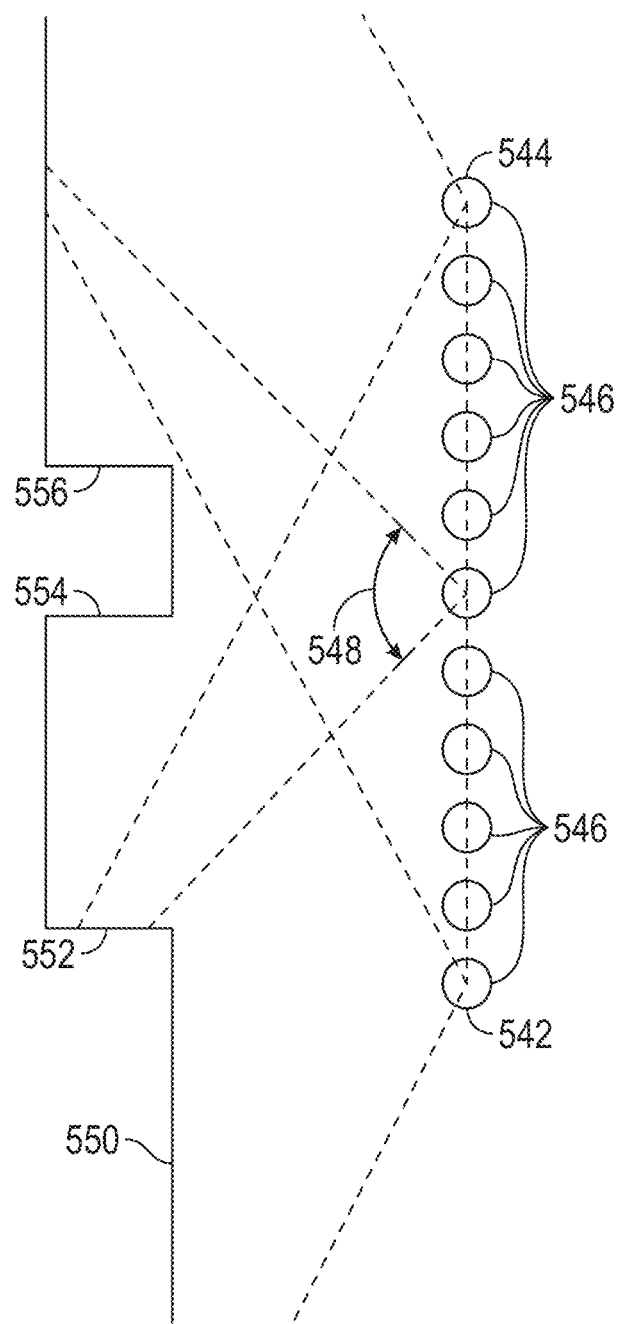
FIG. 19-21 are schematic illustrations of the operation of system of FIG. 9 in accordance with an embodiment.

In an embodiment, the 2D laser scanner 450 makes measurements as the platform 100, 200, 300 is moved about an environment, such from a first position 542 to a second registration position 544 as shown in FIG. 19. In an embodiment, 2D scan data is collected and processed as the scanner 408 passes through a plurality of 2D measuring positions 546. At each measuring position 546, the 2D laser scanner 450 collects 2D coordinate data over an effective FOV 548. Using methods described in more detail below, the controller 468 uses 2D scan data from the plurality of 2D scans at positions 546 to determine a position and orientation of the scanner 408 as it is moved about the environment. In an embodiment, the common coordinate system is represented by 2D Cartesian coordinates x, y and by an angle of rotation θ relative to the x or y axis. In an embodiment, the x and y axes lie in the plane of the 2D scanner and may be further based on a direction of a "front" of the 2D laser scanner 450.

Figure 20:
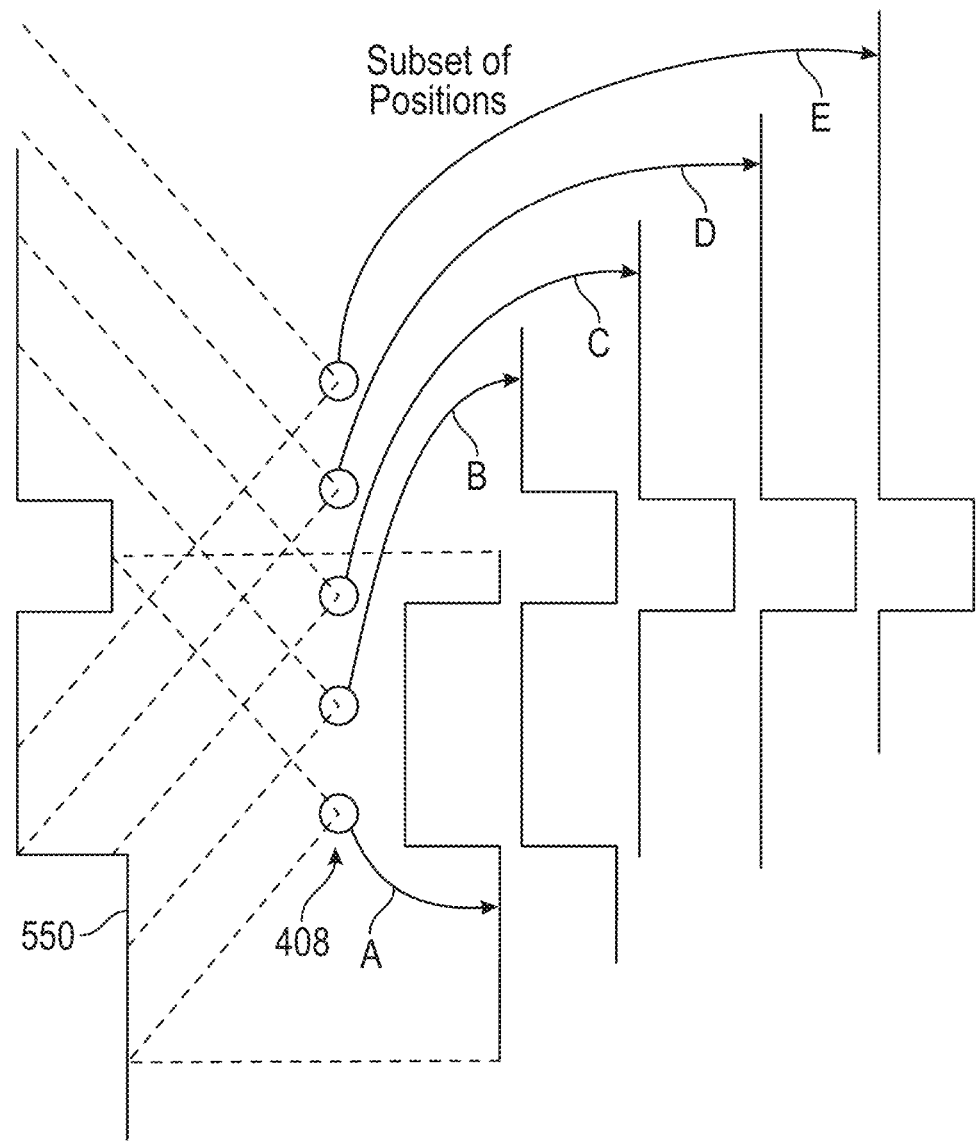
Figure 21:
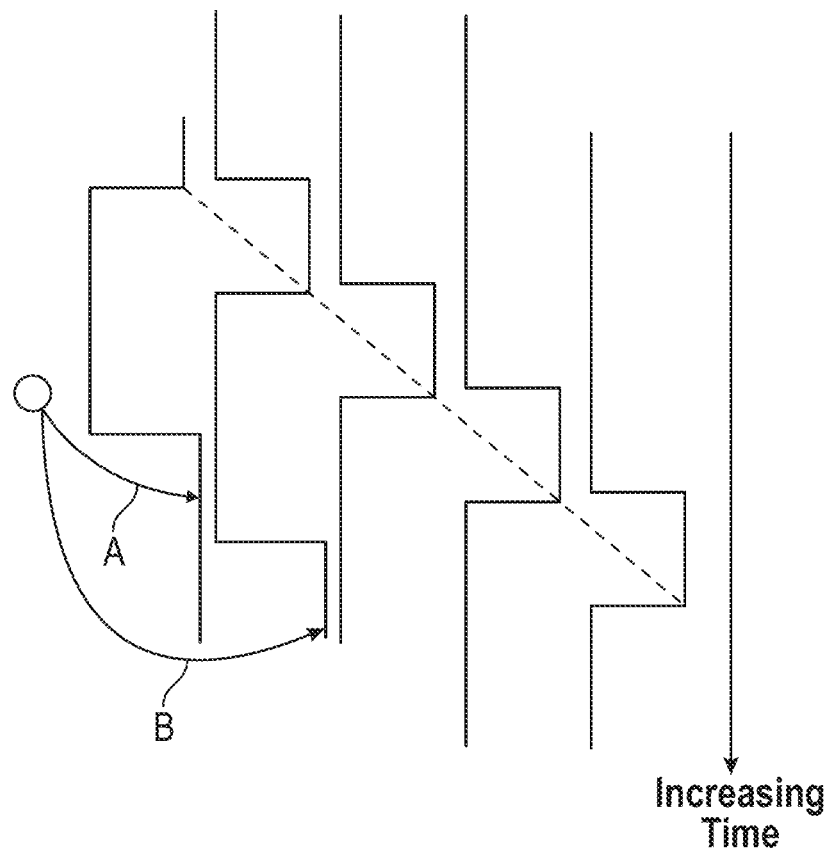

FIG. 21 shows the 2D scanner 408 collecting 2D scan data at selected positions 546 over an effective FOV 548. At different positions 546, the 2D laser scanner 450 captures a portion of the object 550 marked A, B, C, D, and E (FIG. 20). FIG. 21 shows 2D laser scanner 450 moving in time relative to a fixed frame of reference of the object 550.

FIG. 21 includes the same information as FIG. 20 but shows it from the frame of reference of the scanner 408 rather than the frame of reference of the object 550. FIG. 21 illustrates that in the scanner 408 frame of reference, the position of features on the object change over time. Therefore, the distance traveled by the scanner 408 can be determined from the 2D scan data sent from the 2D laser scanner 450 to the controller 468.

As the 2D laser scanner 450 takes successive 2D readings and performs best-fit calculations, the controller 468 keeps track of the translation and rotation of the 2D laser scanner 450, which is the same as the translation and rotation of the scanner 408. In this way, the controller 468 is able to accurately determine the change in the values of x, y, θ as the scanner 408 moves from the first position 542 to the second position 544.

In an embodiment, the controller 468 is configured to determine a first translation value, a second translation value, along with first and second rotation values (yaw, roll, pitch) that, when applied to a combination of the first 2D scan data and second 2D scan data, results in transformed first 2D data that closely matches transformed second 2D data according to an objective mathematical criterion. In general, the translation and rotation may be applied to the first scan data, the second scan data, or to a combination of the two. For example, a translation applied to the first data set is equivalent to a negative of the translation applied to the second data set in the sense that both actions produce the same match in the transformed data sets. An example of an "objective mathematical criterion" is that of minimizing the sum of squared residual errors for those portions of the scan data determined to overlap. Another type of objective mathematical criterion may involve a matching of multiple features identified on the object. For example, such features might be the edge transitions 552, 554, and 556 shown in FIG. 19. The mathematical criterion may involve processing of the raw data provided by the 2D laser scanner 450 to the controller 468, or it may involve a first intermediate level of processing in which features are represented as a collection of line segments using methods that are known in the art, for example, methods based on the Iterative Closest Point (ICP). Such a method based on ICP is described in Censi, A., "An ICP variant using a point-to-line metric," IEEE International Conference on Robotics and Automation (ICRA) 2008, which is incorporated by reference herein.

In an embodiment, assuming that the plane 536 of the light beam from 2D laser scanner 450 remains horizontal relative to the ground plane, the first translation value is dx, the second translation value is dy, and the first rotation value dθ. If the first scan data is collected with the 2D laser scanner 450 having translational and rotational coordinates (in a reference coordinate system) of $(x_1, y_1, \theta_1)$, then when the second 2D scan data is collected at a second location the coordinates are given by $(x_2, y_2, \theta_2) = (x_1+dx, y_1+dy, \theta_1+d\theta)$. In an embodiment, the controller 468 is further configured to determine a third translation value (for example, dz) and a second and third rotation values (for example, pitch and roll). The third translation value, second rotation value, and third rotation value may be determined based at least in part on readings from the IMU 474.

The 2D laser scanner 450 collects 2D scan data starting at the first position 542 and more 2D scan data at the second position 544. In some cases, these scans may suffice to determine the position and orientation of the scanner 408 at the second position 544 relative to the first position 542. In other cases, the two sets of 2D scan data are not sufficient to enable the controller 468 to accurately determine the first translation value, the second translation value, and the first rotation value. This problem may be avoided by collecting 2D scan data at intermediate scan positions 546. In an embodiment, the 2D scan data is collected and processed at regular intervals, for example, once per second. In this way, features in the environment are identified in successive 2D scans at positions 546. In an embodiment, when more than two 2D scans are obtained, the controller 468 may use the information from all the successive 2D scans in determining the translation and rotation values in moving from the first position 542 to the second position 544. In another embodiment, only the first and last scans in the final calculation, simply using the intermediate 2D scans to ensure proper correspondence of matching features. In most cases, accuracy of matching is improved by incorporating information from multiple successive 2D scans.

It should be appreciated that as the scanner 408 is moved beyond the second position 544, a two-dimensional image or map of the environment being scanned may be generated. It should further be appreciated that in addition to generating a 2D map of the environment, the data from scanner 408 may be used to generate (and store) a 2D trajectory of the scanner 408 as it is moved through the environment. In an embodiment, the 2D map and/or the 2D trajectory may be combined or fused with data from other sources in the registration of measured 3D coordinates. It should be appreciated that the 2D trajectory may represent a path followed by the 2D scanner 408.

Figure 22:
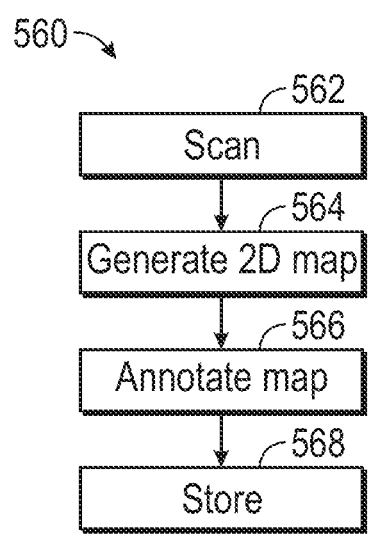
FIG. 22 is a flow diagram of a method of generating a 2D map of an environment.
Figure 23:
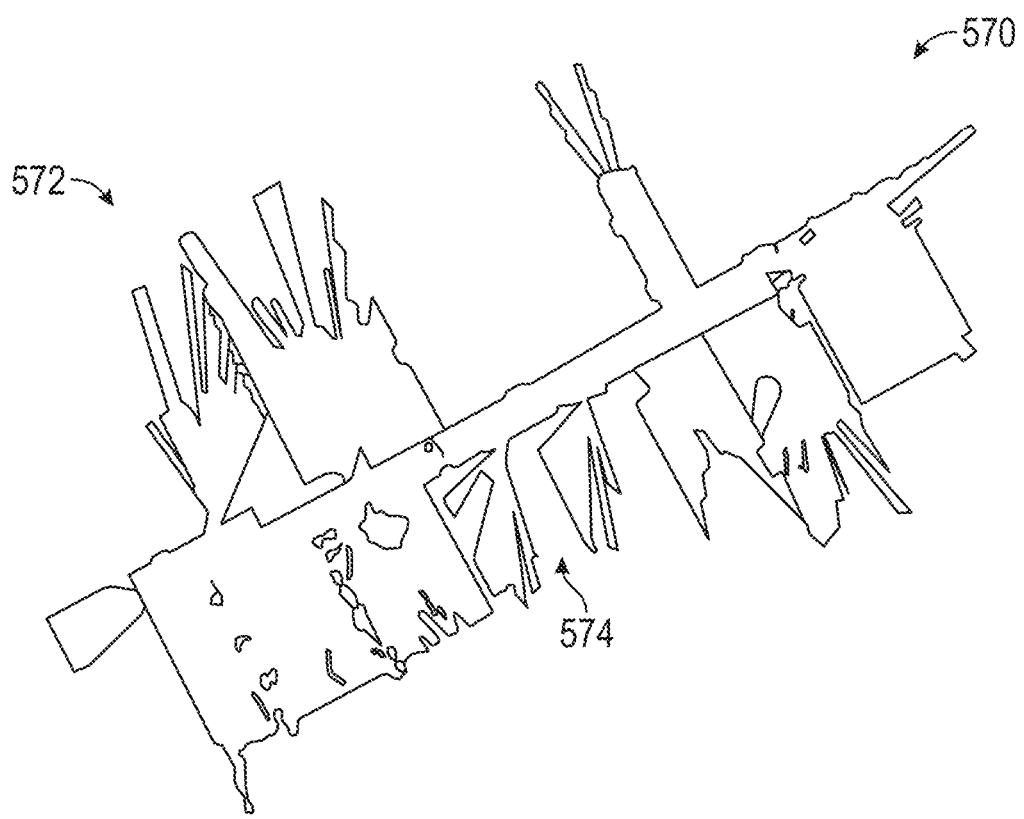
FIGS. 23-24 are plan views of stages of a 2D map generated with the method of FIG. 22 in accordance with an embodiment.

Referring now to FIG. 22, a method 560 is shown for generating a two-dimensional map with annotations. The method 560 starts in block 562 where the facility or area is scanned to acquire scan data 570, such as that shown in FIG. 23. The scanning is performed by carrying the scanner 408 through the area to be scanned. The scanner 408 measures distances from the scanner 408 to an object, such as a wall for example, and also a pose of the scanner 408 in an embodiment the user interacts with the scanner 408 via actuator 538. In the illustrated embodiments, the mobile device 443 provides a user interface that allows the operator to initiate the functions and control methods described herein. Using the registration process desired herein, the two dimensional locations of the measured points on the scanned objects (e.g. walls, doors, windows, cubicles, file cabinets etc.) may be determined. It is noted that the initial scan data may include artifacts, such as data that extends through a window 572 or an open door 574 for example. Therefore, the scan data 570 may include additional information that is not desired in a 2D map or layout of the scanned area.

Figure 24:
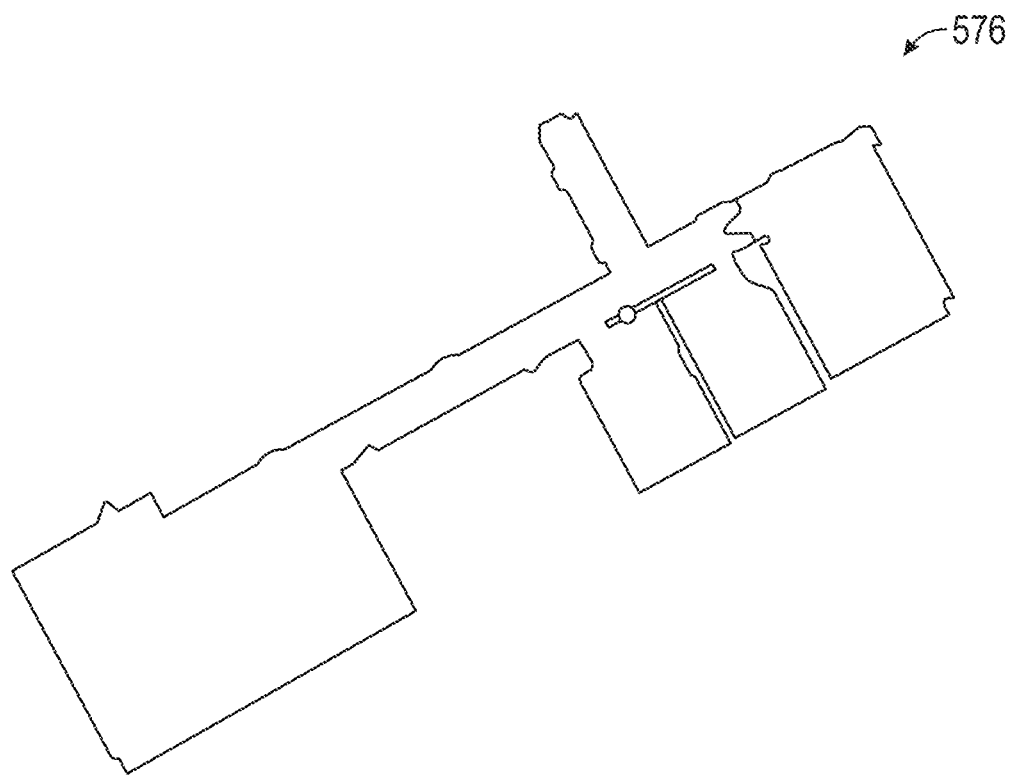

The method 560 then proceeds to block 564 where a 2D map 576 is generated of the scanned area as shown in FIG. 24. The generated 2D map 576 represents a scan of the area, such as in the form of a floor plan without the artifacts of the initial scan data. It should be appreciated that the 2D map 576 represents a dimensionally accurate representation of the scanned area that may be used to determine the position and pose of the mobile scanning platform 100, 200, 300 in the environment to allow the registration of the 3D coordinate points measured by the 3D measurement device 110. In the embodiment of FIG. 22, the method 560 then proceeds to block 566 where optional user-defined annotations are made to the 2D maps 576 to define an annotated 2D map that includes information, such as dimensions of features, the location of doors, the relative positions of objects (e.g. liquid oxygen tanks, entrances/exits or egresses or other notable features such as but not limited to the location of automated sprinkler systems, knox or key boxes, or fire department connection points ("FDC"). In an embodiment, the annotation may also be used to define scan locations where the mobile scanning platform 300 stops and uses the 3D scanner 310 to perform a stationary scan of the environment.

Once the annotations of the 2D annotated map are completed, the method 560 then proceeds to block 568 where the 2D map is stored in memory, such as non-volatile memory device 487 for example. The 2D map may also be stored in a network accessible storage device or server so that it may be accessed by the desired personnel.

Figure 25:
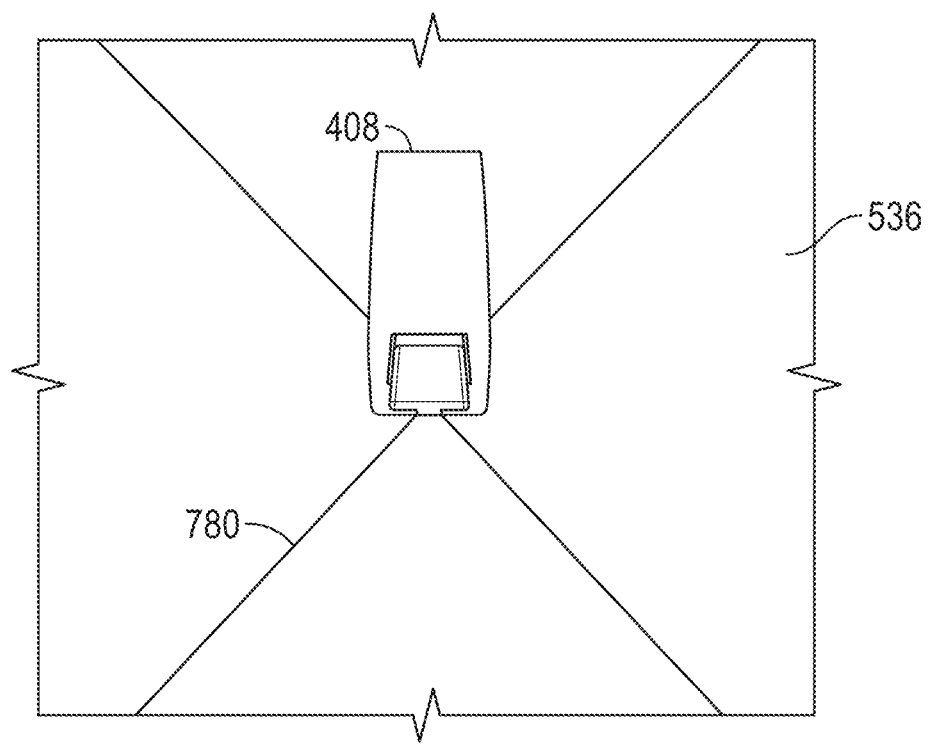
FIG. 25-26 are schematic views of the operation of the system of FIG. 9 in accordance with an embodiment.
Figure 26:
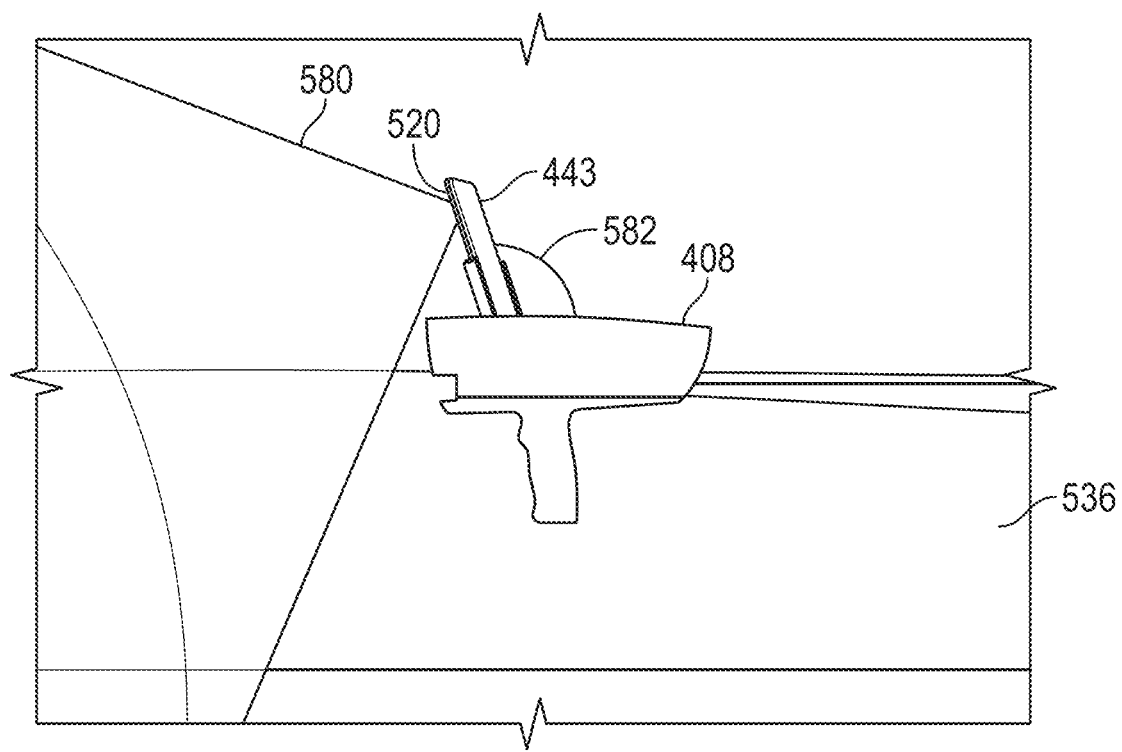

Referring now to FIG. 25 and FIG. 26 an embodiment is illustrated with the mobile device 443 coupled to the scanner 408. As described herein, the 2D laser scanner 450 emits a beam of light in the plane 536. The 2D laser scanner 450 has a field of view (FOV) that extends over an angle that is less than 360 degrees. In the exemplary embodiment, the FOV of the 2D laser scanner is about 270 degrees. In this embodiment, the mobile device 443 is coupled to the housing 432 adjacent the end where the 2D laser scanner 450 is arranged. The mobile device 443 includes a forward facing camera 520. The camera 520 is positioned adjacent a top side of the mobile device and has a predetermined field of view 580. In the illustrated embodiment, the holder 441 couples the mobile device 443 on an obtuse angle 582. This arrangement allows the mobile device 443 to acquire images of the floor and the area directly in front of the scanner 408 (e.g. the direction the operator is moving the platform 100, 200).

In embodiments where the camera 520 is an RGB-D type camera, three-dimensional coordinates of surfaces in the environment may be directly determined in a mobile device coordinate frame of reference. In an embodiment, the holder 441 allows for the mounting of the mobile device 443 in a stable position (e.g. no relative movement) relative to the 2D laser scanner 450. When the mobile device 443 is coupled to the housing 432, the processor 478 performs a calibration of the mobile device 443 allowing for a fusion of the data from sensors 508 with the sensors of scanner 408. As a result, the coordinates of the 2D laser scanner may be transformed into the mobile device coordinate frame of reference or the 3D coordinates acquired by camera 520 may be transformed into the 2D scanner coordinate frame of reference.

In an embodiment, the mobile device is calibrated to the 2D laser scanner 450 by assuming the position of the mobile device based on the geometry and position of the holder 441 relative to 2D laser scanner 450. In this embodiment, it is assumed that the holder that causes the mobile device to be positioned in the same manner. It should be appreciated that this type of calibration may not have a desired level of accuracy due to manufacturing tolerance variations and variations in the positioning of the mobile device 443 in the holder 441. In another embodiment, a calibration is performed each time a different mobile device 443 is used. In this embodiment, the user is guided (such as via the user interface/display 510) to direct the scanner 408 to scan a specific object, such as a door, that can be readily identified in the laser readings of the scanner 408 and in the camera-sensor 520 using an object recognition method.

Referring now to FIGS. 27-29, an embodiment is shown of a laser scanner 610. In this embodiment, the laser scanner 610 has a measuring head 622 and a base 624. The measuring head 622 is mounted on the base 624 such that the laser scanner 610 may be rotated about a vertical axis 623. In one embodiment, the measuring head 622 includes a gimbal point 627 that is a center of rotation about the vertical axis 623 and a horizontal axis 625. The measuring head 622 has a rotary mirror 626, which may be rotated about the horizontal axis 625. The rotation about the vertical axis may be about the center of the base 624. In one embodiment, the vertical axis 623 is coaxial with the center axis of the post 109, 209, 309. The terms vertical axis and horizontal axis refer to the scanner in its normal upright position. It is possible to operate a 3D coordinate measurement device on its side or upside down, and so to avoid confusion, the terms azimuth axis and zenith axis may be substituted for the terms vertical axis and horizontal axis, respectively. The term pan axis or standing axis may also be used as an alternative to vertical axis.

The measuring head 622 is further provided with an electromagnetic radiation emitter, such as light emitter 628, for example, that emits an emitted light beam 630. In one embodiment, the emitted light beam 630 is a coherent light beam such as a laser beam. The laser beam may have a wavelength range of approximately 300 to 1600 nanometers, for example 790 nanometers, 905 nanometers, 1550 nm, or less than 400 nanometers. It should be appreciated that other electromagnetic radiation beams having greater or smaller wavelengths may also be used. The emitted light beam 630 is amplitude or intensity modulated, for example, with a sinusoidal waveform or with a rectangular waveform. The emitted light beam 630 is emitted by the light emitter 628 onto a beam steering unit, such as mirror 626, where it is deflected to the environment. A reflected light beam 632 is reflected from the environment by an object 634. The reflected or scattered light is intercepted by the rotary mirror 626 and directed into a light receiver 636. The directions of the emitted light beam 630 and the reflected light beam 632 result from the angular positions of the rotary mirror 626 and the measuring head 622 about the axes 625, 623, respectively. These angular positions in turn depend on the corresponding rotary drives or motors.

Coupled to the light emitter 628 and the light receiver 636 is a controller 638. The controller 638 determines, for a multitude of measuring points X, a corresponding number of distances d between the laser scanner 610 and the points X on object 634. The distance to a particular point X is determined based at least in part on the speed of light in air through which electromagnetic radiation propagates from the device to the object point X. In one embodiment the phase shift of modulation in light emitted by the laser scanner 610 and the point X is determined and evaluated to obtain a measured distance d.

The speed of light in air depends on the properties of the air such as the air temperature, barometric pressure, relative humidity, and concentration of carbon dioxide. Such air properties influence the index of refraction n of the air. The speed of light in air is equal to the speed of light in vacuum c divided by the index of refraction. In other words, $c_{air}=c/n$. A laser scanner of the type discussed herein is based on the time-of-flight (TOF) of the light in the air (the round-trip time for the light to travel from the device to the object and back to the device). Examples of TOF scanners include scanners that measure round trip time using the time interval between emitted and returning pulses (pulsed TOF scanners), scanners that modulate light sinusoidally and measure phase shift of the returning light (phase-based scanners), as well as many other types. A method of measuring distance based on the time-of-flight of light depends on the speed of light in air and is therefore easily distinguished from methods of measuring distance based on triangulation. Triangulation-based methods involve projecting light from a light source along a particular direction and then intercepting the light on a camera pixel along a particular direction. By knowing the distance between the camera and the projector and by matching a projected angle with a received angle, the method of triangulation enables the distance to the object to be determined based on one known length and two known angles of a triangle. The method of triangulation, therefore, does not directly depend on the speed of light in air.

In one mode of operation, the scanning of the volume around the scanner 610 takes place by rotating the rotary mirror 626 relatively quickly about axis 625 while rotating the measuring head 622 relatively slowly about axis 623, thereby moving the assembly in a spiral pattern. This is sometimes referred to as a compound mode of operation. In an exemplary embodiment, the rotary mirror rotates at a maximum speed of 5820 revolutions per minute. For such a scan, the gimbal point 627 defines the origin of the local stationary reference system. The base 624 rests in this local stationary reference system. In other embodiments, another mode of operation is provided wherein the scanner 610 rotates the rotary mirror 626 about the axis 625 while the measuring head 622 remains stationary. This is sometimes referred to as a helical mode of operation.

In an embodiment, the acquisition of the 3D coordinate values further allows for the generation of a 3D trajectory, such as the 3D trajectory (e.g. 3D path) of the gimbal point 627 for example. This 3D trajectory may be stored and combined or fused with other data, such as data from the 2D scanner and/or from an inertial measurement unit for example and used to register 3D coordinate data. It should be appreciated that the 3D trajectory may be transformed from the gimbal point 627 to any other location on the system, such as the base unit.

In addition to measuring a distance d from the gimbal point 627 to an object point X, the laser scanner 610 may also collect gray-scale information related to the received optical power (equivalent to the term "brightness.") The gray-scale value may be determined at least in part, for example, by integration of the bandpass-filtered and amplified signal in the light receiver 636 over a measuring period attributed to the object point X.

The measuring head 622 may include a display device 640 integrated into the laser scanner 610. The display device 640 may include a graphical touch screen 641, which allows the operator to set the parameters or initiate the operation of the laser scanner 610. For example, the screen 641 may have a user interface that allows the operator to provide measurement instructions to the device, and the screen may also display measurement results.

The laser scanner 610 includes a carrying structure 642 that provides a frame for the measuring head 622 and a platform for attaching the components of the laser scanner 610. In one embodiment, the carrying structure 642 is made from a metal such as aluminum. The carrying structure 642 includes a traverse member 644 having a pair of walls 646, 648 on opposing ends. The walls 646, 648 are parallel to each other and extend in a direction opposite the base 624. Shells 650, 652 are coupled to the walls 646, 648 and cover the components of the laser scanner 610. In the exemplary embodiment, the shells 650, 652 are made from a plastic material, such as polycarbonate or polyethylene for example. The shells 650, 652 cooperate with the walls 646, 648 to form a housing for the laser scanner 610.

On an end of the shells 650, 652 opposite the walls 646, 648 a pair of yokes 654, 656 are arranged to partially cover the respective shells 650, 652. In the exemplary embodiment, the yokes 654, 656 are made from a suitably durable material, such as aluminum for example, that assists in protecting the shells 650, 652 during transport and operation. The yokes 654, 656 each includes a first arm portion 658 that is coupled, such as with a fastener for example, to the traverse member 644 adjacent the base 624. The arm portion 658 for each yoke 654, 656 extends from the traverse member 644 obliquely to an outer corner of the respective shell 650, 652. From the outer corner of the shell, the yokes 654, 656 extend along the side edge of the shell to an opposite outer corner of the shell. Each yoke 654, 656 further includes a second arm portion that extends obliquely to the walls 646,648. It should be appreciated that the yokes 654, 656 may be coupled to the traverse member 644, the walls 646, 648 and the shells 650, 654 at multiple locations.

The pair of yokes 654, 656 cooperate to circumscribe a convex space within which the two shells 650, 652 are arranged. In the exemplary embodiment, the yokes 654, 656 cooperate to cover all of the outer edges of the shells 650, 654, while the top and bottom arm portions project over at least a portion of the top and bottom edges of the shells 650, 652. This provides advantages in protecting the shells 650, 652 and the measuring head 622 from damage during transportation and operation. In other embodiments, the yokes 654, 656 may include additional features, such as handles to facilitate the carrying of the laser scanner 610 or attachment points for accessories for example.

In an embodiment, on top of the traverse member 644, a prism 660 is provided. The prism extends parallel to the walls 646, 648. In the exemplary embodiment, the prism 660 is integrally formed as part of the carrying structure 642. In other embodiments, the prism 660 is a separate component that is coupled to the traverse member 644. When the mirror 626 rotates, during each rotation the mirror 626 directs the emitted light beam 630 onto the traverse member 644 and the prism 660. In some embodiments, due to non-linearities in the electronic components, for example in the light receiver 636, the measured distances d may depend on signal strength, which may be measured in optical power entering the scanner or optical power entering optical detectors within the light receiver 636, for example. In an embodiment, a distance correction is stored in the scanner as a function (possibly a nonlinear function) of distance to a measured point and optical power (generally unscaled quantity of light power sometimes referred to as "brightness") returned from the measured point and sent to an optical detector in the light receiver 636. Since the prism 660 is at a known distance from the gimbal point 627, the measured optical power level of light reflected by the prism 660 may be used to correct distance measurements for other measured points, thereby allowing for compensation to correct for the effects of environmental variables such as temperature. In the exemplary embodiment, the resulting correction of distance is performed by the controller 638.

In an embodiment, the base 624 is coupled to a swivel assembly (not shown) such as that described in commonly owned U.S. Pat. No. 8,705,012 ('012), which is incorporated by reference herein. The swivel assembly is housed within the carrying structure 642 and includes a motor that is configured to rotate the measuring head 622 about the axis 623. In an embodiment, the angular/rotational position of the measuring head 622 about the axis 623 is measured by angular encoder. In the embodiments disclosed herein, the base (with or without the swivel assembly) may be mounted to the post 109, 209, or 309.

An auxiliary image acquisition device 666 may be a device that captures and measures a parameter associated with the scanned area or the scanned object and provides a signal representing the measured quantities over an image acquisition area. The auxiliary image acquisition device 666 may be, but is not limited to, a pyrometer, a thermal imager, an ionizing radiation detector, or a millimeter-wave detector. In an embodiment, the auxiliary image acquisition device 666 is a color camera.

In an embodiment, a central color camera (first image acquisition device 612) is located internally to the scanner and may have the same optical axis as the 3D scanner device. In this embodiment, the first image acquisition device 612 is integrated into the measuring head 622 and arranged to acquire images along the same optical pathway as emitted light beam 630 and reflected light beam 632. In this embodiment, the light from the light emitter 628 reflects off a fixed mirror 616 and travels to dichroic beam-splitter 618 that reflects the light 617 from the light emitter 628 onto the rotary mirror 626. In an embodiment, the mirror 626 is rotated by a motor 699 and the angular/rotational position of the mirror is measured by angular encoder 697. The dichroic beam-splitter 618 allows light to pass through at wavelengths different than the wavelength of light 617. For example, the light emitter 628 may be a near infrared laser light (for example, light at wavelengths of 780 nm or 1150 nm), with the dichroic beam-splitter 618 configured to reflect the infrared laser light while allowing visible light (e.g., wavelengths of 400 to 700 nm) to transmit through. In other embodiments, the determination of whether the light passes through the beam-splitter 618 or is reflected depends on the polarization of the light. The digital camera 612 obtains 2D images of the scanned area to capture color data to add to the scanned image. In the case of a built-in color camera having an optical axis coincident with that of the 3D scanning device, the direction of the camera view may be easily obtained by simply adjusting the steering mechanisms of the scanner—for example, by adjusting the azimuth angle about the axis 623 and by steering the mirror 626 about the axis 625. One or both of the color cameras 612, 666 may be used to colorize the acquired 3D coordinates (e.g. the point cloud).

In an embodiment, when the 3D scanner is operated in compound mode, a compound compensation may be performed to optimize the registration of date by combining or fusing sensor data (e.g. 2D scanner, 3D scanner and/or IMU data) using the position and orientation (e.g. trajectory) of each sensor.

It should be appreciated that while embodiments herein refer to the 3D scanner 610 as being a time-of-flight (phase shift or pulsed) scanner, this is for exemplary purposes and the claims should not be so limited. In other embodiments, other types of 3D scanners may be used, such as but not limited to structured light scanners, area scanners, triangulation scanners, photogrammetry scanners, or a combination of the foregoing.

Figure 30:
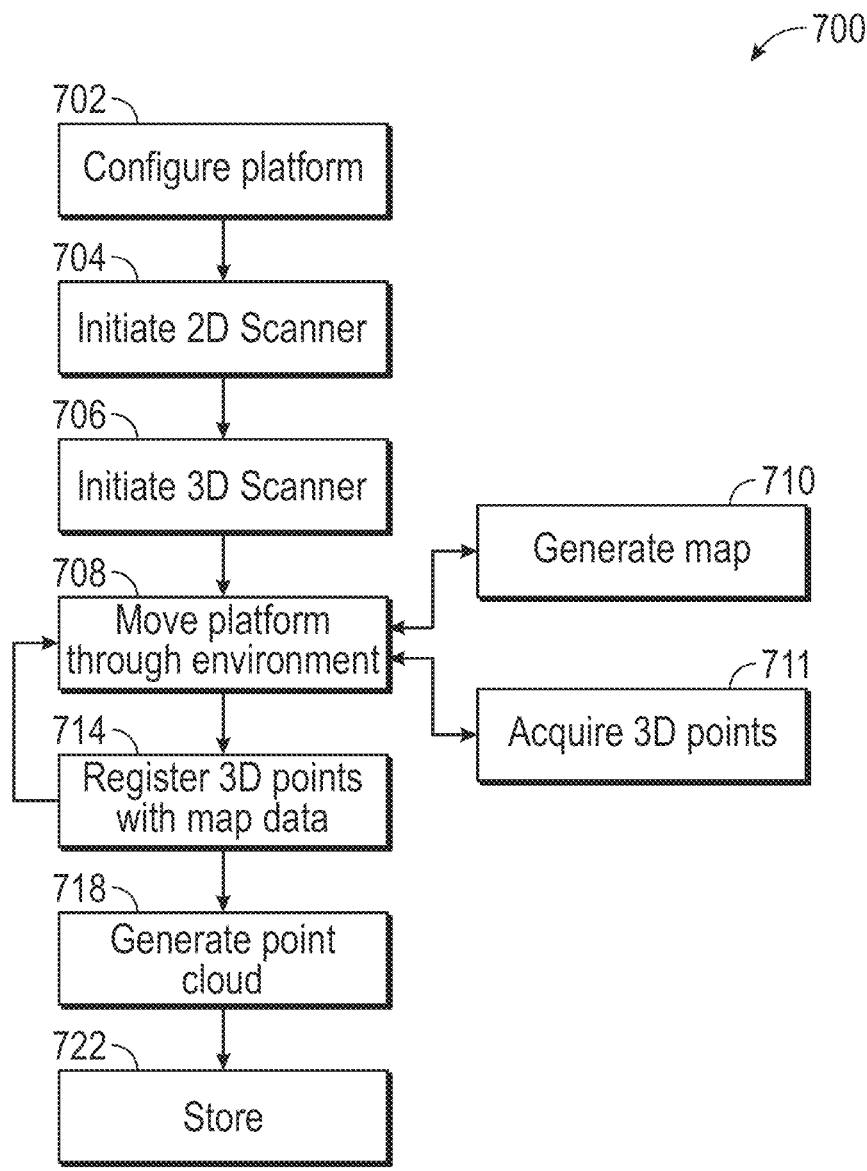
FIG. 30 is a flow diagram of a method of scanning an environment using the mobile scanning platform of FIG. 1, FIG. 5 or FIG. 6.
Figure 31:
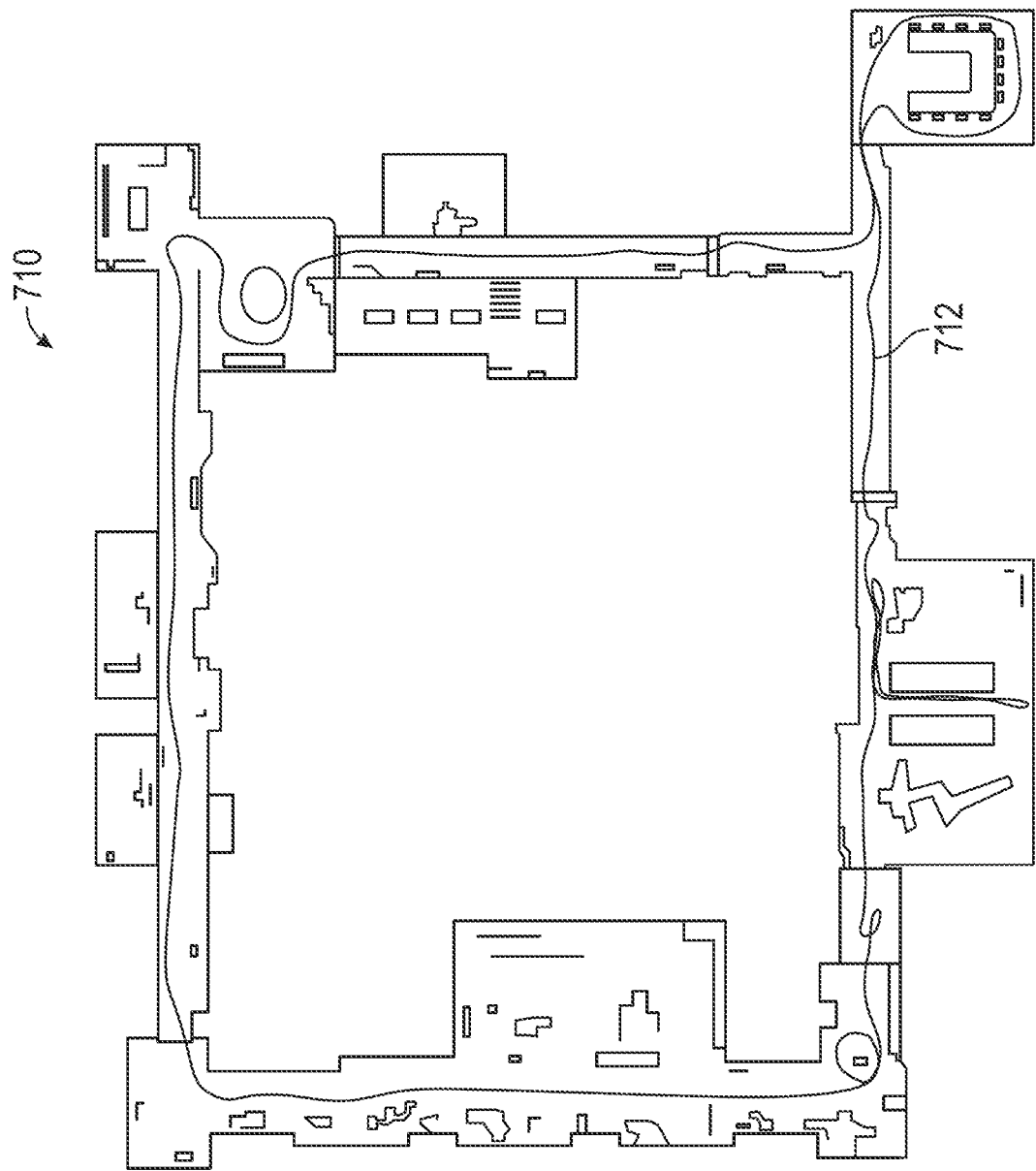
FIG. 31 is a plan view of a 2D map generated during the method of FIG. 30.
Figure 32:
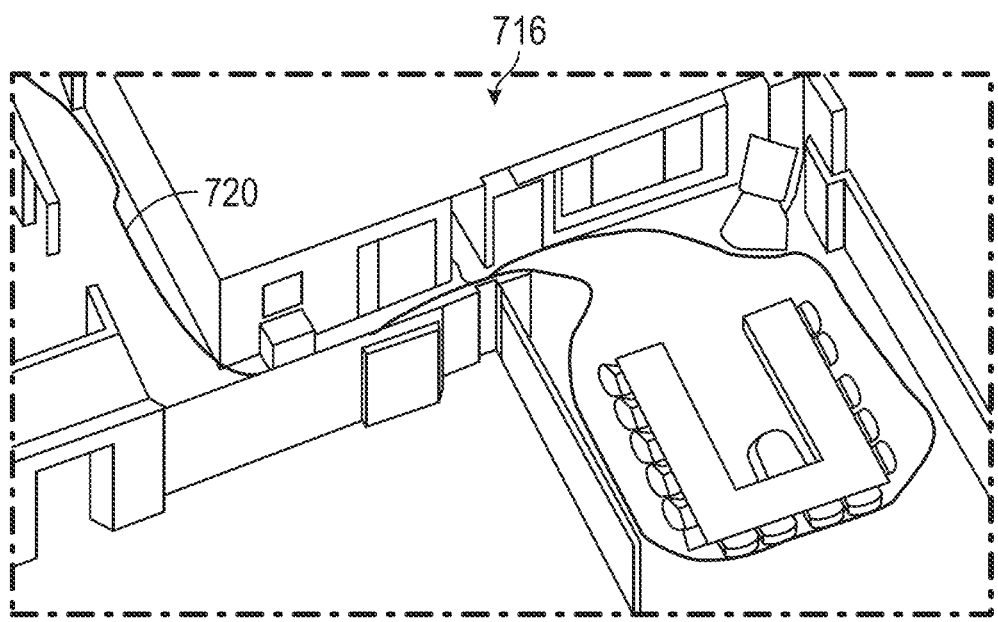
FIG. 32 is a point cloud image of a portion of the environment acquired using the method of FIG. 30.

Referring now to FIGS. 30-32, an embodiment is shown of a method 700 for scanning an environment with the mobile scanning platform 100, 200, or 300. The method 700 starts in block 702 where the platform is configured. In the embodiment where the platform is platform 100 or 200, the configuring may include attaching the 2D scanner 108 or 208 to the respective arm or holder, and the 3D measurement device 110 or 210 to the post 109, or 209. In an embodiment where the platform is platform 300, the configuring may include determining a path for the platform 300 to follow and defining stationary scan locations (if desired). In an embodiment, the path may be determined using the system and method described in commonly owned U.S. patent application Ser. No. 16/154,240, the contents of which are incorporated by reference herein. Once the path is defined, the 2D scanner 308 and 3D scanner 310 may be coupled to the platform 300. It should be appreciated that in some embodiments, the platform 300 may be remotely controlled by an operator and the step of defining a path may not be performed.

Once the platform 100, 200, or 300 is configured, the method 700 proceeds to block 704 where the 2D scanner 108, 208, 308, or 408 is initiated and the 3D measurement device 110, 210, 310, or 610 is initiated in block 706. It should be appreciated that when operation of the 2D scanner 108, 208, 308, or 408 is initiated, the 2D scanner starts to generate a 2D map of the environment as described herein. Similarly, when operation of the 3D measurement device 110, 210, 310, or 610 is initiated, the coordinates of 3D points in the environment are acquired in a volume about the 3D scanner.

The method 700 then proceeds to block 708 where the platform 100, 200, or 300 is moved through the environment. As the platform 100, 200, or 300 is moved, both the 2D scanner 108, 208, 308, or 408 and the 3D measurement device 110, 210, 310, or 610 continue to operate. This results in the generation of both a 2D map 710 (FIG. 31) and the acquisition of 3D points 711. In an embodiment, as the 2D map is generated, the location or path 712 of the platform 100, 200, 300 is indicated on the 2D map. In an embodiment, the platform 100 may include a user interface that provides feedback to the operator during the performing of the scan. In an embodiment, a quality attribute (e.g. scan density) of the scanning process may be determined during the scan. When the quality attribute crosses a threshold (e.g. scan density too low), the user interface may provide feedback to the operator. In an embodiment, the feedback is for the operator to perform a stationary scan with the 3D scanner.

The method 700 then proceeds to block 714 where the acquired 3D coordinate points are registered into a common frame of reference. It should be appreciated that since the platform 100, 200, or 300 is moving while the 3D measurement device 110, 210, 310, or 610 is acquiring data, the local frame of reference of the 3D scanner is also changing. Using the position and pose data from the 2D scanner 108, 208, 308, or 408, the frame of reference of the acquired 3D coordinate points may be registered into a global frame of reference. In an embodiment, the registration is performed as the platform 100, 200, or 300 is moved through the environment. In another embodiment, the registration is done when the scanning of the environment is completed.

The registration of the 3D coordinate points allows the generation of a point cloud 716 (FIG. 32) in block 718. In an embodiment, a representation of the path 720 of the platform 100, 200, or 300 is shown in the point cloud 716. In some embodiments, the point cloud 716 is generated and displayed to the user as the platform 100, 200, 300 moves through the environment being scanned. In these embodiments, blocks 708, 714, 718 may loop continuously until the scanning is completed. With the scan complete, the method 700 ends in block 722 where the point cloud 716 and 2D map 710 are stored in memory of a controller or processor system.

As described previously, mobile 2D and 3D capturing devices can become inaccurate over distance due to the accumulation or error or drift. For example, contemporary approaches that utilize simultaneous localization and mapping (SLAM) techniques can drift over distance (e.g., long hallways) and their accuracy depends on surrounding conditions. When they are available, local reference systems such as spheres or points or checkers can be used as reference points by contemporary systems to reduce or minimize the drift. In addition, natural features, or landmarks, such as walls or windows can be used as reference points. When reference systems are not available and natural features are relied on for mapping, it can be difficult to map areas such as, but not limited to: large areas; large surfaces (planar or curved); glass; irregular features; and long distances.

Figure 33A:
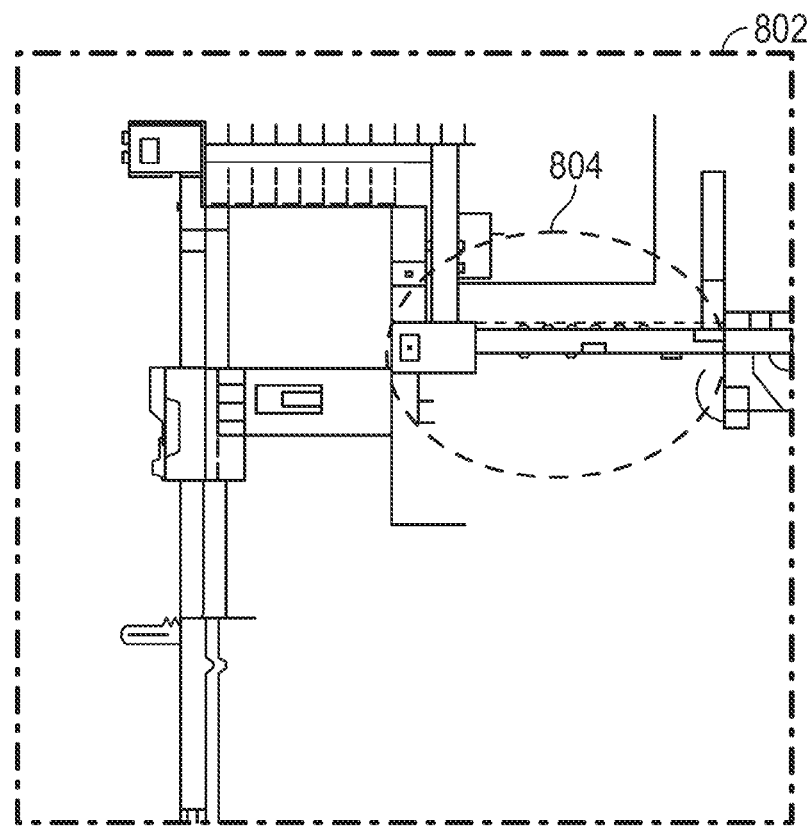
FIGS. 33A and 33B depict a schematic illustration of an image of a portion of a structure as generated by a mobile scanning platform that utilizes simultaneous localization and mapping (SLAM) techniques.
Figure 33B:
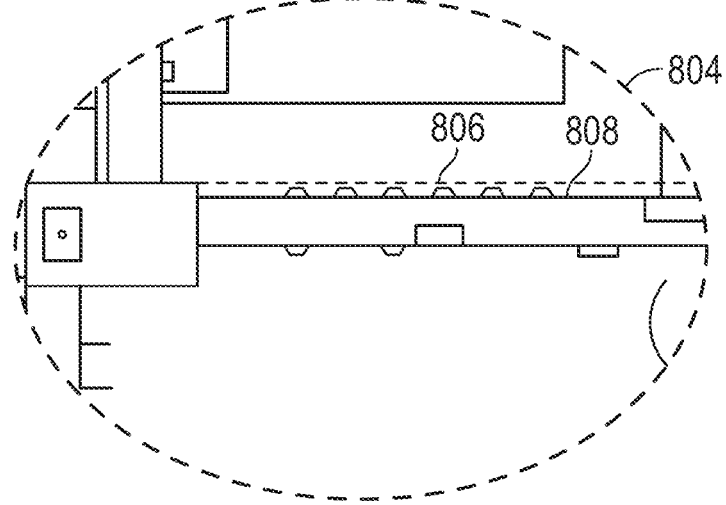

Turning now to FIGS. 33A and 33B, a schematic illustration of an image 802 of a portion of a structure as generated by a mobile mapping system that utilizes the techniques described herein is generally shown. The image shown in FIG. 33A illustrates a map generated using a contemporary algorithm that results in a portion 804 experiencing drift. FIG. 33B shows portion 804 magnified to illustrate how the map 806 generated by the contemporary mobile system deviates from the true structure 808.

Figure 34A:
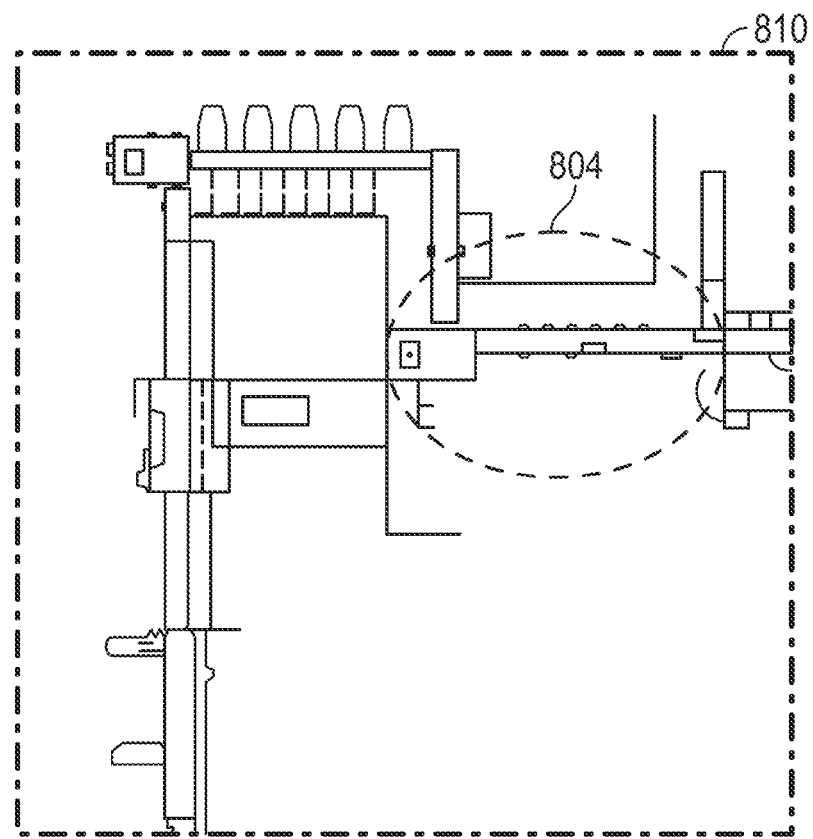
FIGS. 34A and 34B depict a schematic illustration of an image of the portion of the structure shown in FIGS. 33A and 33B as generated by a mobile scanning platform that utilizes pre-existing data to correct current scan data in accordance with an embodiment.
Figure 34B:
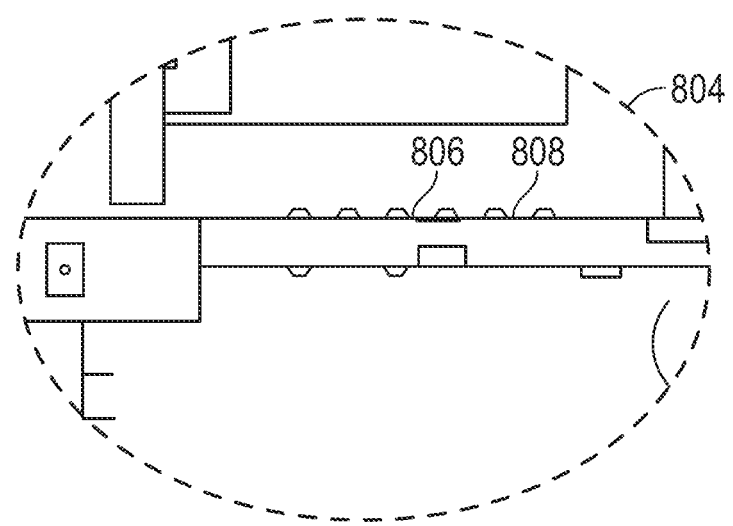

Turning now to FIGS. 34A and 34B, a schematic illustration of an image 810 of the portion of the structure shown in FIGS. 33A and 33B as generated by a mobile scanning platform that utilizes pre-existing data to correct current scan data is generally shown in accordance with an embodiment. In accordance with an embodiment the current scan data is registered with a previously generated map and detected differences between the current scan data and the previously generated map are overlaid onto the existing map. The image shown in FIG. 34A illustrates a map generated by overlaying pre-existing data (e.g., a previously generated map) such as a CAD model or a golden point cloud with the scanned data. FIG. 34B shows portion 804 magnified to illustrate how the map 806 generated by the mobile scanning platform closely approximates (or is the same as) the true structure 808.

Figure 35:
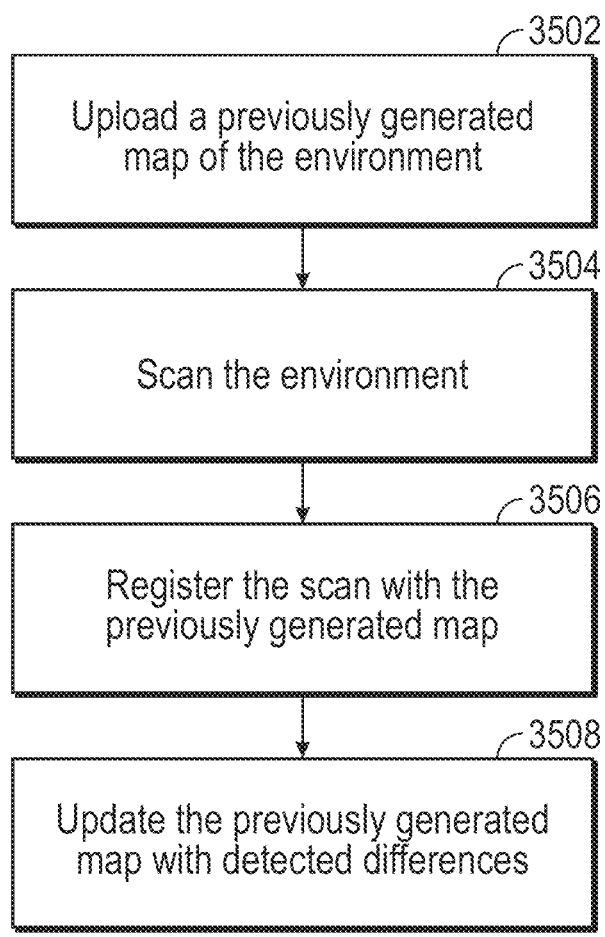
FIG. 35 is flow diagram of a method of using pre-existing data to correct current scan data generated by a mobile scanning platform in accordance with an embodiment.
Figure 36:
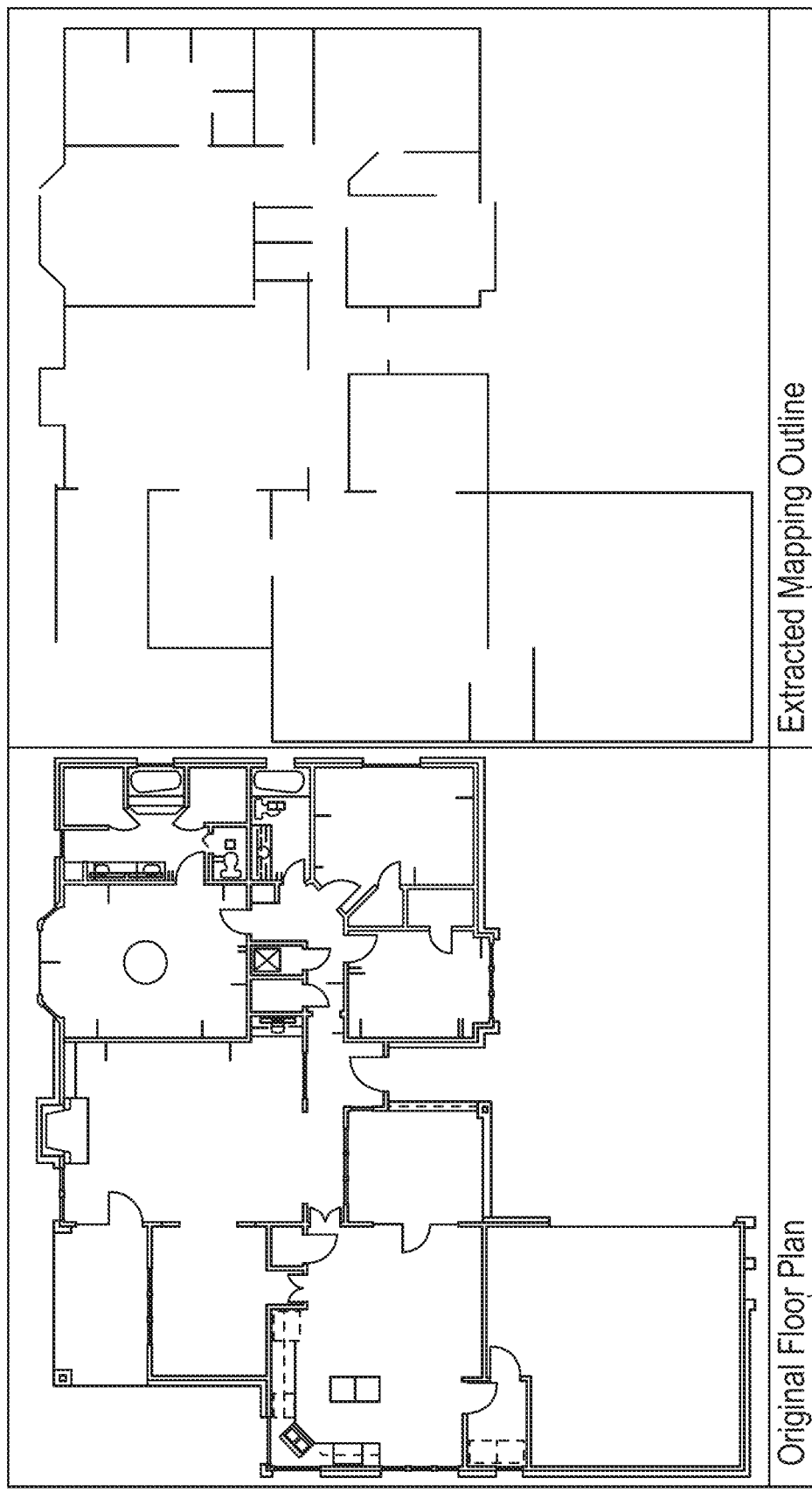
FIG. 36 is a schematic illustration of a floor plan in accordance with an embodiment.

Turning now to FIG. 35, a flow diagram of a method for using pre-existing data to correct current scan data generated by a mobile scanner is generally shown in accordance with an embodiment. The processing shown in FIG. 35 can be performed, for example, by software executed on a scanning system such as FARO® ScanPlan™ for example or executing on a scanning system such as mobile scanning platform 100, 200, and/or 300. At block 3502, a previously generated map of the environment is uploaded to the scanning system. The previously generated map can be used in place of, or as a supplement to, generating the map at block 710 of FIG. 30. In accordance with one or more embodiments, the previously generated map is an existing CAD floor plan such as the original floor plan 820 shown in FIG. 36. FIG. 36 depicts a schematic illustration of a drawing (DWG) formatted original floor plan 820 in accordance with an embodiment of the present invention. The DWG format includes lines and vectors, and one or more embodiments of the present invention converts the original floor plan 820 from DWG format into an extracted mapping outline 822 that is compatible with the scanning software executing on the scanning system. In accordance with an embodiment, the extracted mapping outline 822 includes extracted landmarks and/or wall lines that can be used for improved tracking. Formats of the extracted mapping outline 822 can include, but are not limited to "WRL", "COR", "CSV", and "OBJ." WRL and OBJ are CAD data formats that represent the layout as objects. COR and CSV are data files including coordinates that can deliver, for example, the edges of the walls and therefore represent the layout as lines. In accordance with one or more embodiments, the scanning software creates a new project and imports the converted mapping outline 822.

At block 3504, the scanning system scans the environment by moving through the environment and measuring a plurality of coordinate values that form a point cloud. The scanning system starts mapping within the now known environment of the extracted mapping outline 822. At block 3506, the scan is registered with the previously generated map. In accordance with one or more embodiments, the registration can be performed by the user tapping on a location on the uploaded map where the scanning will start. This location can correspond to a marker such as, but not limited to: an optional room quick response (QR) code; and a radio frequency identifier (RFID) tag with room information.

In accordance with one or more embodiments, coordinate values measured by the scanner as it moves through the environment are registered to features (e.g., landmarks such as walls and windows) in the previously generated map using landmarks such as walls and windows. Feature registration can be used to support the use of a SLAM algorithm by providing constraints such as ninety-degree corners and/or straight walls for use in tracking. As described above, the start location of the mobile mapping system is known and marked on the map. Therefore, a rough registration is already done by the user, and the 3D point cloud acquired by the mobile system can be projected in one plane using a top-view algorithm for registration. The top-view algorithm projects the 3D points into one layer or plane and compares these planes (e.g., walls) of different scan positions with each other. In accordance with an embodiment, the top-view algorithm is used to register a point cloud by the mobile system and the map instead of two point clouds. In this manner, the 3D point cloud can be transformed into a 2D layout in data formats such as, but not limited to WRL, COR, CSV, and OBJ.

Figure 37:
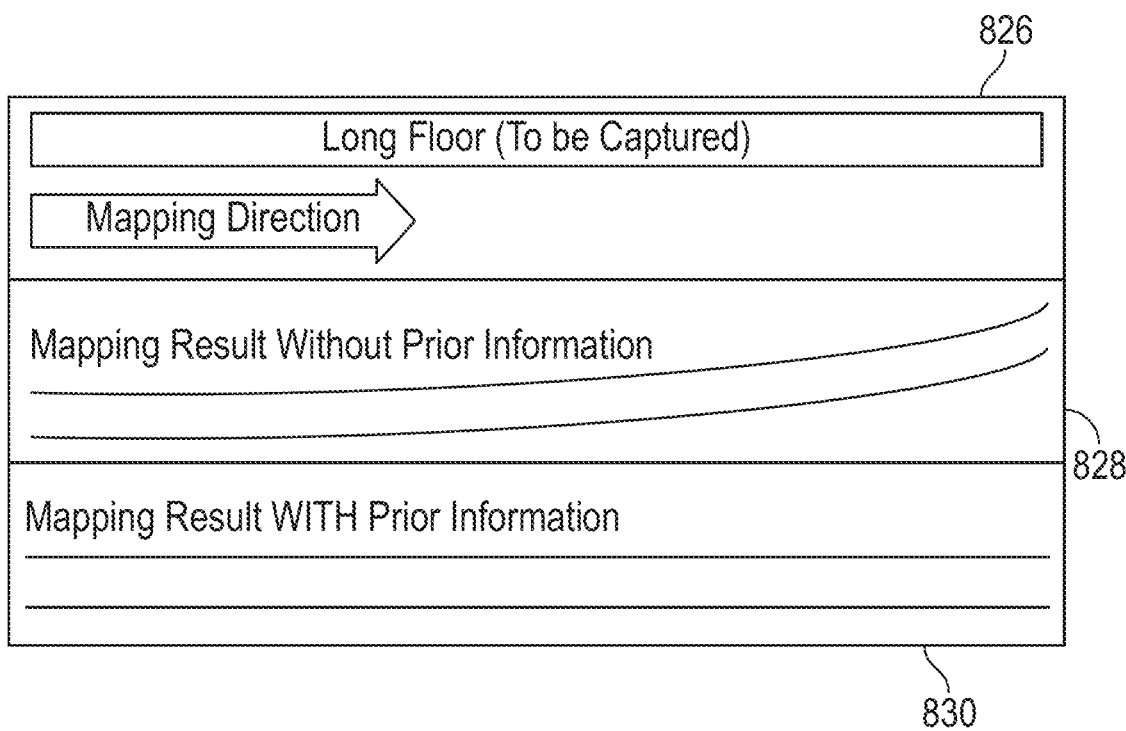
FIG. 37 is a schematic illustration of using pre-existing data to correct current scan data generated by a mobile scanning platform in accordance with an embodiment.

Processing continues at block 3508 where the previously generated map is updated with detected differences between the data generated by the scanner and the data in the previously generated map. Static deviations from the uploaded map to the mapping algorithm used by the scanning system can be adapted according to existing algorithms After registration, it is assumed that the point cloud and the map are correctly positioned. In an embodiment, the map is used as a reference, so that an iterative closest point (ICP) algorithm can detect and correct the drifting parts of the point cloud. An ICP algorithm that is used for cloud-to-cloud registration can be adapted and used by one or more embodiments. As shown in FIG. 37, a rectangular floor having a long length (e.g., 15 feet, 25 feet, 40 feet) is scanned. The mapping result without using prior information 828 is compared to the mapping result where prior information 830 such as a previously generated map is utilized.

At block 3508, new 360-degree images of the environment (e.g., a building) are created as the scanning software collects scan data (e.g., a plurality of coordinate values making up a point cloud) and updates the previously generated map if required. The updating can be performed, for example, by overlaying portions of the previously generated map with corresponding portions of the point cloud. In accordance with one or more embodiments, when the scanning is completed, the updated extracted mapping outline 822 is converted back into a DWG format with the updated information from the scanning.

In accordance with one or more other embodiments, the current scan data, or point cloud, is updated based on information in the previously generated map and the previously generated map is not modified. The updating can be performed, for example, by overlaying portions of the point cloud with corresponding portions of the previously generated map. In accordance with one or more embodiments, when the scanning is completed, the updated point cloud is converted into a DWG format with the updated information from the previously generated map.

In one or embodiments of the present invention, the mobile mapping system includes a 2D scanner and/or a 3D scanner.

In one or more embodiments of the present invention, the previously generated map is a 2D or 3D point cloud, a CAD model, and/or a floor plan.

In an embodiment, a 2D point cloud may be used as the previously generated map. In an embodiment, the 2D point cloud may be generated from a 3D point cloud generated by a scanner such as scanner 610 for example. The 2D point cloud may be extracted by extracting points from a plane that is parallel to (or substantially parallel to) the floor of the structure for example.

In one or more embodiments of the present invention, the mobile mapping system is configured to be carried by an operator without stopping the measurement of the plurality of 2D coordinates.

One or more embodiments include facilitating scanning of an environment using a mobile platform while simultaneously generating a 2D map of the environment and a point cloud. The base unit is moved (e.g., continuously) through the environment and includes a 2D scanner for measuring an angle and a distance value, and a 3D scanner having a color camera and operating in a compound mode. As the base unit is moving, the 2D scanner generates a 2D map of the environment based at least in part on the angle, the distance value, and a previously generated map of the environment. As the base unit is moving through the environment, the 3D scanner is operating in a compound mode to measure a plurality of 3D coordinate values. The 3D coordinate values are registered into a single frame of reference based at least in part on the 2D map.

Technical effects and benefits of some embodiments include providing a system and a method that facilitate the rapid scanning of an environment using a movable platform that utilizes previously generated maps of the environment to correct drifting errors.

It should be appreciated that while embodiments herein describe a coordinate measurement device in reference to laser scanner this is for exemplary purposes and the claims should not be so limited. In other embodiments, the scan processing software may be executed on, or receive data from, any coordinate measurement device capable of measuring and determining either 2D or 3D coordinates of an object or the environment while moving. The coordinate measurement device may be but is not limited to: an articulated arm coordinate measurement machine, a laser tracker, an image scanner, a photogrammetry device, a triangulation scanner, a laser line probe, or a structured light scanner for example.

It is understood in advance that although this disclosure describes using pre-existing data to correct current scan data generated by a mobile scanner in reference to cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. In essence, cloud computing is an infrastructure made up of a network of interconnected nodes.

Figure 38:
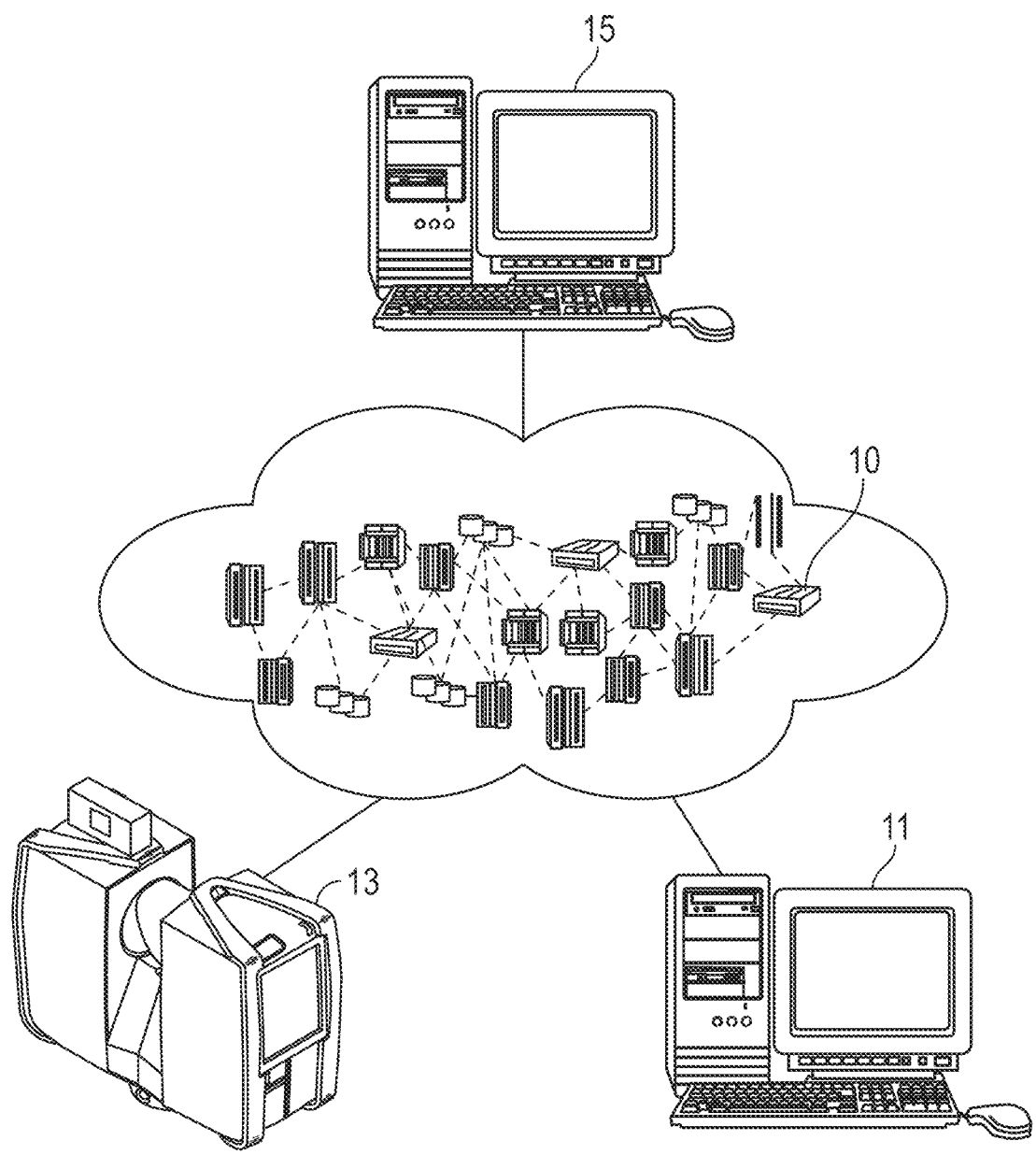
FIG. 38 is a schematic illustration of a cloud computing environment in accordance with an embodiment.

Referring now to FIG. 38, an illustrative cloud computing environment is depicted. As shown, cloud computing environment comprises one or more cloud computing nodes 10 with which local computing devices used by cloud consumers, such as, for example, coordinate measurement device 13 and computers 11 15 may communicate. In an embodiment, the correction of current scan data using pre-existing data is performed through the cooperation of computer 15 or 11, and the coordinate measurement device 13. For example, the previously generated map may be accessed from computers 11 15 and/or one or more of nodes 10. Nodes 10 may communicate with one another. They may be grouped (not shown) physically or virtually, in one or more networks, such as Private, Community, Public, or Hybrid clouds as described hereinabove, or a combination thereof. This allows cloud computing environment to offer infrastructure, platforms and/or software as services for which a cloud consumer does not need to maintain resources on a local computing device. It is understood that the types of computing devices shown in FIG. 38 are intended to be illustrative only and that computing nodes 10 and cloud computing environment can communicate with any type of computerized device over any type of network and/or network addressable connection (e.g., using a web browser).

Figure 39:
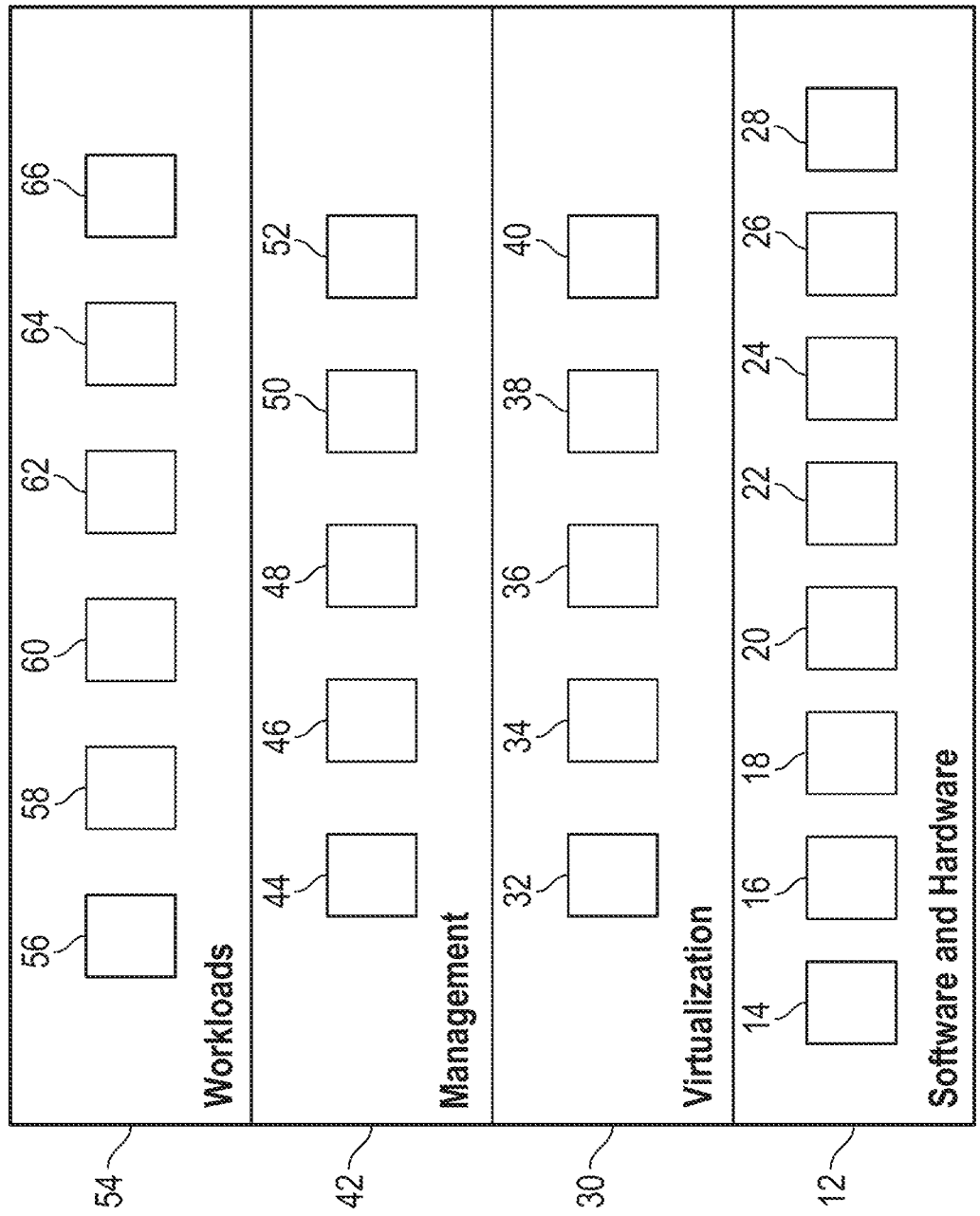
FIG. 39 is a schematic illustration of an abstraction model layers in accordance with an embodiment.

Referring now to FIG. 39, a set of functional abstraction layers provided by cloud computing environment (FIG. 38) is shown. It should be understood in advance that the components, layers, and functions shown in FIG. 39 are intended to be illustrative only and embodiments of the invention are not limited thereto. As depicted, the following layers and corresponding functions are provided: hardware and software layer 12 includes hardware and software components. Examples of hardware components include: mainframes 14; RISC (Reduced Instruction Set Computer) architecture based servers 16; servers 18; blade servers 20; storage devices 22; and networks and networking components 24. In some embodiments, software components include network application server software 26, and database software 28; virtualization layer 30 provides an abstraction layer from which the following examples of virtual entities may be provided: virtual servers 32; virtual storage 34; virtual networks 36, including virtual private networks; virtual applications and operating systems 38; and virtual clients 40.

In one example, management layer 42 may provide the functions described below. Resource provisioning 44 provides dynamic procurement of computing resources and other resources that are utilized to perform tasks within the cloud computing environment. Metering and pricing 46 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 48 provides access to the cloud computing environment for consumers and system administrators. Service level management 50 provides cloud computing resource allocation and management such that required service levels are met. Service Level Agreement (SLA) planning and fulfillment 52 provides pre-arrangement for, and procurement of, cloud computing resources for which a future requirement is anticipated in accordance with an SLA.

Workloads layer 54 provides examples of functionality for which the cloud computing environment may be utilized. Examples of workloads and functions which may be provided from this layer include: mapping and navigation 56; software development and lifecycle management 58; transaction processing 60; scan processing software 62; point cloud to virtual reality data processing 64; and user defined content to point cloud processing 66.

Figure 40:
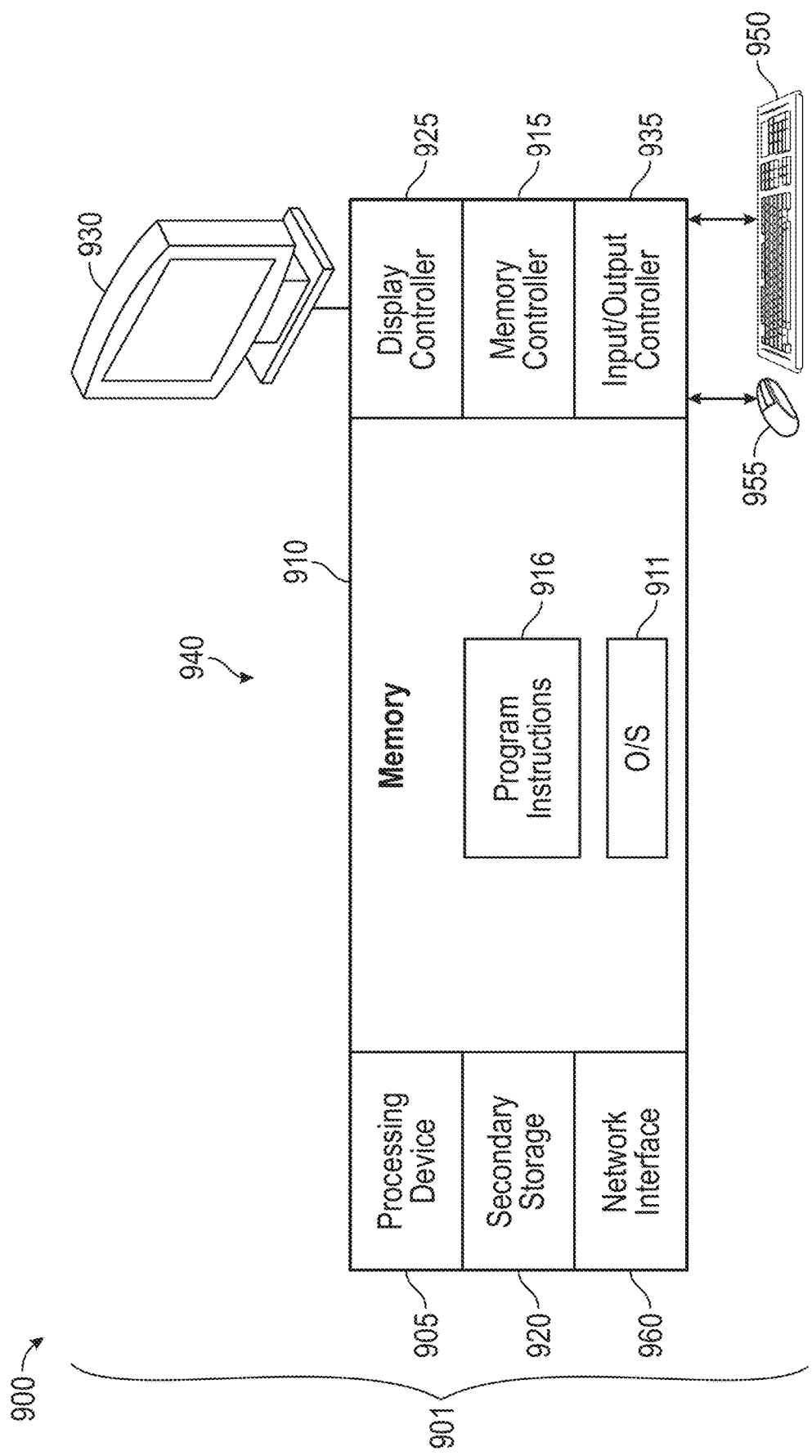
FIG. 40 is a schematic illustration of a computer system in accordance with an embodiment.

Turning now to FIG. 40, a schematic illustration of a system 900 is depicted upon which aspects of one or more embodiments of correcting current scan data using pre-existing data may be implemented. In an embodiment, all or a portion of the system 900 may be incorporated into one or more of the 3D scanner device and processors described herein. In one or more exemplary embodiments, in terms of hardware architecture, as shown in FIG. 40, the computer 901 includes a processing device 905 and a memory 910 coupled to a memory controller 915 and an input/output controller 935. The input/output controller 935 can be, for example, but not limited to, one or more buses or other wired or wireless connections, as is known in the art. The input/output controller 935 may have additional elements, which are omitted for simplicity, such as controllers, buffers (caches), drivers, repeaters, and receivers, to enable communications. Further, the computer 901 may include address, control, and/or data connections to enable appropriate communications among the aforementioned components.

In one or more exemplary embodiments, a keyboard 950 and mouse 955 or similar devices can be coupled to the input/output controller 935. Alternatively, input may be received via a touch-sensitive or motion sensitive interface (not depicted). The computer 901 can further include a display controller 925 coupled to a display 930.

The processing device 905 is a hardware device for executing software, particularly software stored in secondary storage 920 or memory 910. The processing device 905 can be any custom made or commercially available computer processor, a central processing unit (CPU), an auxiliary processor among several processors associated with the computer 901, a semiconductor-based microprocessor (in the form of a microchip or chip set), a macro-processor, or generally any device for executing instructions.

The memory 910 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), flash memory, programmable read only memory (PROM), tape, compact disc read only memory (CD-ROM), flash drive, disk, hard disk drive, diskette, cartridge, cassette or the like, etc.). Moreover, the memory 910 may incorporate electronic, magnetic, optical, and/or other types of storage media. Accordingly, the memory 910 is an example of a tangible computer readable storage medium 940 upon which instructions executable by the processing device 905 may be embodied as a computer program product. The memory 910 can have a distributed architecture, where various components are situated remote from one another, but can be accessed by the processing device 905.

The instructions in memory 910 may include one or more separate programs, each of which comprises an ordered listing of executable instructions for implementing logical functions. In the example of FIG. 40, the instructions in the memory 910 include a suitable operating system (OS) 911 and program instructions 916. The operating system 911 essentially controls the execution of other computer programs and provides scheduling, input-output control, file and data management, memory management, and communication control and related services. When the computer 901 is in operation, the processing device 905 is configured to execute instructions stored within the memory 910, to communicate data to and from the memory 910, and to generally control operations of the computer 901 pursuant to the instructions. Examples of program instructions 916 can include instructions to implement the processing described herein in reference to FIGS. 1-39.

The computer 901 of FIG. 40 also includes a network interface 960 that can establish communication channels with one or more other computer systems via one or more network links. The network interface 960 can support wired and/or wireless communication protocols known in the art.

For example, when embodied in a user system, the network interface 960 can establish communication channels with an application server.

It will be appreciated that aspects of the present invention may be embodied as a system, method, or computer program product and may take the form of a hardware embodiment, a software embodiment (including firmware, resident software, micro-code, etc.), or a combination thereof. Furthermore, aspects of the present invention may take the form of a computer program product embodied in one or more computer readable medium(s) having computer readable program code embodied thereon.

One or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In one aspect, the computer readable storage medium may be a tangible medium containing or storing a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

The computer readable medium may contain program code embodied thereon, which may be transmitted using any appropriate medium, including but not limited to wireless, wireline, optical fiber cable, RF, etc., or any suitable combination of the foregoing. In addition, computer program code for carrying out operations for implementing aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server.

It will be appreciated that aspects of the present invention are described herein with reference to flowchart illustrations and/or block diagrams of methods, apparatus (systems) and computer program products according to embodiments of the invention. It will be understood that each block or step of the flowchart illustrations and/or block diagrams, and combinations of blocks or steps in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In addition, some embodiments described herein are associated with an "indication". As used herein, the term "indication" may be used to refer to any indicia and/or other information indicative of or associated with a subject, item, entity, and/or other object and/or idea. As used herein, the phrases "information indicative of" and "indicia" may be used to refer to any information that represents, describes, and/or is otherwise associated with a related entity, subject, or object. Indicia of information may include, for example, a code, a reference, a link, a signal, an identifier, and/or any combination thereof and/or any other informative representation associated with the information. In some embodiments, indicia of information (or indicative of the information) may be or include the information itself and/or any portion or component of the information. In some embodiments, an indication may include a request, a solicitation, a broadcast, and/or any other form of information gathering and/or dissemination.

Numerous embodiments are described in this patent application and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural, logical, software, and electrical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

Devices that are in communication with each other need not be in continuous communication with each other, unless expressly specified otherwise. On the contrary, such devices need only transmit to each other as necessary or desirable and may actually refrain from exchanging data most of the time. For example, a machine in communication with another machine via the Internet may not transmit data to the other machine for weeks at a time. In addition, devices that are in communication with each other may communicate directly or indirectly through one or more intermediaries.

A description of an embodiment with several components or features does not imply that all or even any of such components and/or features are required. On the contrary, a variety of optional components are described to illustrate the wide variety of possible embodiments of the present invention(s). Unless otherwise specified explicitly, no component and/or feature is essential or required.

Further, although process steps, algorithms or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention and does not imply that the illustrated process is preferred.

"Determining" something can be performed in a variety of manners and therefore the term "determining" (and like terms) includes calculating, computing, deriving, looking up (e.g., in a table, database or data structure), ascertaining and the like.

It will be readily apparent that the various methods and algorithms described herein may be implemented by, e.g., appropriately and/or specially-programmed general purpose computers and/or computing devices. Typically, a processor (e.g., one or more microprocessors) will receive instructions from a memory or like device, and execute those instructions, thereby performing one or more processes defined by those instructions. Further, programs that implement such methods and algorithms may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software.

A "processor" generally means any one or more microprocessors, CPU devices, GPU devices, computing devices, microcontrollers, digital signal processors, or like devices, as further described herein. A CPU typically performs a variety of tasks while a GPU is optimized to display images.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) could be used to store and manipulate the data types described herein. Likewise, object methods or behaviors of a database can be used to implement various processes, such as the described herein. In addition, the databases may, in a known manner, be stored locally or remotely from a device that accesses data in such a database.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

Terms such as processor, controller, computer, DSP, FPGA are understood in this document to mean a computing device that may be located within an instrument, distributed in multiple elements throughout an instrument, or placed external to an instrument.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description but is only limited by the scope of the appended claims.

The term "about" is intended to include the degree of error associated with measurement of the particular quantity based upon the equipment available at the time of filing the application. For example, "about" can include a range of ±8% or 5%, or 2% of a given value.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description but is only limited by the scope of the appended claims.

What is claimed is:

1. A system for measuring coordinate values of an environment, the system comprising:
    a coordinate measurement scanner comprising a light source, an image sensor, and a controller, the light source steering a beam of light to illuminate object points in the environment, the image sensor is arranged to receive light reflected from the object points to determine coordinates of the object points in the environment; and
    one or more processors operably coupled to the scanner, the one or more processors being responsive to executable instructions for performing a method comprising:
        receiving a previously generated map of the environment, the previously generated map comprising a plurality of features;
        causing the scanner to measure a plurality of coordinate values as the scanner is moved through the environment, the coordinate values forming a point cloud;
        registering the plurality of coordinate values and at least a subset of the features of the previously generated map into a single frame of reference; and
        generating a current map of the environment based at least in part on the previously generated map and the point cloud.

2. The system of claim 1, wherein the generating comprises:
    updating the previously generated map based on detecting differences between the previously generated map and the point cloud; and
    outputting the updated previously generated map as the current map.

3. The system of claim 2, wherein the updating comprises overlaying portions of the previously generated map with corresponding portions of the point cloud.

4. The system of claim 1, wherein the scanner is a two-dimensional (2D) scanner.

5. The system of claim 1, wherein the scanner is a three-dimensional (3D) scanner.

6. The system of claim 1, wherein the previously generated map comprises an existing point cloud.

7. The system of claim 1, wherein the previously generated map comprises a computer aided design (CAD) model.

8. The system of claim 1, wherein the previously generated map comprises a floor plan.

9. The system of claim 1, wherein the system is configured to be carried by an operator without stopping the measurement of the plurality of coordinates.

10. A method for measuring coordinate values of an environment, the method comprising:
    moving a scanner through an environment, the scanner having a light source, an image sensor, and a controller, the light source steering a beam of light to illuminate object points in the environment, the image sensor is arranged to receive light reflected from the object points, the controller being operable to determine coordinates of the object points in the environment;
    receiving, at the scanner, a previously generated map of the environment, the previously generated map comprising a plurality of features;
    causing the scanner to measure a plurality of coordinate values as it moves through the environment, the coordinate values forming a point cloud;
    registering the point cloud with at least a subset of the features of the previously generated map into a single frame of reference; and
    generating a current map of the environment based at least in part on the previously generated map and the point cloud.

11. The method of claim 10, wherein the generating comprises:
   updating the previously generated map based on detecting differences between the previously generated map and the point cloud; and
   outputting the updated previously generated map as the current map.

12. The method of claim 11, wherein the updating comprises overlaying the previously generated map with the point cloud.

13. The method of claim 11 wherein the scanner is a two-dimensional (2D) scanner.

14. The method of claim 10, wherein the scanner is a three-dimensional (3D) scanner.

15. The method of claim 10, wherein the previously generated map comprises an existing point cloud.

16. The method of claim 10, wherein the previously generated map comprises a computer aided design (CAD) model.

17. The method of claim 10, wherein the previously generated map comprises a floor plan.

18. The method of claim 10, further comprising moving the scanner continuously through the environment.

19. A method for measuring coordinate values of an environment, the method comprising:
   moving a base unit through an environment, the base unit including a two-dimensional (2D) scanner and a three-dimensional (3D) scanner, the 2D scanner having a light source, an image sensor, and a controller, the light source steering a beam of light within a first plane to illuminate object points in the environment, the image sensor is arranged to receive light reflected from the object points, the controller being operable to determine a distance value to at least one of the object points, the 2D scanner measuring an angle and the distance value, the 3D scanner being configured to operate in a compound mode, the 3D scanner having a color camera;
   as the base unit is moving, causing the 2D scanner to generate a 2D map of the environment, the 2D map being based at least in part on the angle, the distance value, and a previously generated map of the environment;
   as the base unit is moving, causing the 3D scanner to operate in compound mode to measure a plurality of 3D coordinate values; and
   registering the plurality of 3D coordinate values into a single frame of reference based at least in part on the 2D map.

20. The method of claim 19, further comprising moving the base unit continuously through the environment.

21. A system for measuring coordinate values of an environment, the system comprising:
   a movable base unit;
   a two-dimensional (2D) scanner coupled to the base unit, the 2D scanner comprising:
      a light source, an image sensor, and a controller, the light source steering a beam of light within the first plane to illuminate object points in the environment, the image sensor is arranged to receive light reflected from the object points, the controller being operable to determine a distance value to at least one of the object points, the 2D scanner measuring an angle and the distance value;
   a three-dimensional (3D) scanner coupled to the base unit, the 3D scanner operable to selectively measure 3D coordinates and grey values of surfaces in the environment, the 3D scanner configured to operate in one of a compound mode or a helical mode, the 3D scanner having a color camera; and
   one or more processors operably coupled to the base unit, the 2D scanner and the 3D scanner, the one or more processors being responsive to executable instructions for performing a method comprising:
      causing the 3D scanner to measure a first plurality of 3D coordinate values while operating in one of the compound mode or the helical mode as the base unit is moved from a first position to a second position;
      causing the 3D scanner to measure a second plurality of 3D coordinate values while operating in compound mode when the base unit is stationary between the first position and the second position;
      registering the first plurality of 3D coordinate values and the second plurality of 3D coordinate values into a single frame of reference; and
      generating a 2D map of the environment using the 2D scanner as the base unit is moved from the first position to the second position, the 2D map being based at least in part on the angle, the distance value, and a previously generated map of the environment.

22. The system of claim 21, wherein the registering is based at least in part on the 2D scanner data.

23. The system of claim 21, wherein the registering is based at least in part on the previously generated map of the environment.

24. The system of claim 21, wherein the 3D scanner is a time-of-flight (TOF) coordinate measurement device configured to measure the 3D coordinate values in a volume about the 3D scanner.

25. The system of claim 21, wherein the 3D scanner is a structured light area scanner.

26. The system of claim 21, wherein the 2D scanner and the 3D scanner are removably coupled to the base unit, and the 2D scanner and 3D scanner may be operated as an independent device separate from the base unit or each other.

27. The system of claim 21, wherein the system is configured to be carried by an operator without stopping the measurement of the first plurality of 3D coordinates.

28. The system of claim 21, wherein the method further comprises performing a compound compensation and optimizing by automatically fusing sensor data acquired while operating the system, wherein the compound compensation includes positions and orientations of the sensors.

29. The system of claim 21, wherein the method further comprises causing the color camera to acquire color data and colorizing the 3D scan data.

30. The system of claim 21, wherein the method further comprises analyzing a tracking quality attribute of the first plurality of 3D coordinates and providing feedback to the operator.

31. The system of claim 30, wherein the feedback includes instructing the operator to perform a stationary scan.

32. The system of claim 21, further comprising a display operably coupled to the 2D scanner and 3D scanner, the display being configured to display the registered plurality of 3D coordinates or the 2D map in the single frame of reference.

* * * * *